(12) United States Patent
Choi et al.

(10) Patent No.: US 12,538,473 B2
(45) Date of Patent: Jan. 27, 2026

(54) SEMICONDUCTOR DEVICE INCLUDING PAD PATTERN

(71) Applicant: SAMSUNG ELECTRONICS CO., LTD., Suwon-si (KR)

(72) Inventors: Minsu Choi, Suwon-si (KR); Soyeong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 320 days.

(21) Appl. No.: 18/328,663

(22) Filed: Jun. 2, 2023

(65) Prior Publication Data

US 2023/0397405 A1 Dec. 7, 2023

(30) Foreign Application Priority Data

Jun. 3, 2022 (KR) .................. 10-2022-0068374

(51) Int. Cl.
*H10B 12/00* (2023.01)
(52) U.S. Cl.
CPC ......... *H10B 12/315* (2023.02); *H10B 12/053* (2023.02); *H10B 12/34* (2023.02); *H10B 12/482* (2023.02); *H10B 12/50* (2023.02)
(58) Field of Classification Search
CPC .... H10B 12/315; H10B 12/482; H10B 12/50; H10B 12/34
See application file for complete search history.

(56) References Cited

U.S. PATENT DOCUMENTS

| | | |
|---|---|---|
| 9,786,598 B2 | 10/2017 | Kim et al. |
| 10,644,003 B2 * | 5/2020 | Cho ................... H10B 12/30 |
| 2016/0276349 A1 * | 9/2016 | Kwon ................. H10B 12/053 |
| 2021/0398569 A1 | 12/2021 | Hong et al. |
| 2022/0052055 A1 | 2/2022 | Chun |
| 2022/0059543 A1 | 2/2022 | Mun et al. |
| 2022/0077002 A1 | 3/2022 | Yoon et al. |

FOREIGN PATENT DOCUMENTS

| | | |
|---|---|---|
| KR | 10-2009-0010486 A | 1/2009 |
| KR | 10-2015-0027363 A | 3/2015 |
| KR | 10-2017-0052752 A | 5/2017 |

OTHER PUBLICATIONS

Office Action dated Nov. 12, 2025 issued in corresponding to Korean Patent Application No. 10-2022-0068374.

* cited by examiner

*Primary Examiner* — Steven M Page
(74) *Attorney, Agent, or Firm* — Morgan, Lewis & Bockius LLP

(57) ABSTRACT

A semiconductor device includes a substrate; an active region including a first impurity region and a second impurity region spaced apart from the first impurity region; an isolation region defining the active region; a gate structure intersecting the active region and extending in a first direction parallel to the substrate; a first pad pattern disposed on the first impurity region; a second pad pattern disposed on the second impurity region; a bit line disposed on the first pad pattern and extending in a second direction, wherein the second direction is perpendicular to the first direction and parallel to the substrate; and a contact structure on the second pad pattern, wherein the second pad pattern has a first side surface and a second side surface opposing each other in the first direction that are both curved along a plane parallel to the substrate.

20 Claims, 49 Drawing Sheets

SEMICONDUCTOR DEVICE INCLUDING PAD PATTERN

CROSS-REFERENCE TO RELATED APPLICATION(S)

This application claims the benefit of and priority under 37 C.F.R. § 119 to Korean Patent Application No. 10-2022-0068374 filed on Jun. 3, 2022 in the Korean Intellectual Property Office, the disclosure of which is herein incorporated by reference in its entirety.

TECHNICAL FIELD

The present disclosure relates to a semiconductor device and, more specifically, to a semiconductor device including a pad pattern and a method of manufacturing the same.

DISCUSSION OF THE RELATED ART

Modern computing devices use integrated circuits to implement many of their components, such as general processors, application specific integrated circuits (ASICs), and memory. Memory and memory systems are core components of these devices, and allow state information of the device to persist over time for later use or processing. Random access memory, such as DRAM, allows data items to be read or written in almost the same amount of time regardless of the physical location of data inside the memory. These memory systems allow for the fast access of information by the other components.

Newer devices are utilizing larger amounts of memory. Research has been conducted to reduce sizes of elements of semiconductor circuits such as DRAM to provide greater memory size in a smaller physical form factor. Research includes developing new manufacturing processes for the circuits, as well as developing new arrangements and shapes of constituent components.

SUMMARY

A semiconductor device includes a substrate; an active region including a first impurity region and a second impurity region spaced apart from the first impurity region; an isolation region defining the active region; a gate structure intersecting the active region and extending in a first direction parallel to the substrate; a first pad pattern disposed on the first impurity region; a second pad pattern disposed on the second impurity region; a bit line disposed on the first pad pattern and extending in a second direction, wherein the second direction is perpendicular to the first direction and parallel to the substrate; and a contact structure on the second pad pattern, wherein the second pad pattern has a first side surface and a second side surface opposing each other in the first direction, and a third side surface and a fourth side surface opposing each other in the second direction, and wherein each of the first and second side surfaces is curved in a horizontal plane formed by the first and second directions, and each of the third and fourth side surfaces has a substantially linear shape in the horizontal plane. A semiconductor device includes an active region including a first impurity region and a second impurity region spaced apart from the first impurity region; an isolation region defining the active region; a gate structure disposed in a gate trench, extending in a first direction, intersecting the active region, and extending into the isolation region; a first pad pattern contacting the first impurity region and disposed on the first impurity; a second pad pattern contacting the second impurity region, spaced apart from the first pad pattern, and disposed on the second impurity region; a bit line contacting the first pad pattern, extending in a second direction perpendicular to the first direction, and wherein the bit line is disposed on the first pad pattern; a contact structure contacting the second pad pattern and disposed on the second pad pattern; and a spacer structure contacting a side surface of the bit line, wherein an upper surface of the first pad pattern contacts a lower surface of the bit line, and wherein a width of the upper surface of the first pad pattern in the first direction is different from a width of the lower surface of the bit line in the first direction.

A semiconductor device includes an isolation region defining a cell active region in a memory cell region and a peripheral active region in a peripheral region; a cell gate structure disposed in a gate trench, wherein the cell gate structure extends in a first direction, intersects the cell active region, and extends into the isolation region, in the memory cell region; a first pad pattern contacting a first impurity region in the cell active region and disposed on the cell active region; a second pad pattern contacting a second impurity region in the cell active region and disposed on the cell active region; a bit line contacting the first pad pattern and extending in a second direction perpendicular to the first direction, wherein the bit line is disposed on the first pad pattern; a cell contact structure contacting the second pad pattern and on the second pad pattern; and a barrier spacer, including a portion which is interposed between the first pad pattern and the second pad pattern, wherein a level difference between a level of an upper surface of the first pad pattern and a level of an upper surface of the second pad pattern is greater than a level difference between a level of a lower surface of the first pad pattern and a level of a lower surface of the second pad pattern.

A method for manufacturing a semiconductor device includes forming an isolation region defining an active region; forming a gate trench intersecting the active region and extending into the isolation region; forming a gate structure in the gate trench; forming a first pad pattern to contact a first region of the active region; forming a second pad pattern having an upper surface disposed on a level lower than a level of an upper surface of the first pad pattern, wherein the upper surface contacts a second region of the active region, after the forming the first pad pattern; forming a lower conductive line to contact the upper surface of the first pad pattern and extending in a direction intersecting the gate structure; forming an upper conductive line and a bit line capping pattern stacked vertically on the upper conductive line, after forming the lower conductive line; forming a bit line spacer covering side surfaces of the lower conductive line, side surfaces of the upper conductive line, and side surfaces of the bit line capping pattern; forming insulating fences on at least one side of a structure including the lower conductive line, the upper conductive line, and the bit line capping pattern; and forming a contact structure to contact the second pad pattern between the insulating fences.

BRIEF DESCRIPTION OF DRAWINGS

The above and other aspects and features of the present disclosure will be more clearly understood from the following detailed description, taken in combination with the accompanying drawings, in which.

DETAILED DESCRIPTION

Hereinafter, embodiments of the present disclosure will be described with reference to the accompanying drawings.

Figure 1:
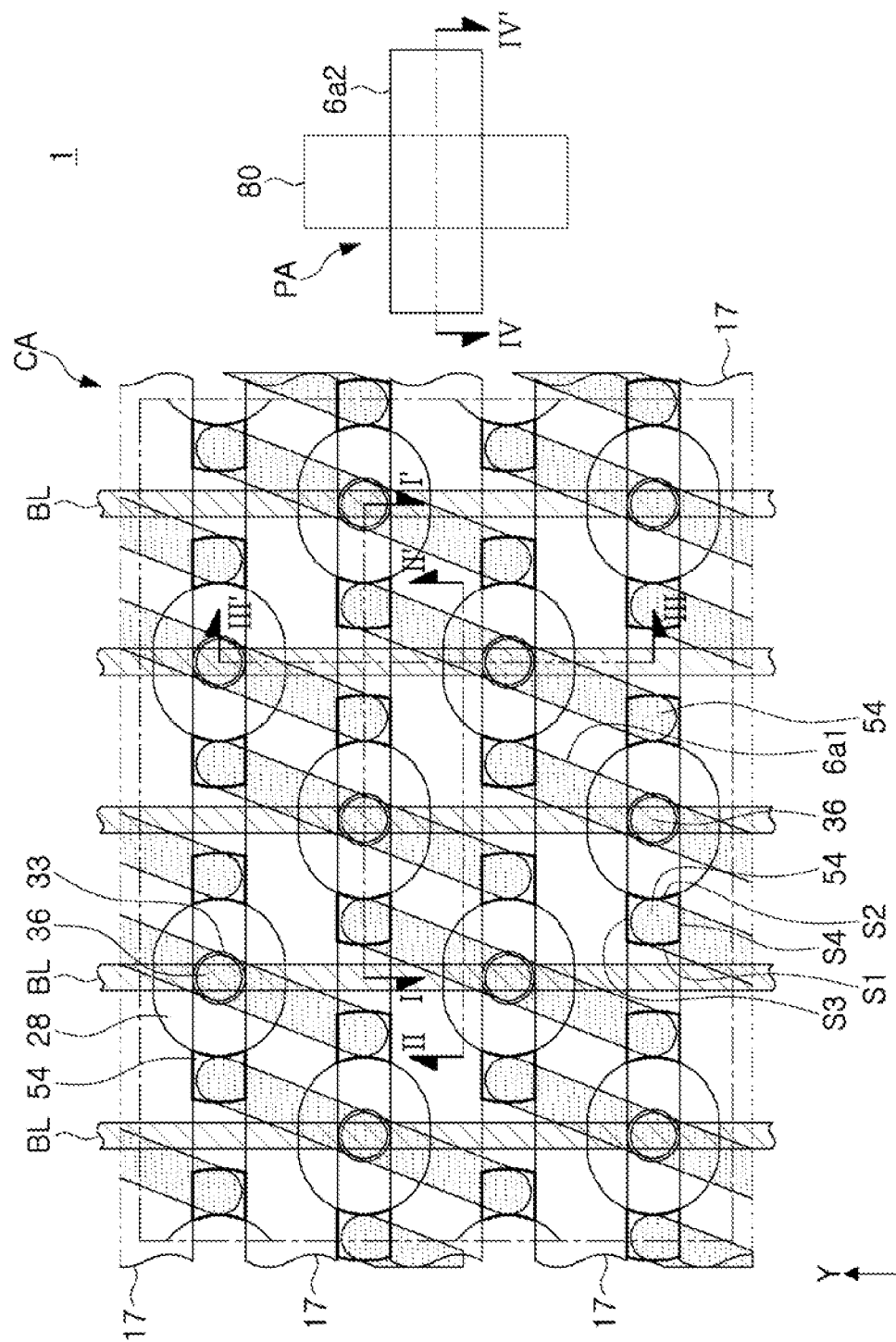
FIGS. 1, 2A, 2B and 2C are diagrams that illustrate a semiconductor device according to an example embodiment of the present disclosure.
Figure 2A:
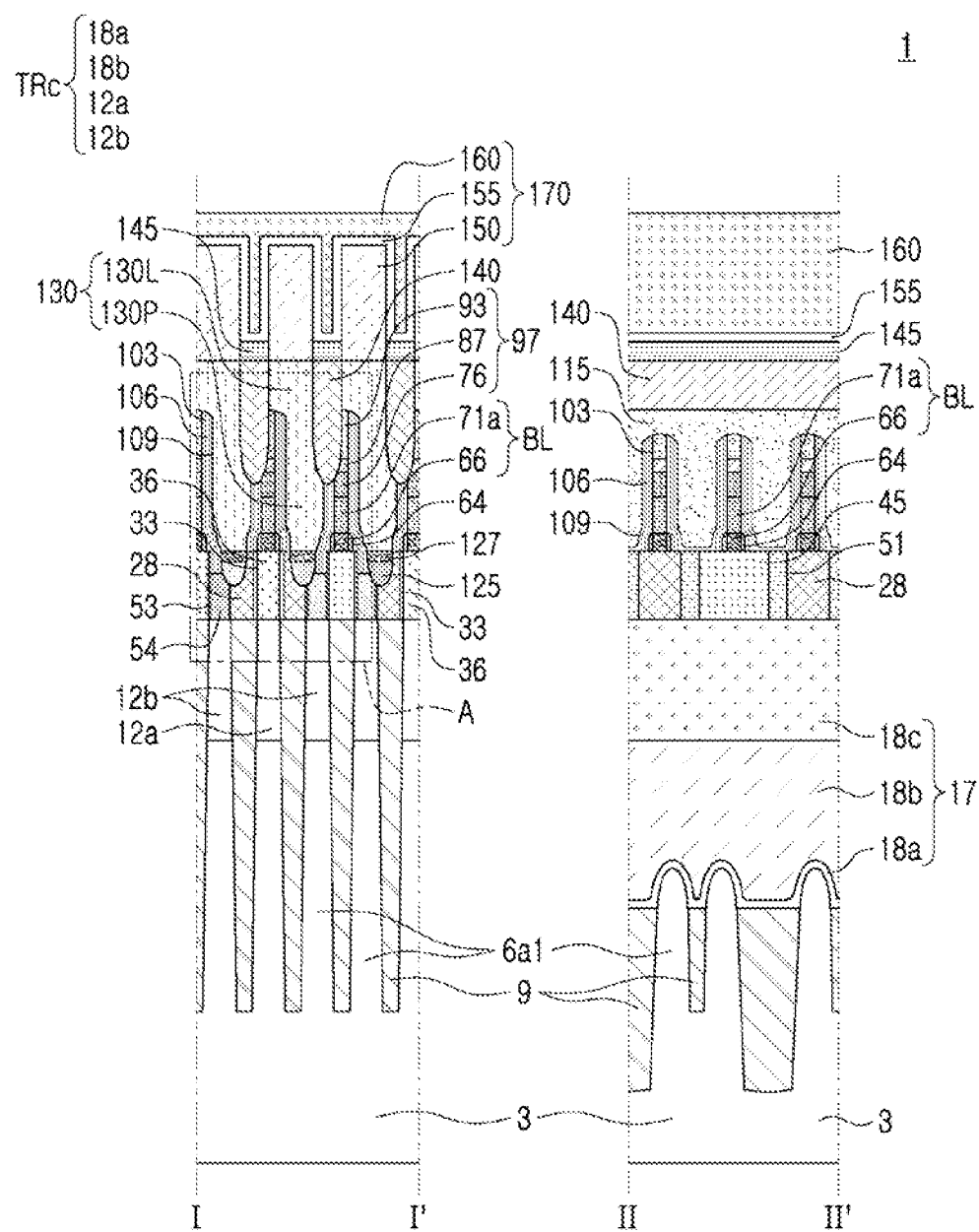
Figure 2B:
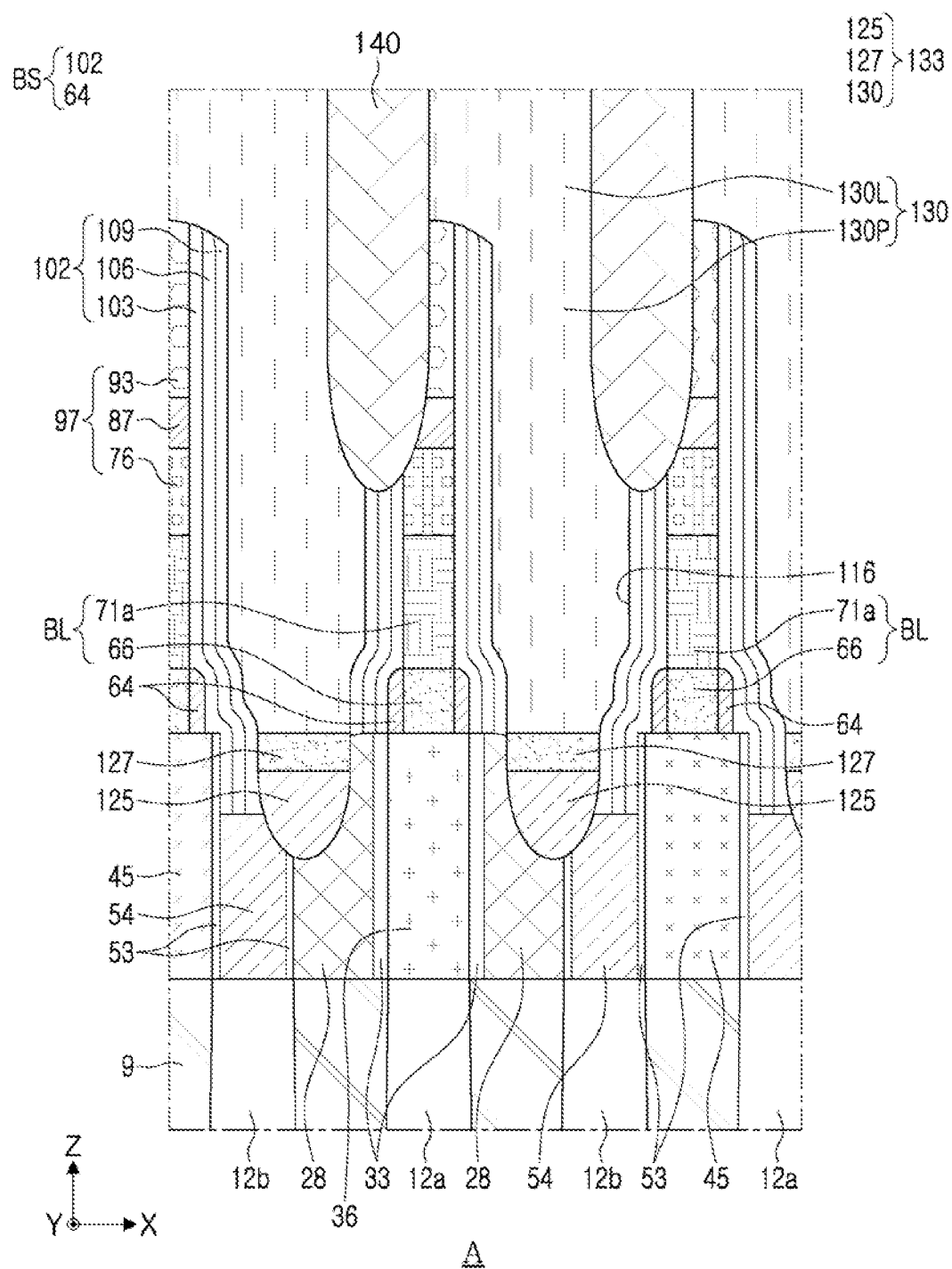
Figure 2C:
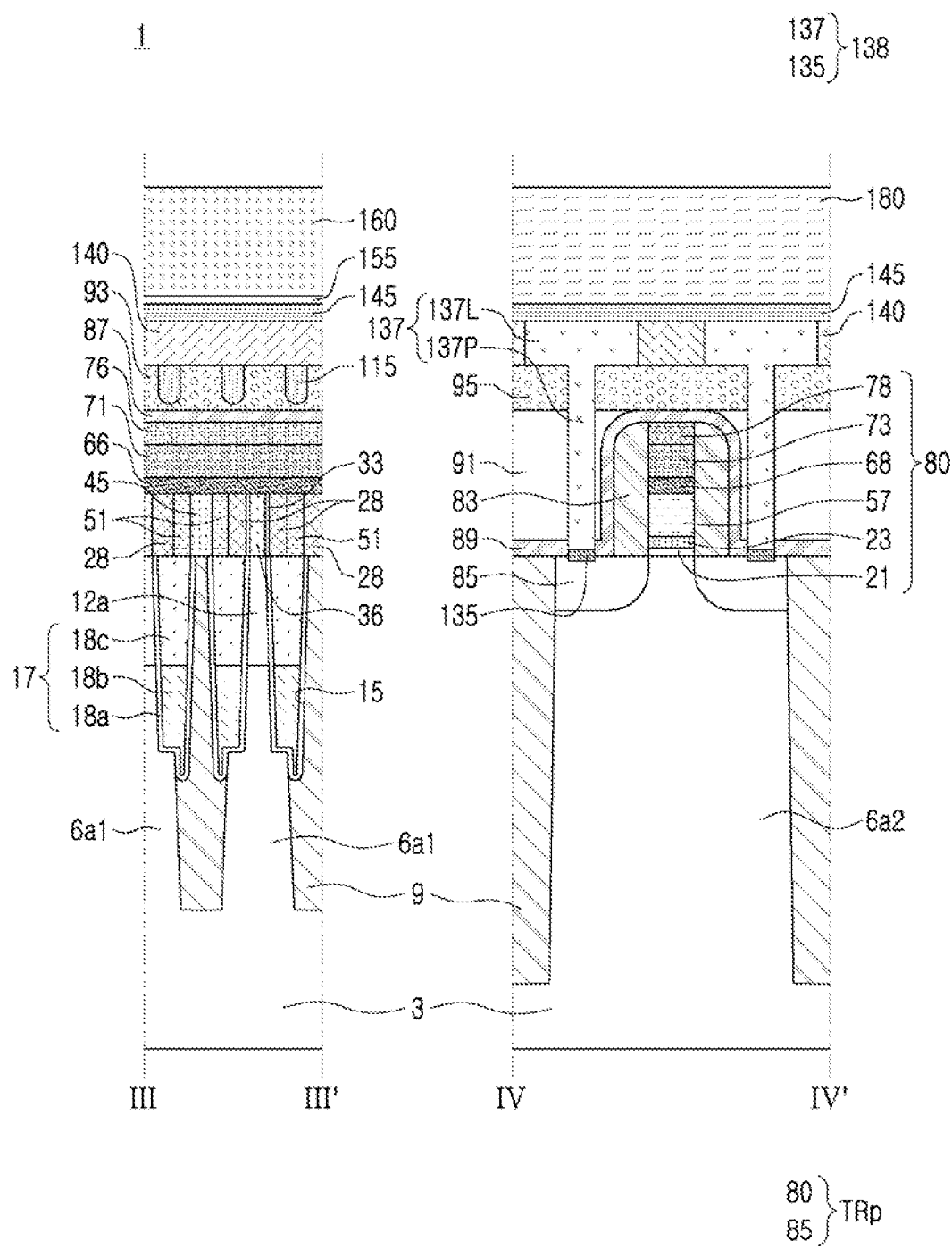

A semiconductor device according to an example embodiment will be described with reference to FIGS. 1, 2A, 2B and 2C. FIGS. 1, 2A, 2B, and 2C are diagrams that illustrates a semiconductor device according to an example embodiment. Among FIGS. 1, 2A, 2B, and 2C, FIG. 1 is a diagram that illustrates a semiconductor device according to an example embodiment, FIG. 2A is a cross-sectional diagram that illustrates regions taken along line I-I' and II-II' in FIG. 1, FIG. 2B is an enlarged diagram that illustrates region "A" in FIG. 2A, and FIG. 2C is cross-sectional diagram that illustrates regions taken along line III-III' and IV-IV' in FIG. 1.

Referring to FIGS. 1, 2A, 2B, and 2C, a semiconductor device 1 according to an example embodiment may include a substrate 3, and an isolation region 9 defining cell active regions 6a1 in a memory cell region CA and defining a peripheral active region 6a2 in a peripheral region PA.

The substrate 3 may be a semiconductor substrate. For example, the substrate 3 may include a group IV semiconductor, a group III-V compound semiconductor, or a group II-VI compound semiconductor. A group IV semiconductor may include silicon, germanium, or silicon-germanium. In some embodiments, the substrate 3 may include a silicon material, such as a single crystal silicon material. The substrate 3 may include a silicon substrate, a silicon on insulator (SOI) substrate, a germanium substrate, a germanium on insulator (GOI) substrate, a silicon-germanium substrate, or a substrate including an epitaxial layer.

The isolation region 9 may be configured as a trench isolation layer. The isolation region 9 may be disposed on the substrate 3, and may define side surfaces of the cell active regions 6a1 and the peripheral active region 6a2. The isolation region 9 may include an insulating material such as silicon oxide and/or silicon nitride. The isolation region 9 may have lower surfaces disposed on different levels along a plane, such as an X-Y plane. For example, the isolation region 9 may have a lower surface having a first level in a narrow region, and may have a lower surface having a second level lower than the first level in a wide region.

The cell active regions 6a1 and the peripheral active region 6a2 may each have one or more shapes protruding from the substrate 3 in the vertical direction Z. Direction Z may be, for example, a thickness direction of the substrate.

In the memory cell region CA, the semiconductor device 1 may further include gate trenches 15 intersecting the cell active regions 6a1 and extending into the isolation region 9, and cell gate structures 80 disposed in the gate trenches 15.

The cell gate structures 80 may have a line shape extending in the first direction X. Each of the cell active regions 6a1 may have a bar shape extending in an oblique direction with respect to the first direction X. For example, the bar shape may be disposed on an X-Y plane, and may extend diagonally with respect to the first direction X. In some embodiments, one of the cell active regions 6a1 may intersect a pair of cell gate structures adjacent to each other among the cell gate structures 80.

The cell active regions 6a1 may include first and second impurity regions 12a and 12b. For example, one of the cell active regions 6a1 may include a pair of second impurity regions 12b and a first impurity region 12a disposed between the pair of impurity regions 12b. In one of the cell active regions 6a1, the first and second impurity regions 12a and 12b may be spaced apart from each other by the cell gate structures 80. According to some embodiments, the first and second impurity regions 12a and 12b are disposed in an alternating pattern along a horizontal direction, such as the X-direction.

In example embodiments, the first impurity region 12a may be referred to as a first cell source/drain region, and the second impurity region 12b may be referred to as a second cell source/drain region.

The cell gate structures 17 may include a cell gate dielectric layer 18a which conformally covers an internal wall of the gate trench 15, a cell gate electrode 18b partially filling the gate trench 15 on the cell gate dielectric layer 18a, and a cell gate capping layer 18c filling the other portion of the gate trench 15 on the cell gate electrode 18b.

The cell gate dielectric layer 18a, the cell gate electrode 18b, the first impurity region 12a, and the second impurity region 12b may form a cell transistor TRc.

The cell gate dielectric layer 18a may include at least one of silicon oxide and a high-k material. The high dielectric may include a metal oxide or a metal oxynitride. For example, the high dielectric material may be formed of $HfO_2$, HfSiO, HfSiON, HfTaO, HfSiO, HfZrO, $ZrO_2$, $Al_2O_3$, or a combination thereof, but embodiments are not necessarily limited thereto. The cell gate dielectric layer 18a may be configured as a single layer or multiple layers formed of the aforementioned materials.

The cell gate electrode 18b may be used as a word line of a memory semiconductor device such as DRAM. The cell gate electrode 18b may include doped polysilicon, a metal, conductive metal nitride, a metal-semiconductor compound, conductive metal oxide, graphene, carbon nanotube, or a combination thereof. For example, the gate electrode 16 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, carbon nanotube, or a combination thereof, but the present disclosure is not necessarily limited thereto. The cell gate electrode 18b may include a single layer or multiple layers formed of the aforementioned materials. For example, the cell gate electrode 18b may include a first electrode layer which may be formed of a metal material and a second electrode layer which may be formed of doped polysilicon and disposed on the first electrode layer. The cell gate capping layer 18c may include an insulating material, such as, for example, silicon nitride.

With particular reference to FIG. 2B, the memory cell region CA, the semiconductor device 1 may further include first pad patterns 36, second pad patterns 54, bit lines BL, and cell contact structures 133.

The first pad patterns 36 may be disposed on the first impurity regions 12*a* of the cell active regions 6*a*1. The first pad patterns 36 may contact the first impurity regions 12*a* and may be electrically connected to the first impurity regions 12*a*.

The first pad patterns 36 may include doped epitaxial silicon, a doped polysilicon, metal, conductive metal nitride, a metal-semiconductor compound, conductive metal oxide, graphene, carbon nanotube or a combination thereof. For example, the first pad patterns 36 may include doped epitaxial silicon, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotube, or a combination thereof, but the present disclosure is not necessarily limited thereto.

In an example, the first pad patterns 36 may include an epitaxial material layer which has been epitaxially grown from the first impurity regions 12*a*. For example, the first pad patterns 36 may include an epitaxial silicon layer doped to have N-type conductivity.

In an example, the first pad patterns 36 may include a polysilicon layer having N-type conductivity.

In an example, the first pad patterns 36 may include a metal-semiconductor compound layer, and a conductive material layer including a metal layer. For example, the first pad patterns 36 may include a metal-semiconductor compound layer that contacts the first cell impurity regions 12*a* and a metal layer disposed on the metal-semiconductor compound layer.

The second pad patterns 54 may be disposed on the second cell impurity regions 12*b* of the cell active regions 6*a*1. The second pad patterns 54 may contact the second impurity regions 12*b* and may be electrically connected to the second impurity regions 12*b*.

A thickness of each of the second pad patterns 54 may be less than a thickness of each of the first pad patterns 36. Here, in the first and second pad patterns 36 and 54, "thickness" may be defined as a distance between a lower surface and an upper surface thereof. For example, the distance between the lower surface and the upper surface of each of the first pad patterns 36 may be greater than the distance between the lower surface and the upper surface of each of the second pad patterns 54. This distance may be a distance in the Z-direction, e.g., a thickness direction of the substrate 3.

A difference between the level of the upper surfaces of the second pad patterns 54 and the level of the upper surfaces of the first pad patterns 36 may be greater than the level of the lower surfaces of the second pad patterns 54 and the level of the lower surfaces of the first pad patterns 36.

In some embodiments, the lower surfaces of the second pad patterns 54 may be disposed on substantially the same level as a level of lower surfaces of the first pad patterns 36. In some embodiments, upper surfaces of the second pad patterns 54 may be disposed on a level lower than a level of the upper surfaces of the first pad patterns 36.

The second pad patterns 54 may include doped epitaxial silicon, doped polysilicon, metal, conductive metal nitride, metal-semiconductor compound, conductive metal oxide, graphene, carbon nanotube or a combination thereof. For example, the second pad patterns 54 may include doped epitaxial silicon, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotube, or a combination thereof, but the present disclosure is not necessarily limited thereto.

In an example, the second pad patterns 54 may include an epitaxial material layer which has been epitaxially grown from the second impurity regions 12*b*. For example, the second pad patterns 54 may include an epitaxial silicon layer doped to have N-type conductivity. In an example, the second pad patterns 54 may include a polysilicon layer having N-type conductivity.

In an example, the second pad patterns 54 may include a metal-semiconductor compound layer, and a conductive material layer including a metal layer. For example, the second pad patterns 54 may include a metal-semiconductor compound layer in contact with the second cell impurity regions 12*b* and a metal layer disposed on the metal-semiconductor compound layer.

In an example, the second pad patterns 54 may include the same material as that of the first pad patterns 36. In an example, the second pad patterns 54 may include a material different from that of the first pad patterns 36.

The bit lines BL may have a line shape and may extend in a second direction Y perpendicular to the first direction X. Lower surfaces of the bit lines BL may contact upper surfaces of the first pad patterns 36.

In one embodiment, a width of an upper surface of one of the first pad patterns 36 in the first direction X may be greater than a width of the lower surface of one of the bit lines BL the first direction X.

Each of the bit lines BL may include a lower conductive line 66 and an upper conductive line 71*a* disposed on the lower conductive line 66. The lower conductive line 66 may contact the first pad pattern 36. The upper conductive line 71*a* may contact the lower conductive line 66.

The lower conductive line 66 may include doped polysilicon, metal, conductive metal nitride, metal-semiconductor compound, conductive metal oxide, graphene, carbon nanotube, or a combination thereof. For example, the lower conductive line 66 may include doped epitaxial silicon, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotube, or a combination thereof, but the present disclosure is not necessarily limited thereto.

The upper conductive line 71*a* may include doped polysilicon, metal, conductive metal nitride, metal-semiconductor compound, conductive metal oxide, graphene, carbon nanotube, or a combination thereof. For example, the lower conductive line 66 may include doped epitaxial silicon, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotube, or a combination thereof, but the present disclosure is not necessarily limited thereto.

In some embodiments the upper conductive line 71*a* includes a material different from that of the lower conductive line 66. The cell contact structures 133 may be electrically connected to the first pad patterns 54, and may contact the first pad patterns 54.

In the memory cell region CA, the semiconductor device 1 may further include barrier spacers 28 and first buffer spacers 33. The barrier spacers 28 may each have a ring shape which surrounds each of the first pad patterns 54, respectively. For example, one of the barrier spacers 28 may have a ring shape surrounding a side surface (e.g., a lateral surface) of one of the first pad patterns 54. The first buffer spacers 33 may be disposed between the first pad patterns 54 and the barrier spacers 28.

In an example, one barrier spacer 28 may have a ring shape that surrounds all side surfaces of the first pad pattern 54, and one first buffer spacer 33 may have a ring shape that surrounds all side surfaces of the first pad pattern 54. For example, the barrier spacer 28 may at least partially or completely surround the first pad pattern 54 in a plan view, and the first buffer spacer 33 may at least partially or completely surround the first pad pattern 54 in the plan view.

A thickness of each of the barrier spacers 28 may be greater than a thickness of each of the first buffer spacers 33. The barrier spacers 28 may be disposed on the isolation region 9 and the cell gate structures 17. The barrier spacers 28 may include a first insulating material, and the first buffer spacers 33 may include a second insulating material that is different from the first insulating material. For example, the barrier spacers 28 may include silicon nitride, and the first buffer spacers 33 may include silicon oxide.

In the memory cell region CA, the semiconductor device 1 may further include bit line capping patterns 97 disposed on the bit lines BL. The bit line capping patterns 97 may be aligned with the bit lines BL. For example, the bit line capping patterns 97 may be aligned with the bit lines BL in a vertical direction, e.g., the Z-direction. In an embodiment, each of the bit line capping patterns 97 may include the lower capping material layer 76, the intermediate capping material layer 87, and the upper capping material layer 93 vertically stacked. The bit line capping patterns 97 may include an insulating material such as silicon nitride.

In the memory cell region CA, the semiconductor device 1 may further include second buffer spacers 53. The second buffer spacers 53 may surround each of the second pad patterns 54. For example, one of the second buffer spacers 53 may cover a side surface of one of the second pad patterns 54. One of the second buffer spacers 53 may cover the entirety of a side surface of one of the second pad patterns 54. The second buffer spacers 53 may contact side surfaces of the second pad patterns 54. The second buffer spacers 53 may include an insulating material such as silicon oxide.

In the memory cell region CA, the semiconductor device 1 may further include first insulating patterns 45 and second insulating patterns 51. In an example embodiment, the first insulating patterns 45 and the second insulating patterns 51 may fill the space between the external side surfaces of the barrier spacers 28 together with the second pad patterns 54 and the second buffer spacers 53. In the cross-sectional structure illustrated in FIGS. 2A and 2B, the first insulating pattern 45 may be disposed between the first pad patterns 54. In the cross-sectional structure in FIG. 2C, the second insulating patterns 51 may be disposed between the barrier spacers 28 and the first insulating pattern 45. The first insulating patterns 45 and the second insulating patterns 45 may include an insulating material such as silicon nitride.

In the memory cell region CA, the semiconductor device 1 may further include spacer structures BS. Hereinafter, one of the spacer structures BS, one of the bit lines BL, and one of the bit line capping patterns 97 will be described.

The spacer structure BS may include a first bit line spacer 64 and a second bit line spacer 102. The second bit line spacer 102 may be disposed on a side surface of the bit line BL and a side surface of the bit line capping pattern 97. The first bit line spacer 64 may be disposed between the second bit line spacer 102 and the lower conductive line 66.

The first bit line spacer 64 may cover a side surface of the lower conductive line 66. The first bit line spacer 64 may contact a side surface of the lower conductive line 66.

The second bit line spacer 102 may contact the side surface of the upper conductive line 71a and the side surface of the bit line capping pattern 97 while covering the external side surface of the first bit line spacer 64. A thickness of the second bit line spacer 102 may be greater than a thickness of the first bit line spacer 64. The first bit line spacer 64 may include an insulating material such as silicon nitride.

The second bit line spacer 102 may include at least two insulating layers. For example, the second bit line spacer 102 may include an internal spacer 103, an intermediate spacer 106, and an external spacer 109. The internal spacer 103 may contact the side surface of the upper conductive line 71a and the side surface of the bit line capping pattern 97, and may cover or at least partially cover an outer side surface of the first bit line spacer 64. The intermediate spacer 106 may be disposed between the internal spacer 103 and the external spacer 109.

The internal and external spacers 103 and 109 may include an insulating material such as silicon nitride. The intermediate spacer 106 may include an insulating material such as silicon oxide, or, in some embodiments, may be an air gap.

An upper surface of one of the first pad patterns 36 may partially contact a lower surface of the lower conductive line 66 of the bit line BL and may partially contact the first bit line spacer 64. A width of the upper surface of the first pad pattern 36 may be greater than a width of the lower surface of the lower conductive line 66 in the first direction X. Accordingly, side surfaces of the first pad pattern 36 might not be vertically aligned with side surfaces of the lower conductive line 66.

In the diagram as viewed from above (e.g., a plan view), the second pad pattern 54 may have a first side surface S1 and a second side surface S2 opposing each other in the first direction X, and a third side surface S3 and a fourth side surface S4 opposing each other in the second direction Y. For example, the first side surface S1 may be disposed proximate to first pad pattern 36, and the second side surface S2 may be disposed distal to the first pad pattern 36. In the diagram as viewed from above (e.g., in a plan view), each of the first and second side surfaces S1 and S2 may be curved, and each of the third and fourth side surfaces S3 and S4 may be substantially linear. In the diagram as viewed from above (e.g., in a plan view), a center portion of each of the first and second side surfaces S1 and S2 may be bent in the first direction X away from the first pad pattern 36. In the diagram as viewed from above (e.g., in a plan view), each of the third and fourth side surfaces S3 and S4 may have a linear shape extending in the first direction X. In the diagram as viewed from above (e.g., in a plan view), the first pad pattern 36 may have a circular shape.

The level difference between the level of the upper surface of the first pad pattern 36 and the level of the upper surface of the second pad pattern 54 may be greater than a level difference between the level of the lower surface of the first pad pattern 36 and the level of the lower surface of the second pad pattern 54.

A width of an upper surface of the first pad pattern 36 may be different from a width of a lower surface of the bit line BL in the first direction X. For example, a width of the upper surface of the first pad pattern 36 may be greater than a width of the lower surface of the bit line BL in the first direction.

The upper surface of the first pad pattern 36 may include a portion which vertically overlaps the lower conductive line 66 and a portion which vertically overlaps the first bit line spacer 64. An upper surface of the first pad pattern 36 may include a portion in contact with the lower conductive line 66 and a portion in contact with the first bit line spacer 64.

Each of the cell contact structures 133 may include a plurality of conductive layers. Hereinafter, one of the cell contact structures 133 and a second pad pattern 54 in contact with the cell contact structure 133 will be mainly described.

The cell contact structure 133 may include a first conductive layer 125 which contacts the second pad pattern 54, a second conductive layer 127 disposed on the first conductive layer 125, and a third conductive layer 130 disposed on the second conductive layer 127. The third conductive layer 130 may include a contact plug portion 130P and a landing pad portion 130L covering a portion of an upper surface of the adjacent bit line capping pattern 97 on the contact plug portion 130P.

The first conductive layer 125 may be configured as an epitaxial silicon layer having N-type conductivity or a polysilicon layer having N-type conductivity. The second conductive layer 127 may include a metal-semiconductor compound such as TiSi or CoSi, or a conductive metal nitride such as TiSiN. The third conductive layer 130 may include a metal, a metal nitride, a metal-semiconductor compound, or a combination thereof.

The cell contact structure 133 may contact the second pad pattern 54, the second buffer spacer 53, and the barrier spacer 28.

A lower end of the cell contact structure 133 may be disposed on a level that is lower than a level of an upper end of the second pad pattern 54.

In embodiments, a vertical central axis (e.g., a Z axis) of the second pad pattern 54 and a vertical central axis (e.g., a Z axis) of the lower region of the cell contact structure 133 might not be aligned.

In the memory cell region CA, the semiconductor device 1 may further include an insulating isolation pattern 140. The insulating isolation pattern 140 may include an insulating material such as silicon nitride.

In the memory cell region CA, the insulating isolation pattern 140 may pass through a region between the landing pad portions 130L of the cell contact structures 133, may extend downwardly, and may isolate the cell contact structures 133 from each other.

In the memory cell region CA, the semiconductor device 1 may further include insulating fences 115. The insulating fences 115 may define contact holes 116 between the structures including the bit lines BL and the bit line capping patterns 97. The cell contact structures 133 may be disposed between the insulating fences 115 between the structures including the bit lines BL and the bit line capping patterns 97. The insulating fences 115 may be formed of an insulating material such as silicon nitride.

In the peripheral region PA, the semiconductor device 1 may include a peripheral gate structure 80 disposed on the peripheral active region 6a2, a peripheral gate spacer 83 disposed on a side surface of the peripheral gate structure 80, and peripheral source/drain regions 85 disposed in the peripheral active region 6a2 on both sides of the peripheral gate structure 80.

The peripheral gate structure 80 may include a peripheral gate dielectric layer 21, and peripheral gate electrodes 23, 57, and 68, and 73 disposed on the peripheral gate dielectric layer 21.

The peripheral source/drain regions 85, the peripheral gate dielectric layer 21, and the peripheral gate electrodes 23, 57, and 68, and 73 may form a peripheral transistor TRp.

The peripheral gate electrodes 23, 57, and 68, and 73 may include a first peripheral gate electrode layer 23, a second peripheral gate electrode layer 57, a third peripheral gate electrode layer 68, and a fourth peripheral gate electrode layer 73 stacked vertically.

The first peripheral gate electrode layer 23 may be a work function control layer. For example, the first peripheral gate electrode layer 23 may be configured as an NMOS work function control layer formed of a conductive material which may adjust or control a threshold voltage of an NMOS transistor, or a PMOS work function control layer formed of a conductive material which may adjust or control a threshold voltage of the PMOS transistor depending on the type of the peripheral transistor TRp. In embodiments, the first peripheral gate electrode layer 23 may include at least one of TiN, TiAl, TiAlC, TiAlN, TaN, TaAlC, and TaAlN. By adjusting the amount of a metal element of at least one of TiN, TiAl, TiAlC, TiAlN, TaN, TaAlC and TaAlN in the first peripheral gate electrode layer 23, the first peripheral gate electrode layer 23 may work as an NMOS work function control layer, or a PMOS work function control layer.

The second peripheral gate electrode layer 57 may be formed of a material that is different from that of the first peripheral gate electrode layer 23. For example, the second peripheral gate electrode layer 57 may be formed of doped polysilicon. For example, the second peripheral gate electrode layer 57 may be formed of poly silicon having N-type conductivity.

The third peripheral gate electrode layer 68 may include a material that is different from the materials of the first and second peripheral gate electrode layers 23 and 57. The third peripheral gate electrode layer 68 may include a TiN or titanium silicon nitride (TiSiN) layer.

The fourth peripheral gate electrode layer 73 may include a material different from that of the first to third peripheral gate electrode layers 23, 57, and 68. The fourth peripheral gate electrode layer 73 may include a tungsten (W) layer.

In example embodiments, the third peripheral gate electrode layer 68 may be formed of the same material as that of the lower conductive lines 45 of the bit lines BL. In example embodiments, the fourth peripheral gate electrode layer 73 may be formed of the same material as that of the upper conductive lines 71a of the bit lines BL.

The peripheral gate capping layer 78 may include an insulating material, such as, for example, silicon nitride. The peripheral gate spacer 83 may include an insulating material such as silicon oxide and/or silicon nitride.

The semiconductor device 1 may further include an insulating liner 89 which covers or at least partially covers the peripheral gate spacer 83 and the peripheral gate structure 80 and which covers or at least partially covers the peripheral source/drain regions 85 and the isolation region 9. The semiconductor device 1 may further include a peripheral interlayer insulating layer 91 disposed on the insulating liner 89, and a peripheral capping layer 95 disposed on the insulating liner 89 and the peripheral interlayer insulating layer 91.

The insulating liner 89 may include a material different from that of the peripheral interlayer insulating layer 91. For example, the insulating liner 89 may include silicon nitride, and the peripheral interlayer insulating layer 91 may include silicon oxide or a low-k dielectric having a dielectric constant lower than that of silicon oxide. The peripheral capping layer 95 may include a material different from that of the peripheral interlayer insulating layer 91, such as, for example, silicon nitride.

The semiconductor device 1 may further include peripheral contact structures 138 which penetrate through the peripheral capping layer 95, the peripheral interlayer insulating layer 91, and the insulating liner 89 and which are electrically connected to the peripheral source/drain regions 85.

Each of the peripheral contact structures 138 may include a metal-semiconductor compound layer 135 which contacts each of the peripheral source/drain regions 85, and a peripheral conductive layer 137 disposed on the metal-semiconductor compound layer 135. The peripheral conductive layer 137 may include a peripheral plug portion 137P, and a peripheral wiring portion 137L which partially covers a portion of the upper surface of the peripheral capping layer 95 and is disposed on the peripheral plug portion 137P. The peripheral plug portion 137P may penetrate the peripheral capping layer 95, the peripheral interlayer insulating layer 91, and the insulating liner 89 in a thickness direction (e.g., the vertical direction). The peripheral wiring portion 137L may be disposed on the peripheral capping layer 95.

In the peripheral region PA, the insulating isolation patterns 140 may extend through a region between the peripheral wiring portions 137L and may isolate the peripheral wiring portions 137L from each other.

The semiconductor device 1 may further include an etch stop layer 145. The etch stop layer 145 may cover the cell contact structures 133, the peripheral contact structures 138, and the insulating isolation patterns 140.

The semiconductor device 1 may further include a data storage structure 170 and an upper insulating layer 180. The upper insulating layer 180 may cover the etch stop layer 145 in the peripheral region PA.

The data storage structure 170 may include first electrodes 150 which contact the landing pad portions 130L, penetrate through the etch stop layer 145, and extend upwardly, a dielectric layer 155 which conformally covers the first electrodes 150, and a second electrode 160 disposed on the dielectric layer 155, in the memory cell region CA.

In an example, the data storage structure 170 may be a capacitor and may be used to store data in a DRAM. For example, the dielectric layer 155 of the data storage structure 170 may be a capacitor dielectric layer of a DRAM, and the dielectric layer 155 may include a high-k material, silicon oxide, silicon nitride, silicon oxynitride, or a combination thereof.

In an example, the data storage structure 170 may be used to store data of a memory different from a DRAM. For example, the data storage structure 170 may be disposed between the first and second electrodes 150 and 160 and may be configured as a capacitor of a ferroelectric memory (FeRAM) including a dielectric layer 155 including a ferroelectric layer. For example, the dielectric layer 155 may be configured as a ferroelectric layer for writing data using a polarization state.

In an example, the dielectric layer 155 may include a lower dielectric layer and a ferroelectric layer disposed on the lower dielectric layer. Here, the lower dielectric layer may include at least one of silicon oxide, silicon oxynitride, silicon nitride, and a high-k material. The high-k material may include a metal oxide or a metal oxynitride. For example, the high dielectric material may include $HfO_2$, HfSiO, HfSiON, HfTaO, HfSiO, HfZrO, $ZrO_2$, $Al_2O_3$, or a combination thereof, but the present disclosure is not necessarily limited thereto.

When the data storage structure 170 is a capacitor for storing data of a ferroelectric memory (FeRAM), the ferroelectric layer of the dielectric layer 155 may include an Hf-based compound, a Zr-based compound, and/or a Hf—Zr-based compound. For example, the Hf-based compound may be an HfO-based ferroelectric material, the Zr-based compound may include a ZrO-based ferroelectric material, and the Hf—Zr-based compound may include a hafnium zirconium oxide (HZO)-based ferroelectric material. The ferroelectric layer of the dielectric layer 155 of the data storage structure 170 may include impurities, such as, for example, a ferroelectric material doped with at least one of C, Si, Mg, Al, Y, N, Ge, Sn, Gd, La, Sc and Sr.

For example, the ferroelectric layer of the dielectric layer 155 of the data storage structure 170 may include a material including at least one of $HfO_2$, $ZrO_2$ and HZO, and doped with impurities, such as, as least one of C, Si, Mg, Al, Y, N, Ge, Sn, Gd, La, Sc and Sr. The ferroelectric layer of the dielectric layer 155 of the data storage structure 170 is not necessarily limited to the above-described types of materials, and may include a number of materials having ferroelectric properties for storing data. For example, the ferroelectric layer of the dielectric layer 155 of the data storage structure 170 may include at least one of $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, $HF_{0.5}Zr_{0.5}O_2$, $PbZr_xTi1-xO3$ (0<x<1), $Ba(Sr,Ti)O_3$, $Bi_{4-x}La_xTi3O12$ (0<x<1), $SrBi_2Ta_2O_9$, $Pb_5Ge_5O_{11}$, $SrBi_2Nb_2O_9$, and $YMnO_3$.

Hereinafter, various modifications of the elements of the above-described example embodiment will be described with reference to FIGS. 3A to 3E. The various modifications of the elements of the above-described example embodiment described below will be mainly described with respect to the elements to be modified or the elements to be replaced. Also, the modified or replaced elements described below will be described with reference to the relevant drawings, and the elements which may be modified or replaced may be combined with each other, or may be combined with the elements described above to implement a semiconductor device according to the present disclosure.

FIGS. 3A to 3E are diagrams that illustrate various modified examples of a semiconductor device according to an example embodiment, and are enlarged diagrams that illustrate elements modified from the enlarged diagram in FIG. 2B.

Figure 3A:
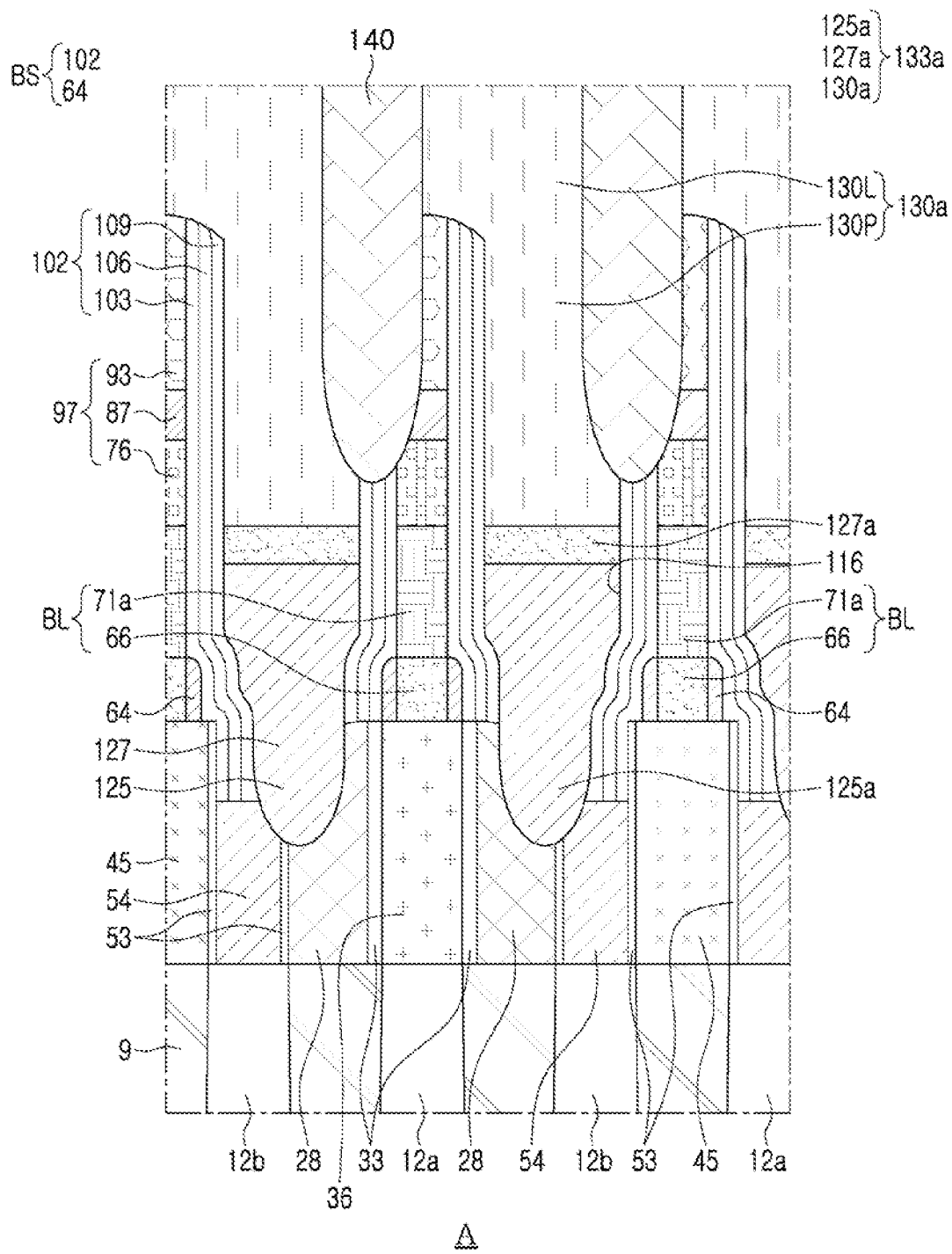
FIG. 3A is a cross-sectional diagram that illustrates a modified example of a semiconductor device according to an example embodiment of the present disclosure.

In the modified example, referring to FIG. 3A, the cell contact structure 133 described with reference to FIG. 2B may be modified into the cell contact structure 133a illustrated in FIG. 3A. For example, the first conductive layer 125 (in FIG. 2B) described with reference to FIG. 2B may be modified into a first conductive layer 125a having an upper surface disposed on a level higher than a level of the upper surface of the lower conductive line 66. The upper surface of the first conductive layer 125a may be disposed on a level higher than a level of the upper surface of the lower conductive line 66 and may be disposed on a level lower than a level of an upper surface of the upper conductive line 71a. Accordingly, the second conductive layer 127 (in FIG. 2B) described with reference to FIG. 2B may be modified into a second conductive layer 127a disposed on the first conductive layer 125a, and the third conductive layer 130 (in FIG. 2B) described with reference to FIG. 2B may be modified into a third conductive layer 130a disposed on the second conductive layer 127a, as shown in the example illustrated by FIG. 3A.

Figure 3B:
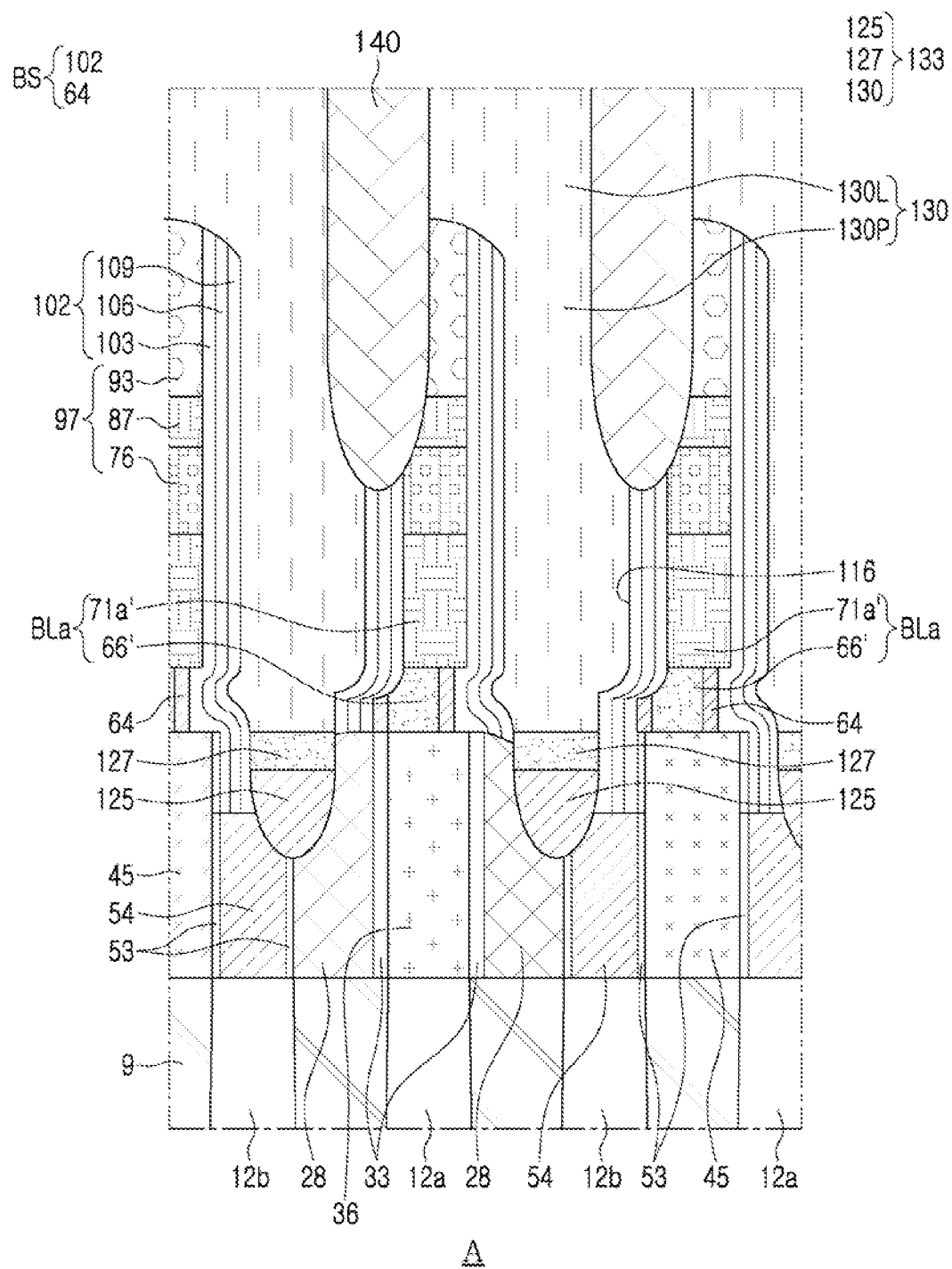
FIG. 3B is a cross-sectional diagram that illustrates a modified example of a semiconductor device according to an example embodiment of the present disclosure.

In another modified example, referring to FIG. 3B, the bit line BL (in FIG. 2B) described with reference to FIG. 2B may be modified into the bit line BLa as in FIG. 3B. For example, the bit line BL (in FIG. 2B) described with reference to FIG. 2B may include the lower and upper conductive lines 66 and 71a (in FIG. 2B) having side surfaces aligned with each other, and the bit line BLa in FIG.

3B may include the lower and upper conductive lines 66' and 71a' having side surfaces which might not be aligned (e.g. in a vertical direction). For example, in the bit line BLa, a side surface of the upper conductive line 71a' might not be aligned with a side surface of the lower conductive line 66'. A central axis between both side surfaces of the upper conductive line 71a' might not be aligned with a central axis between both side surfaces of the lower conductive line 66'.

Figure 3C:
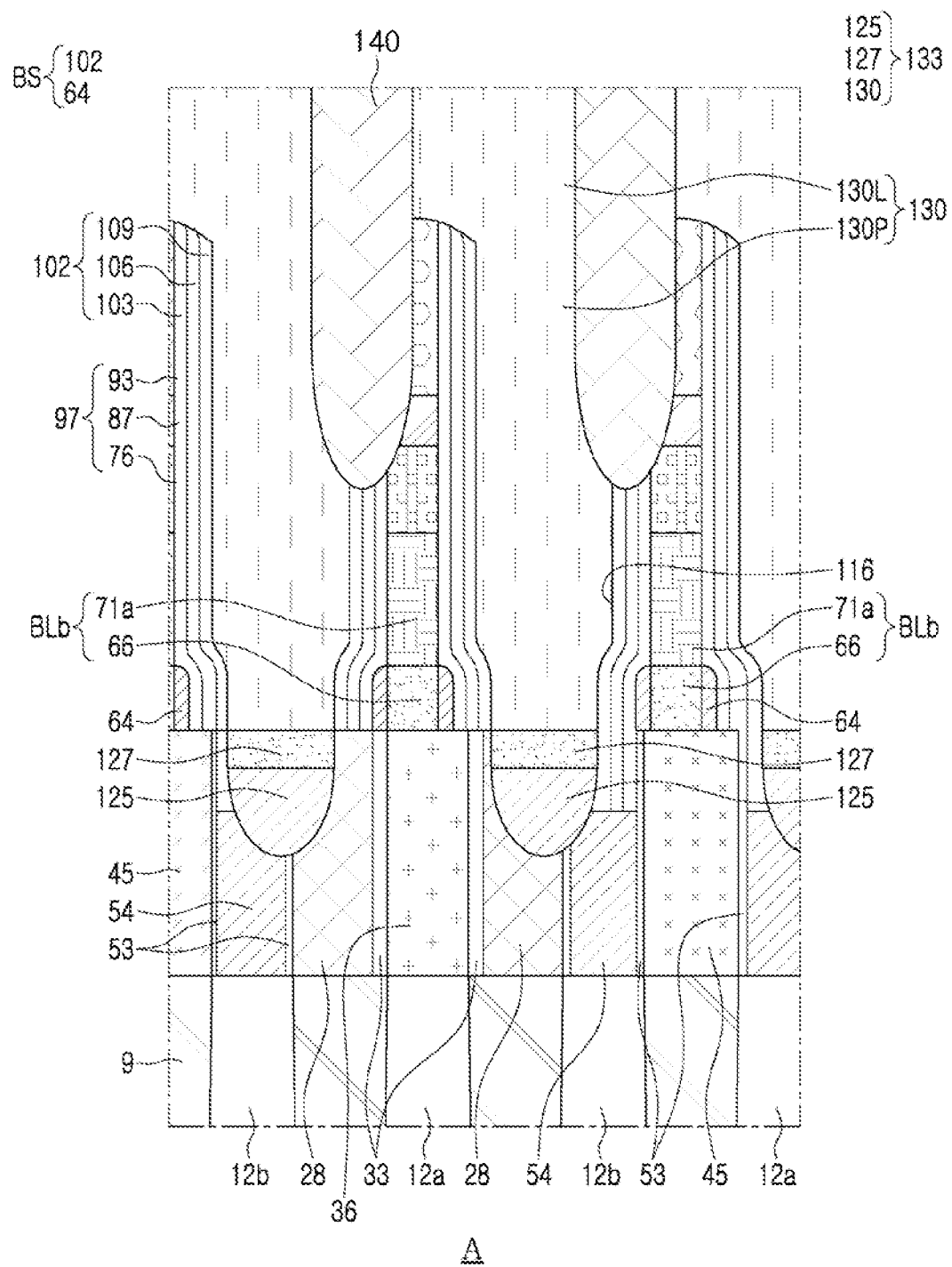
FIG. 3C is a cross-sectional diagram that illustrates a modified example of a semiconductor device according to an example embodiment of the present disclosure.

In another modified example, referring to FIG. 3C, the bit line BL (in FIG. 2B) described with reference to FIG. 2B may be modified to the bit line BLb as in FIG. 3C. For example, the vertical central axis of the bit line BL (in FIG. 2B) described with reference to FIG. 2B may be aligned with the vertical central axis of the first pad pattern 36 in the first direction X. In the modified example in FIG. 3C, however, the bit line BLb may have a vertical central axis which might not be aligned with the vertical central axis of the first pad pattern 36 in the first direction X. In this example, though the vertical central axes of the bit line BLb and the first pad pattern 36 might not be aligned, a side surface of the lower conductive line 66 of the bit line BLb may be vertically aligned with a side surface of the first pad pattern 36. Here, the "vertical central axis" may refer to a central axis that follows a virtual vertical line disposed between side surfaces opposing each other in the first direction X.

Figure 3D:
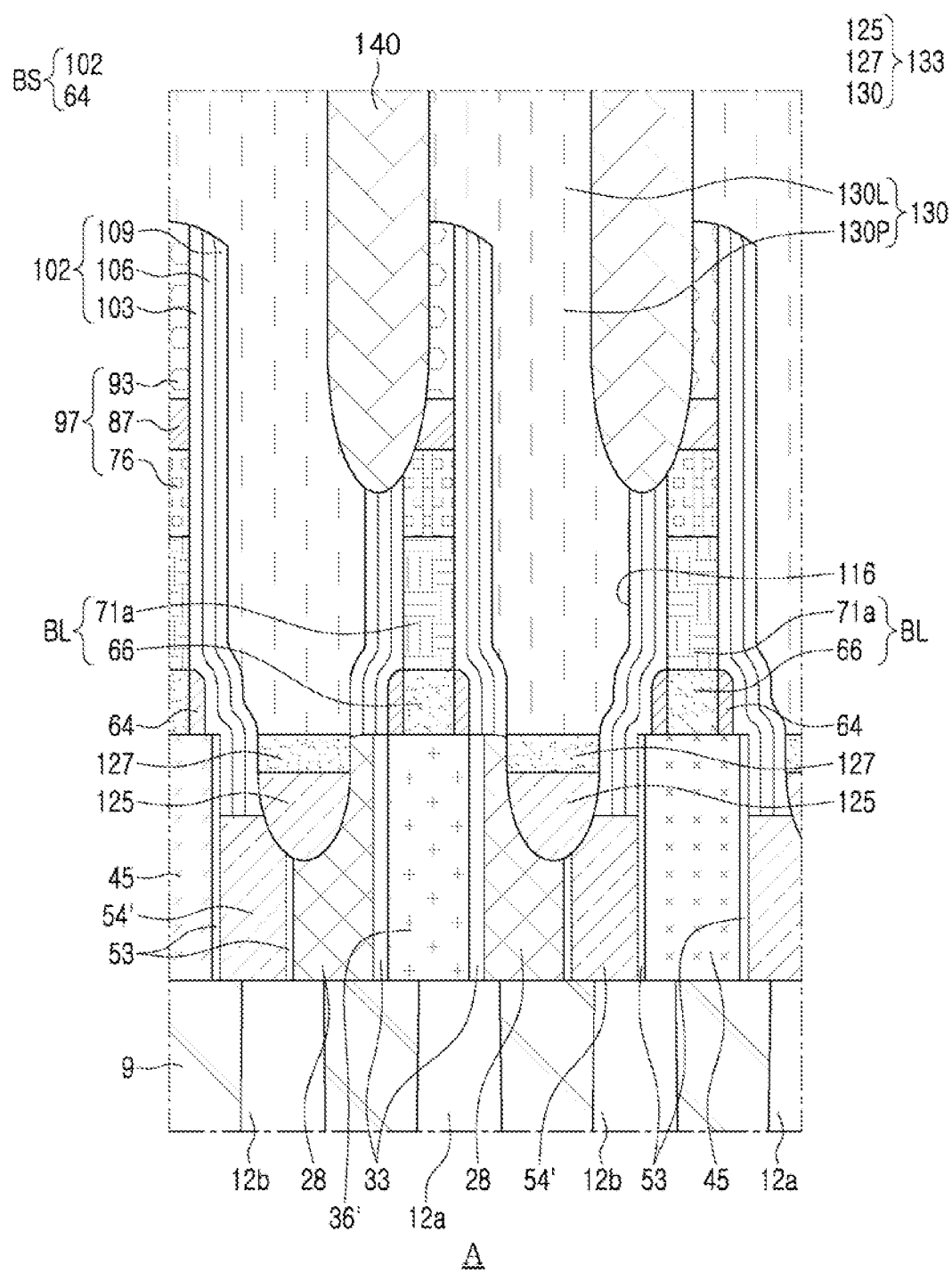
FIG. 3D is a cross-sectional diagram that illustrates a modified example of a semiconductor device according to an example embodiment of the present disclosure.

In another modified example, referring to FIG. 3D, the first pad pattern 36 and the second pad pattern 54 described with reference to FIG. 2B may be modified into a first pad pattern 36' and a second pad pattern 54' as in FIG. 3D.

In an example, the vertical central axis of the first pad pattern 36 (in FIG. 2B) described with reference to FIG. 2B may be aligned with the vertical central axis of the first impurity region 12a in the first direction X. The vertical central axis of the first pad pattern 36' in FIG. 3D in the modified example might not be aligned with the vertical central axis of the first impurity region 12a in the first direction X. The first pad pattern 36' may include a portion which contacts the first impurity region 12a and a portion which contacts the isolation region 9 adjacent to one side of the first impurity region 12a.

In an example, the vertical central axis of the second pad pattern 54 (in FIG. 2B) described with reference to FIG. 2B may be aligned with the vertical central axis of the second impurity region 12b in the first direction X. A vertical central axis of the second pad pattern 54' in FIG. 3D in the modified example might not be aligned with a vertical central axis of the second impurity region 12b in the first direction X. The second pad pattern 54' may include a portion which contacts the second impurity region 12b and a portion which contacts the isolation region 9 adjacent to one side of the second impurity region 12b.

Here, the "vertical central axis" may refer to a central axis between side surfaces opposing each other in the first direction X.

Figure 3E:
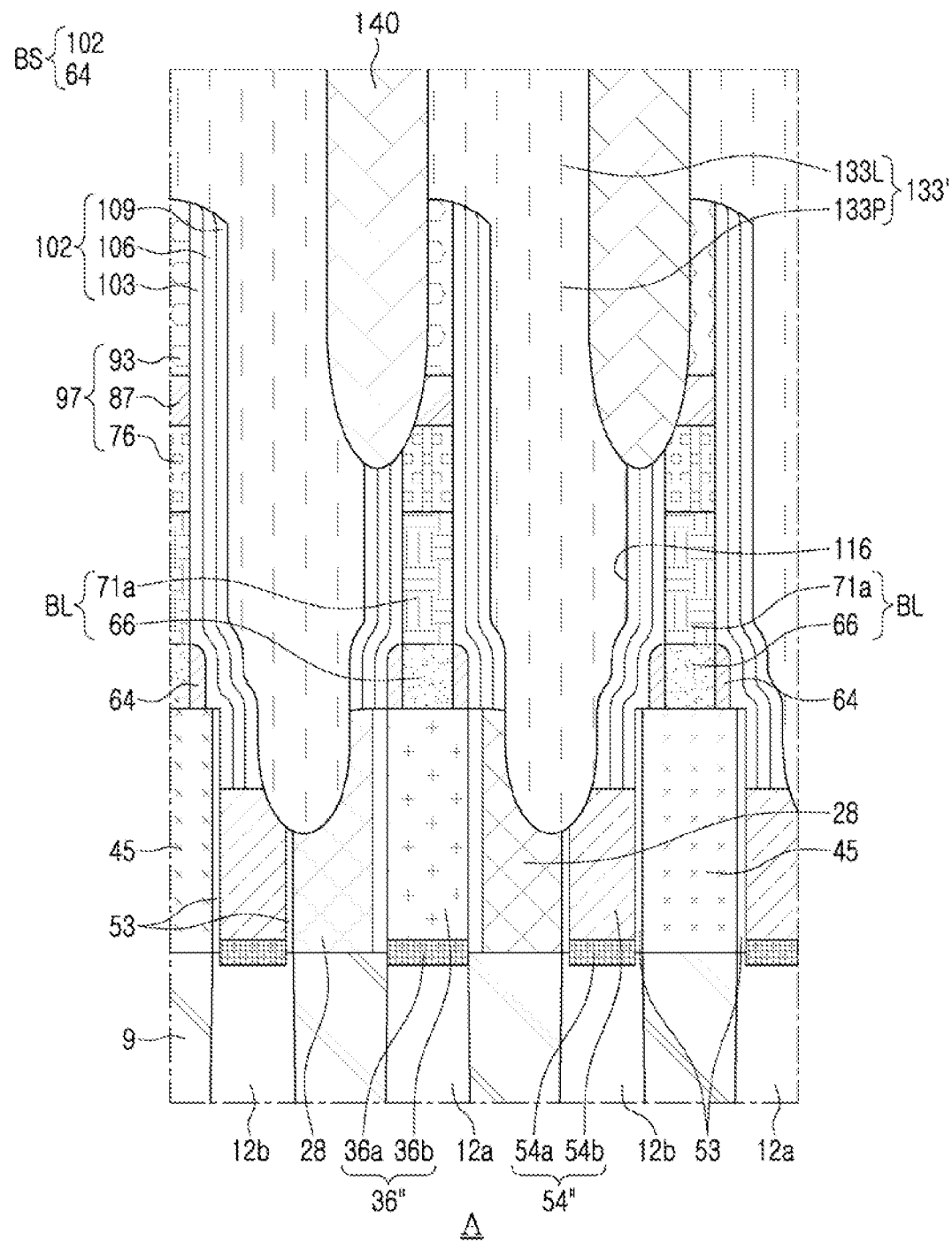
FIG. 3E is a cross-sectional diagram that illustrates a modified example of a semiconductor device according to an example embodiment of the present disclosure.

In another modified example, referring to FIG. 3E, the first pad pattern 36 and the second pad pattern 54 described with reference to FIG. 2B may be modified to a first pad pattern 36" and a second pad pattern 54" as in FIG. 3E, and the cell contact structure 133 described with reference to FIG. 2B may be modified to a cell contact structure 133' as illustrated in FIG. 3E. The first pad pattern 36" may include a metal-semiconductor compound layer 36a which contacts the first impurity region 12a and a conductive layer 36b disposed on the metal-semiconductor compound layer 36a. The second pad pattern 54" may include a metal-semiconductor compound layer 54a which contacts the second impurity region 12b and a conductive layer 54b disposed on the metal-semiconductor compound layer 54a.

The metal-semiconductor compound layer 36a of the first pad pattern 36" may include at least one of TiSi, TaSi, NiSi, and CoSi, and the conductive layer 36b of the first pad pattern 36" may include at least one of a metal-nitride and a metal. The metal-semiconductor compound layer 54a of the second pad pattern 54" may include at least one of TiSi, TaSi, NiSi, and CoSi, and the conductive layer 54b of the second pad pattern 54" may include at least one of a metal-nitride and a metal.

The first and second conductive layers 125 and 127 (in FIG. 2B) described with reference to FIG. 2B might not be provided in the cell contact structure 133', and the cell contact structure 133' may be formed of the material of the third conductive layer 130 (in FIG. 2B). The cell contact structure 133' may include a contact plug portion 133P which contacts the second pad pattern 54" and a landing pad portion 133L covering a portion of an upper surface of the adjacent bit line capping pattern 97 on the contact plug portion 133P. For example, the contact plug portion 133P may include at least one of a metal-nitride and a metal, and may contact the second pad pattern 54". At least one of a metal-nitride and a metal of the contact plug portion 133P may contact the second pad pattern 54".

Accordingly, a semiconductor device according to the present disclosure includes an arrangement of a bitline and first and second pad patterns. The arrangement as described herein increases integration of the semiconductor device, as well as the space utilization. Further, the arrangement of the bitline and the first pad pattern may prevent a bend in the bitline, and increase reliability and performance of the semiconductor device by preventing a short circuit.

The following will describe an example of a method of manufacturing a semiconductor device according to an example embodiment. FIGS. 4 to 30B are diagrams that illustrate an example of a method of manufacturing a semiconductor device according to an example embodiment. Among 4 to 30B, FIGS. 4, 6, 8, 11, 15, 17, 20, 22, and 27 are diagrams that illustrate a method of manufacturing a semiconductor device according to an example embodiment, viewed from above (e.g., a plan view). FIGS. 5A, 7A, 9A, 10A, 12A, 13, 16A, 18A, 19, 21A, 23A, 24A, 25, 26, 28A, 29A and 30A are cross-sectional diagrams that illustrate regions taken along lines I-I' and II-II' in FIG. 1, and FIGS. 5B, 7B, 9B, 10B, 12B, 14, 16B, 18B, 21B, 23B, 24B, 28B, 29B, and 30B are cross-sectional diagrams that illustrate regions taken along lines III-III' and IV-IV' in FIG. 1.

Figure 4:
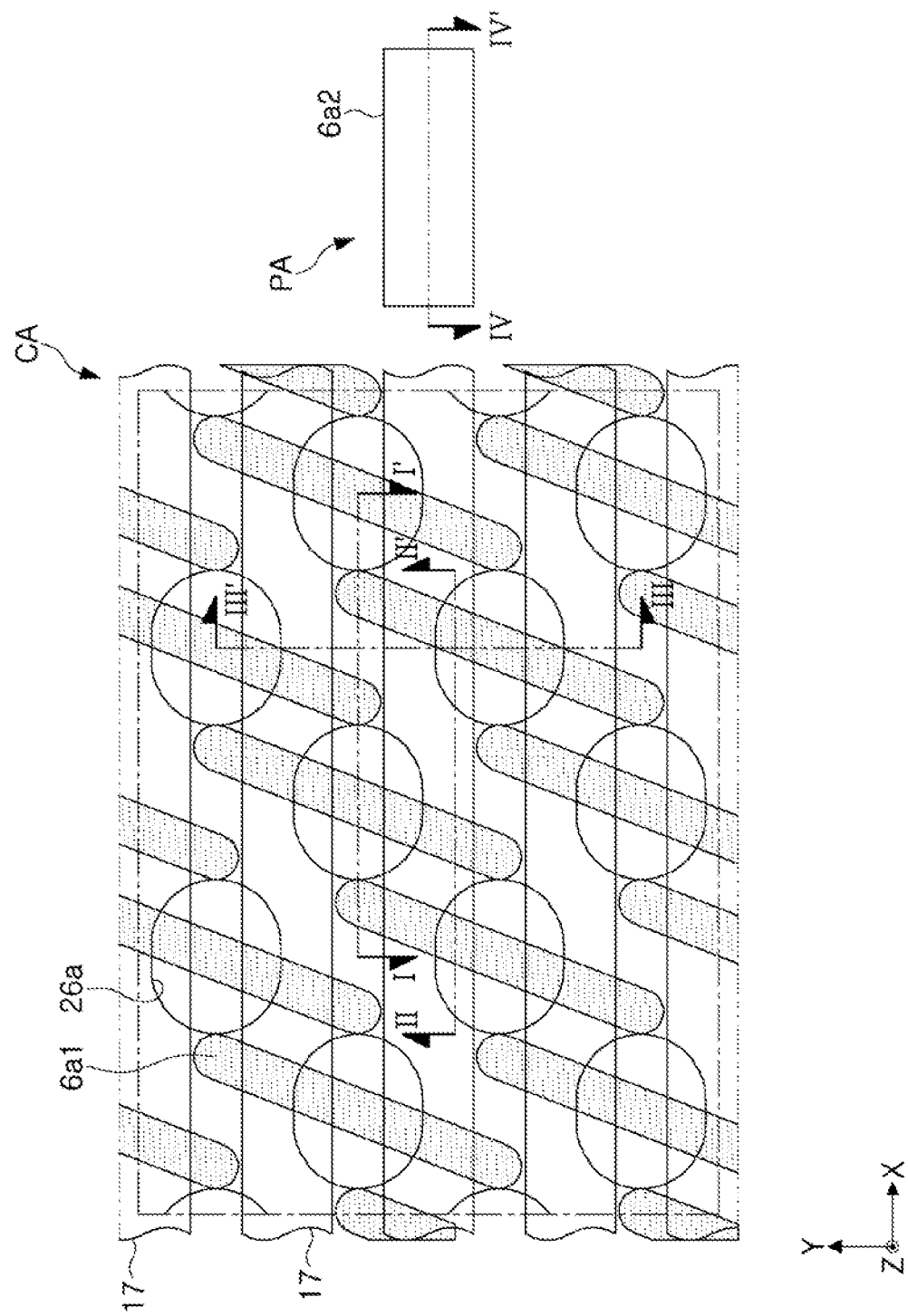
FIGS. 4 to 30B are diagrams that illustrate an example of a method of manufacturing a semiconductor device according to an example embodiment of the present disclosure.
Figure 5A:
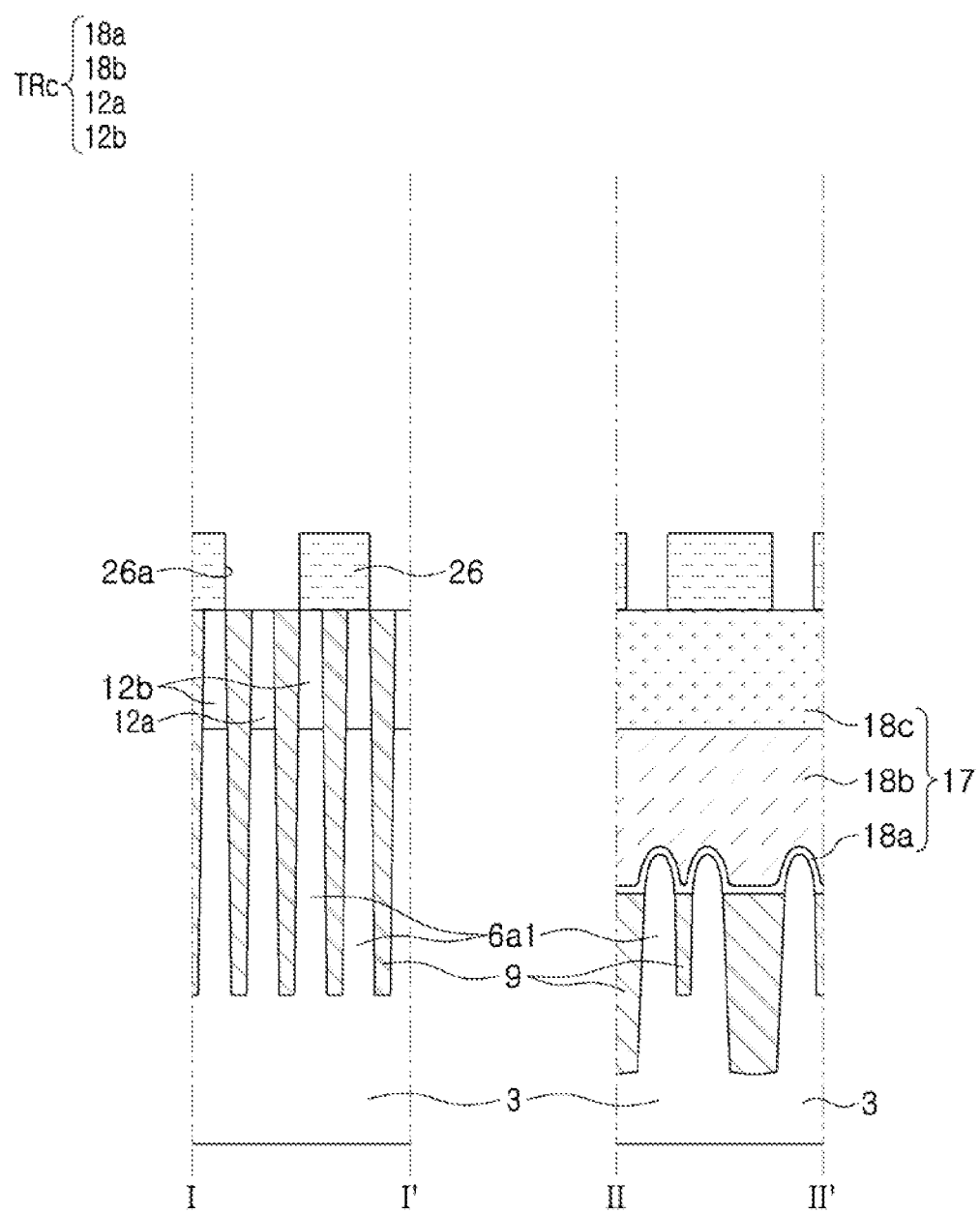
Figure 5B:
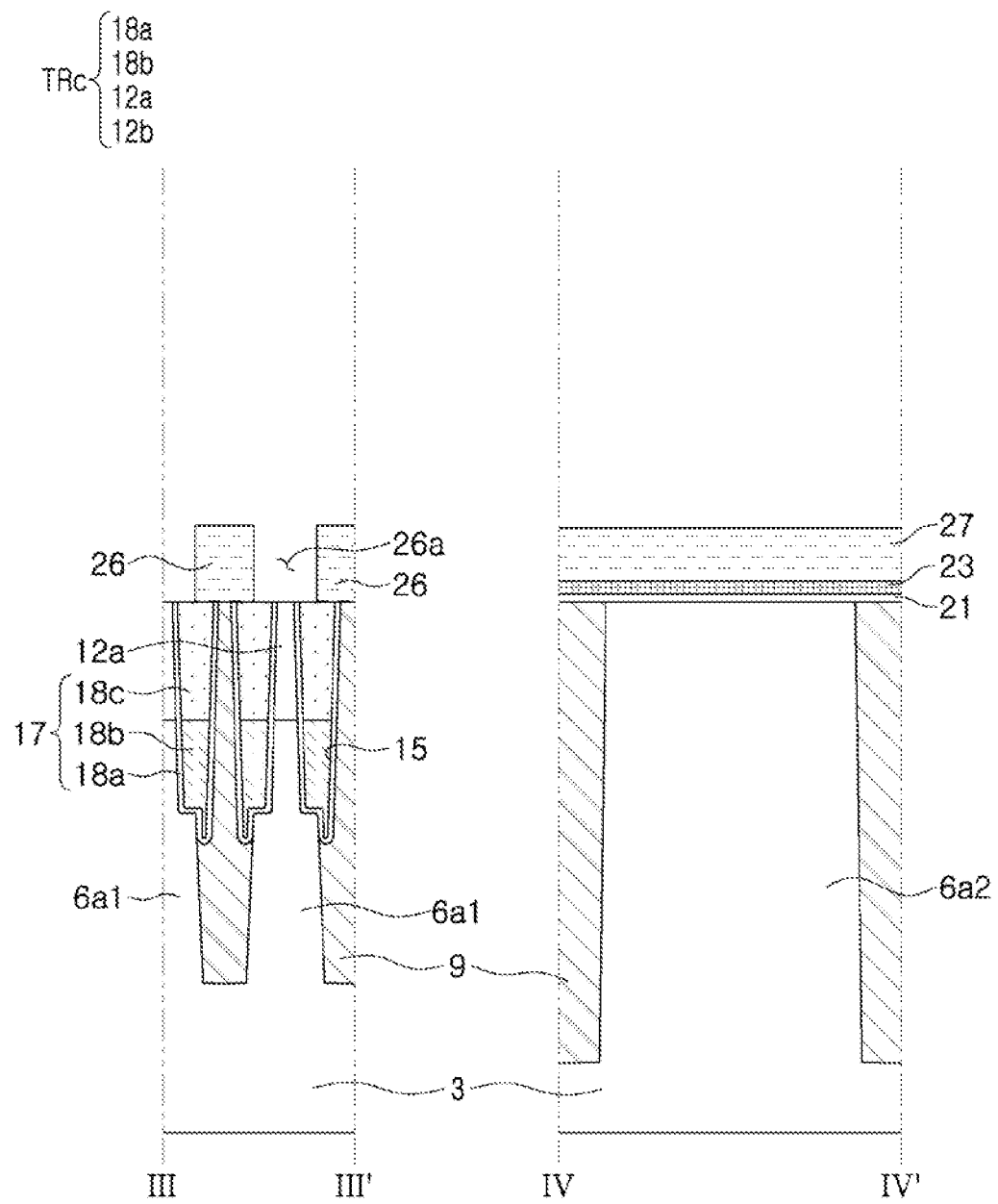

Referring to FIGS. 4, 5A, and 5B, an isolation region 9 defining the cell active regions 6a1 and the peripheral active regions 6a2 may be formed on the substrate 3. The substrate 3 may be a semiconductor substrate. For example, the substrate 3 may be a single crystal silicon substrate. The cell and peripheral active regions 6a1 and 6a2 may protrude from the substrate 3 and may be formed of single crystal silicon.

The cell active regions 6a1 may be formed in the memory cell region CA, and the peripheral active regions 6a2 may be formed in the peripheral region PA.

The isolation region 9 may be formed by a shallow trench isolation process. The isolation region 9 may be formed of an insulating material such as silicon oxide and/or silicon nitride. The isolation region 9 may be formed to have a first depth in a narrow region, and may be formed to have a second depth greater than the first depth in a wide region. Accordingly, the isolation region 9 may have lower surfaces disposed on different levels along a plane parallel to the substrate, such as an X-Y plane.

Cell transistors TRc may be formed on the substrate 3 in the memory cell region CA. The forming of the cell transistors TRc may include forming cell gate trenches 15 intersecting the cell active regions 6a1 and extending into the isolation region 9, and forming the cell gate structures 17 in the cell gate trench 15.

Each of the cell gate structures 17 may include a cell gate dielectric layer 18a which conformally covers an internal wall of the cell gate trench 15, a cell gate electrode 18b partially filling the cell gate trench 15 on the cell gate dielectric layer 18a, and a cell gate capping layer 18c filling the other portion of the cell gate trench 15 on the cell gate electrode 18b. The cell gate capping layer 18c may be formed of an insulating material, such as, for example, silicon nitride.

The forming of the transistors TRc may further include forming the first and second cell impurity regions 12a and 12b in the cell active regions 6a through an ion implantation process. The first and second cell impurity regions 12a and 12b may be cell sources/drains.

In an example, the first and second cell impurity regions 12a and 12b may be formed by implanting impurities into the cell active regions 6a1 before the isolation region 9 is formed. In an example, the first and second cell impurity regions 12a and 12b may be formed after forming the isolation region 9 and before forming the cell gate trenches 15. In an example, the first and second cell impurity regions 12a and 12b may be formed after the cell gate structures 17 are formed. The cell active regions 6a1 may have P-type conductivity, and the first and second cell impurity regions 12a and 12b may have N-type conductivity.

As viewed from above (e.g., a plan view), the cell gate structures 17 may have a line shape extending in the first direction X, and each of the cell active regions 6a1 may have a line shape extending in a direction inclined with respect to the first direction X. For example, the line shape may extend along a horizontal X-Y plane, and may extend diagonally with respect to the first direction X. A pair of adjacent cell gate structures among the cell gate structures 17 may intersect one of the cell active regions 6a1.

In the diagram as viewed from above (e.g., in a plan view), with respect to one of the cell active regions 6a1, one of the first cell impurity regions 12a may be disposed in a central portion of the cell active region 6a1, and second cell impurity regions 12b may be disposed on both ends of the cell active region 6a1.

In addition to forming the cell mask 26 in the memory cell region CA, the peripheral protective masks 21, 23, and 27 may be formed in the peripheral region PA. The peripheral protective masks 21, 23, and 27 may include the peripheral gate dielectric layer 21, the first peripheral gate electrode layer 23, and the peripheral protective mask 27 stacked vertically.

In the memory cell region CA, the cell mask 26 may have openings 26a. The cell mask 26 may include at least two layers. The cell mask 26 may include silicon oxide or a silicon oxide-based first insulating material layer, and silicon nitride or a silicon nitride-based second insulating material layer.

Each of the openings 26a of the cell mask 26 may have a circular shape, and may expose central portions of the cell active regions 6a1. The openings 26a of the cell mask 26 may expose the first impurity regions 12a of the cell active regions 6a1.

Figure 6:
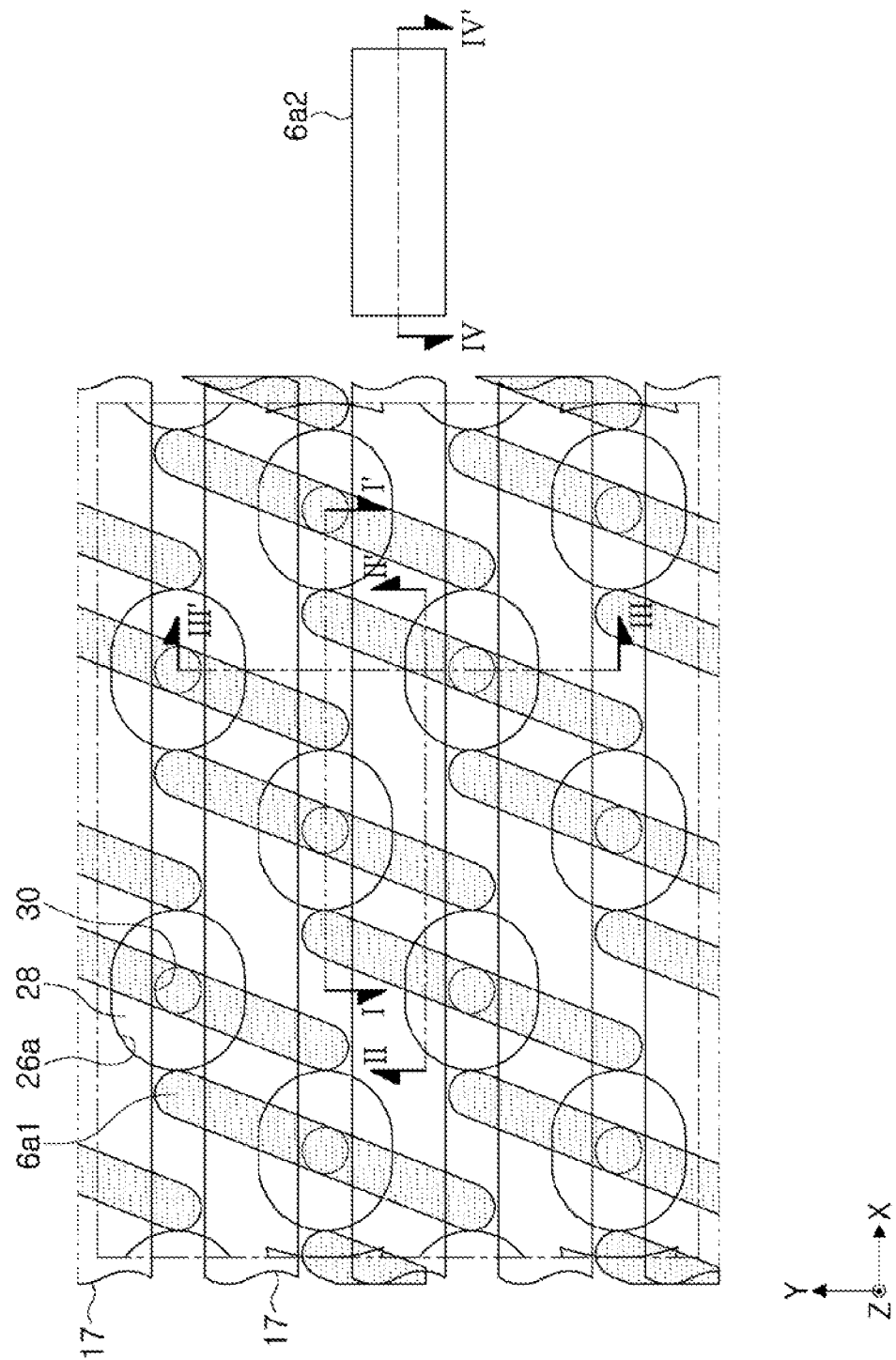
Figure 7A:
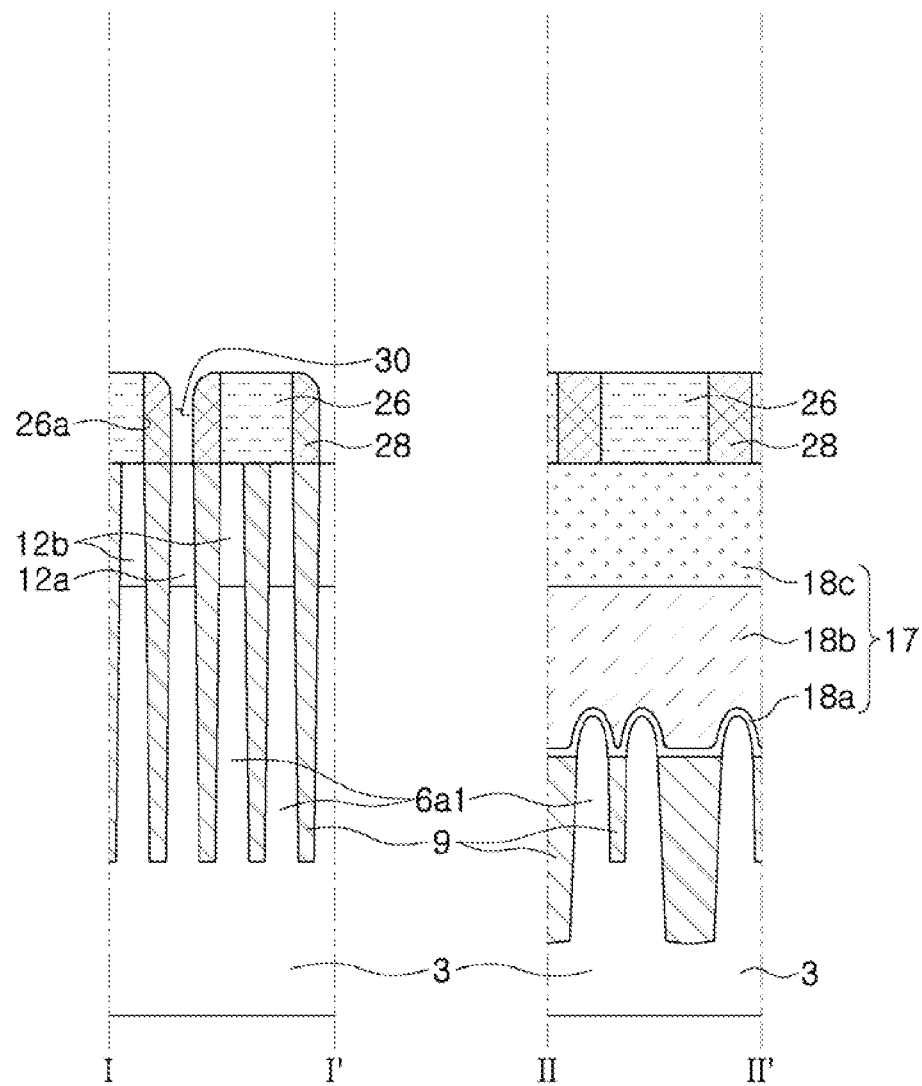
Figure 7B:
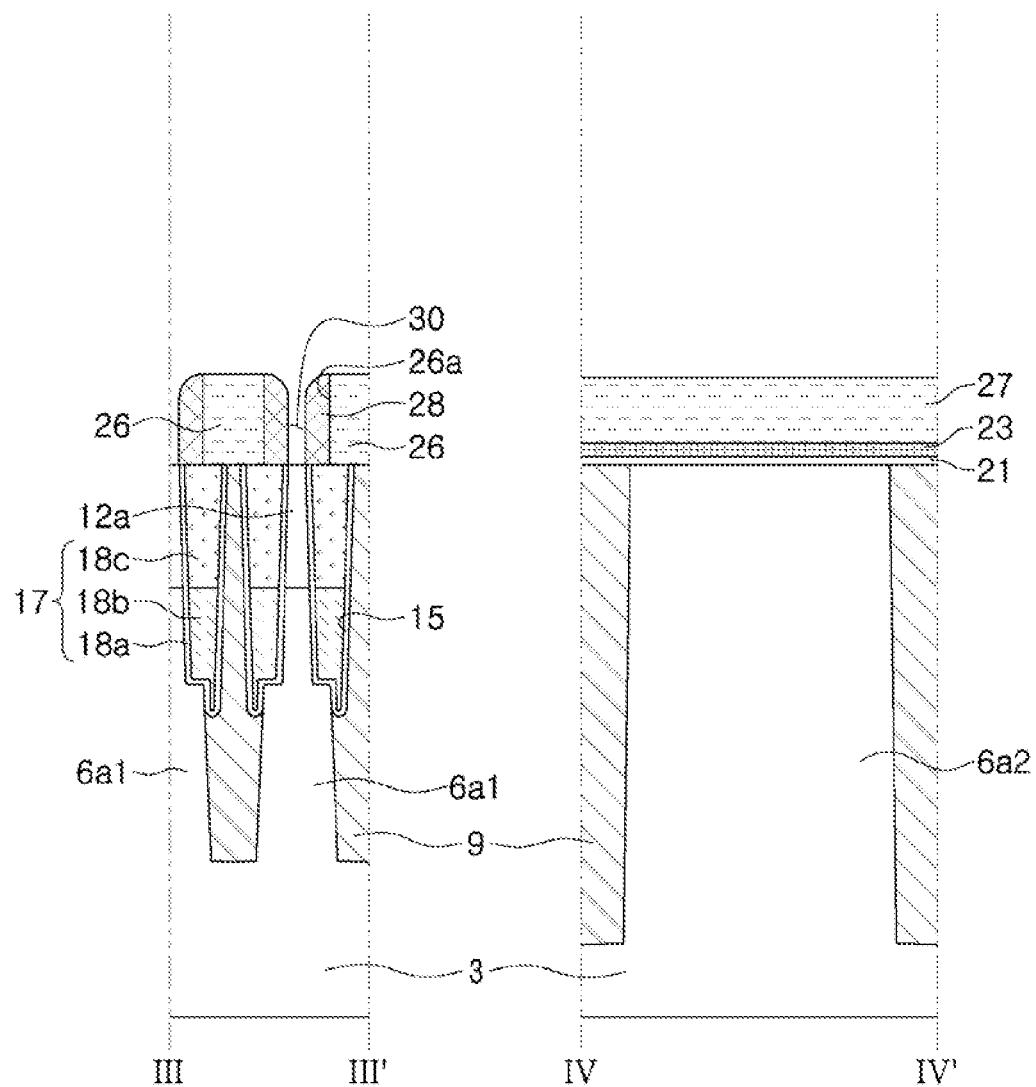

Referring to FIGS. 6, 7A and 7B, barrier spacers 28 covering sidewalls of the openings 26a may be formed, and openings 30 may be formed in the openings 26a. The openings 30 may expose the first impurity regions 12a1 of the cell active regions 6a1. The barrier spacers 28 may include silicon nitride or a nitride-based insulating material.

Figure 8:
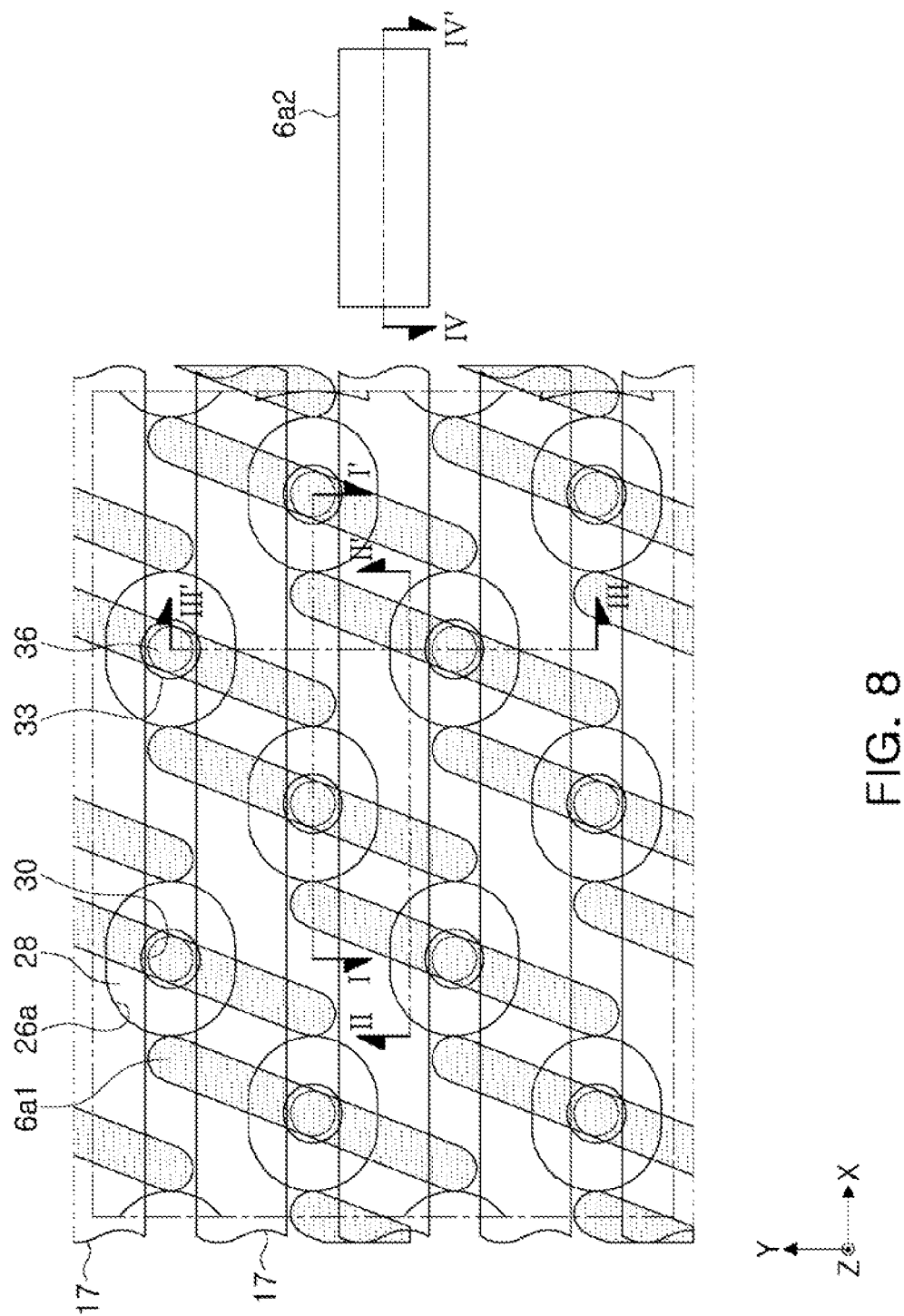
Figure 9A:
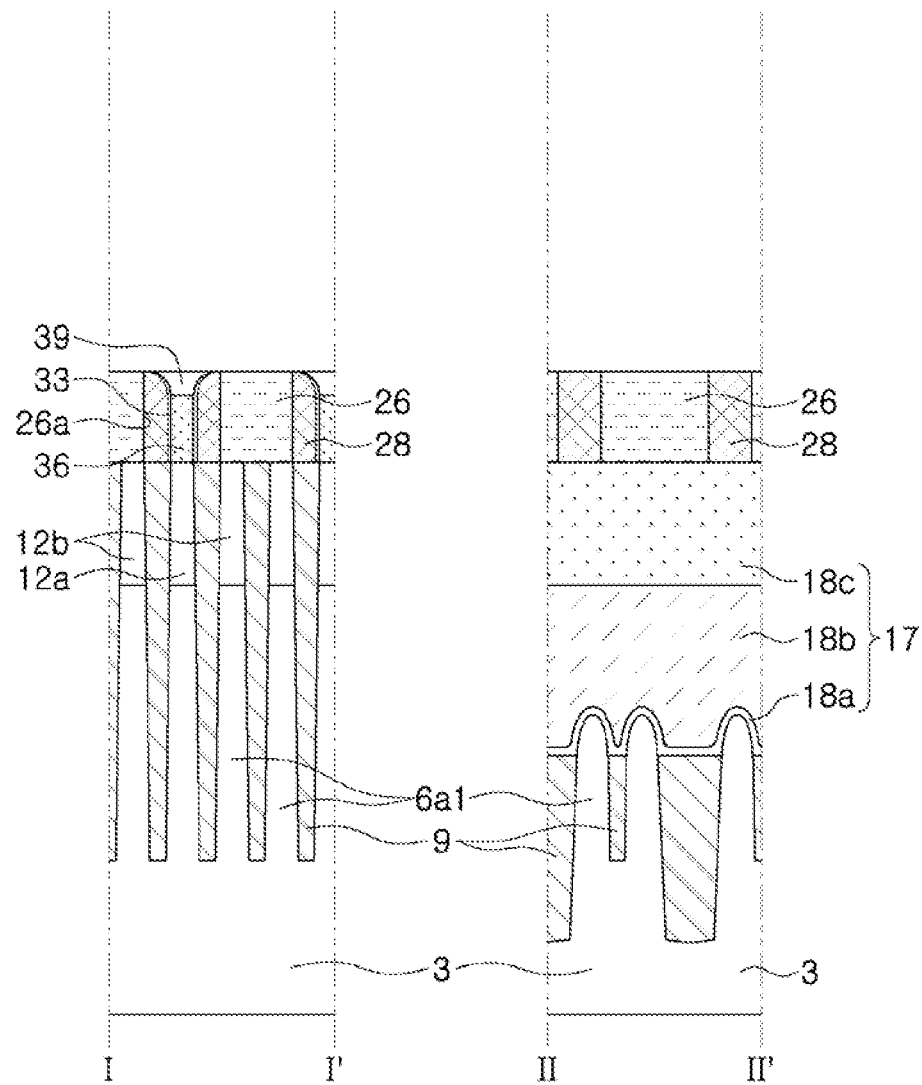
Figure 9B:
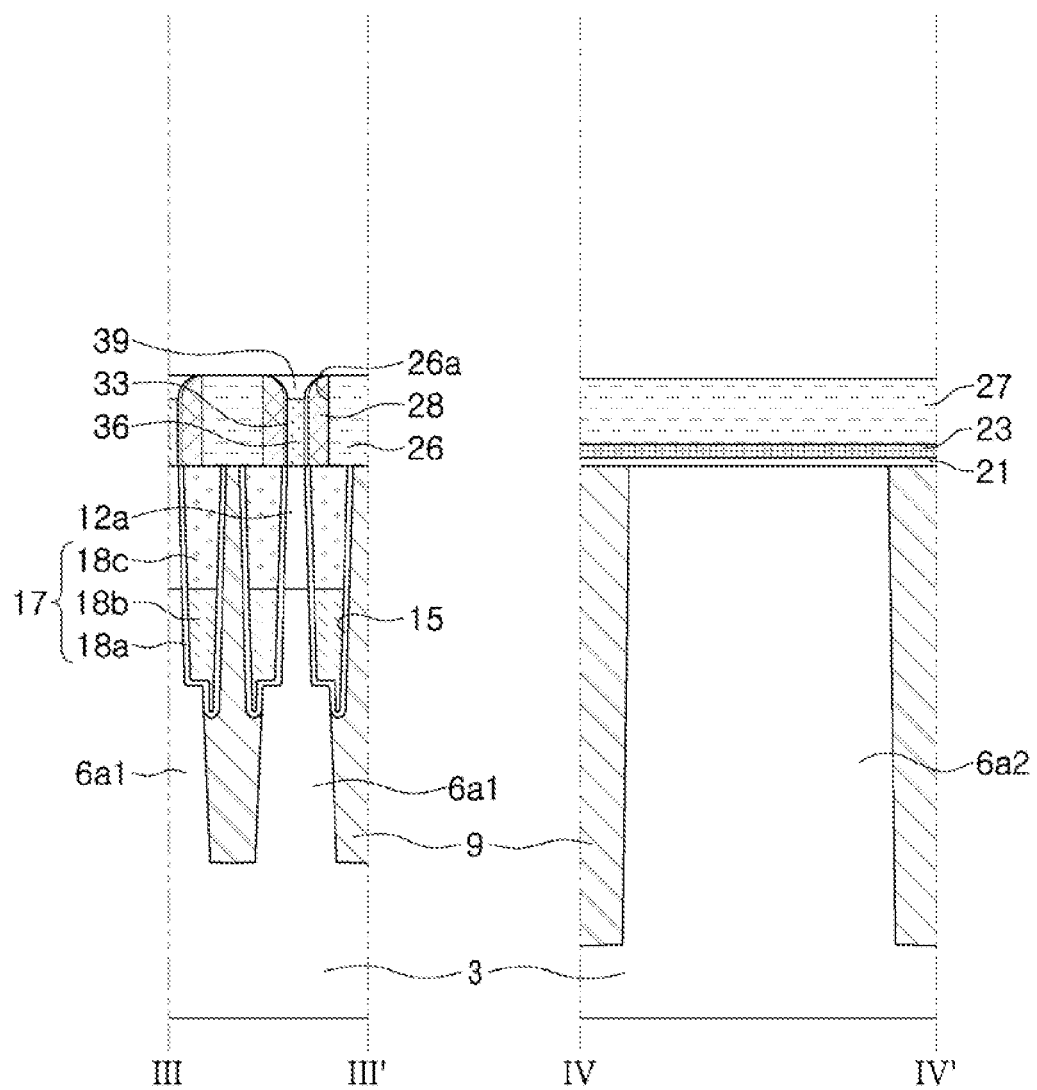

Referring to FIGS. 8, 9A, and 9B, buffer spacers 33 covering or at least partially covering sidewalls of each of the openings 30 may be formed. The buffer spacers 33 may include a material different from that of the barrier spacers 28. For example, the buffer spacers 33 may include silicon oxide or an oxide-based insulating material.

First pad patterns 36 partially filling the openings 30 in which the buffer spacers 33 are formed may be formed. The buffer spacers 33 may contact side surfaces of the first pad patterns 36. For example, the buffer spaces 33 may contact all lateral sides of the first pad patterns 36; this may be apparent in a plan view.

In an example, the first pad patterns 36 may be formed as an epitaxial material layer which has been epitaxially grown from the first impurity regions 12a1 by performing an epitaxial process. For example, the first pad patterns 36 may be epitaxially grown and may be formed as an epitaxial silicon layer doped with N-type conductivity.

In an example, the first pad patterns 36 may be formed as a polysilicon layer having N-type conductivity, formed using a deposition process. In an example, the first pad patterns 36 may be formed as a conductive material layer including a metal-semiconductor compound layer and a metal layer formed by a silicide process and a metal deposition process. Sacrificial capping layers 39 that fill the other portions of the openings 30 may be formed on the first pad patterns 36.

Figure 10A:
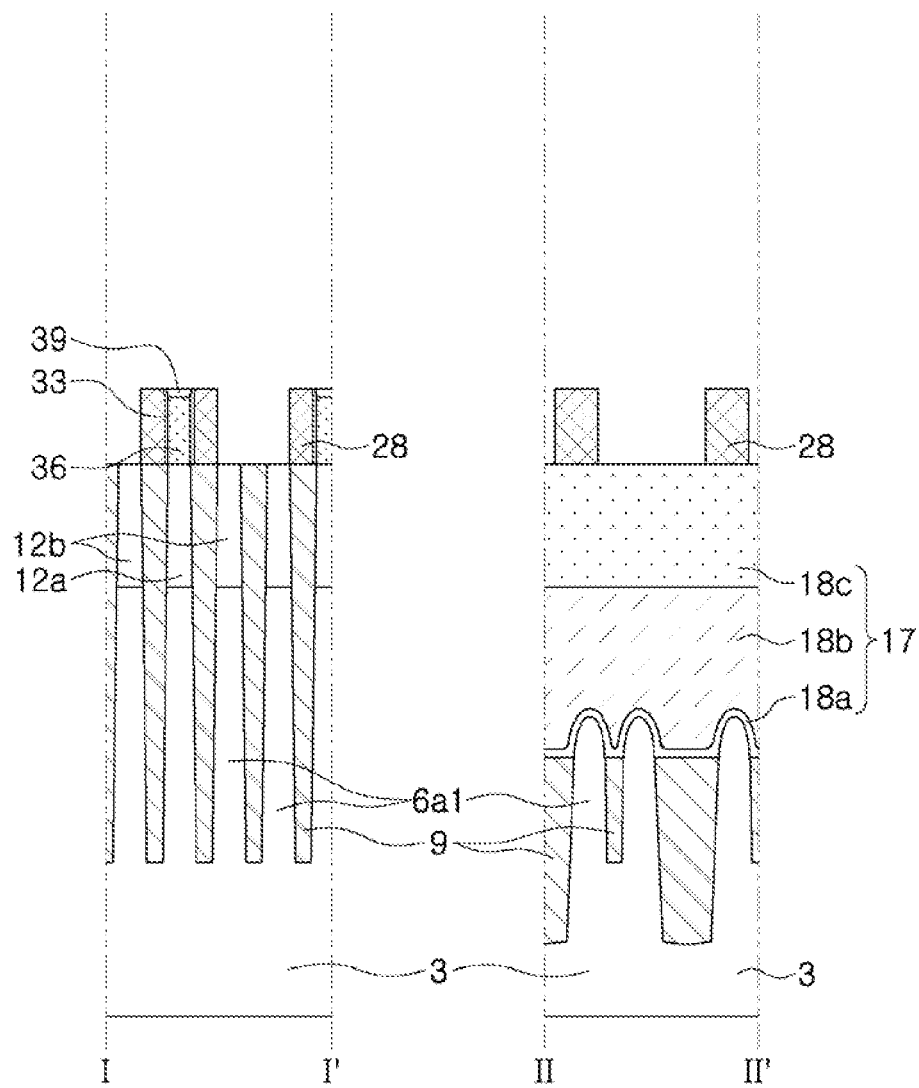
Figure 10B:
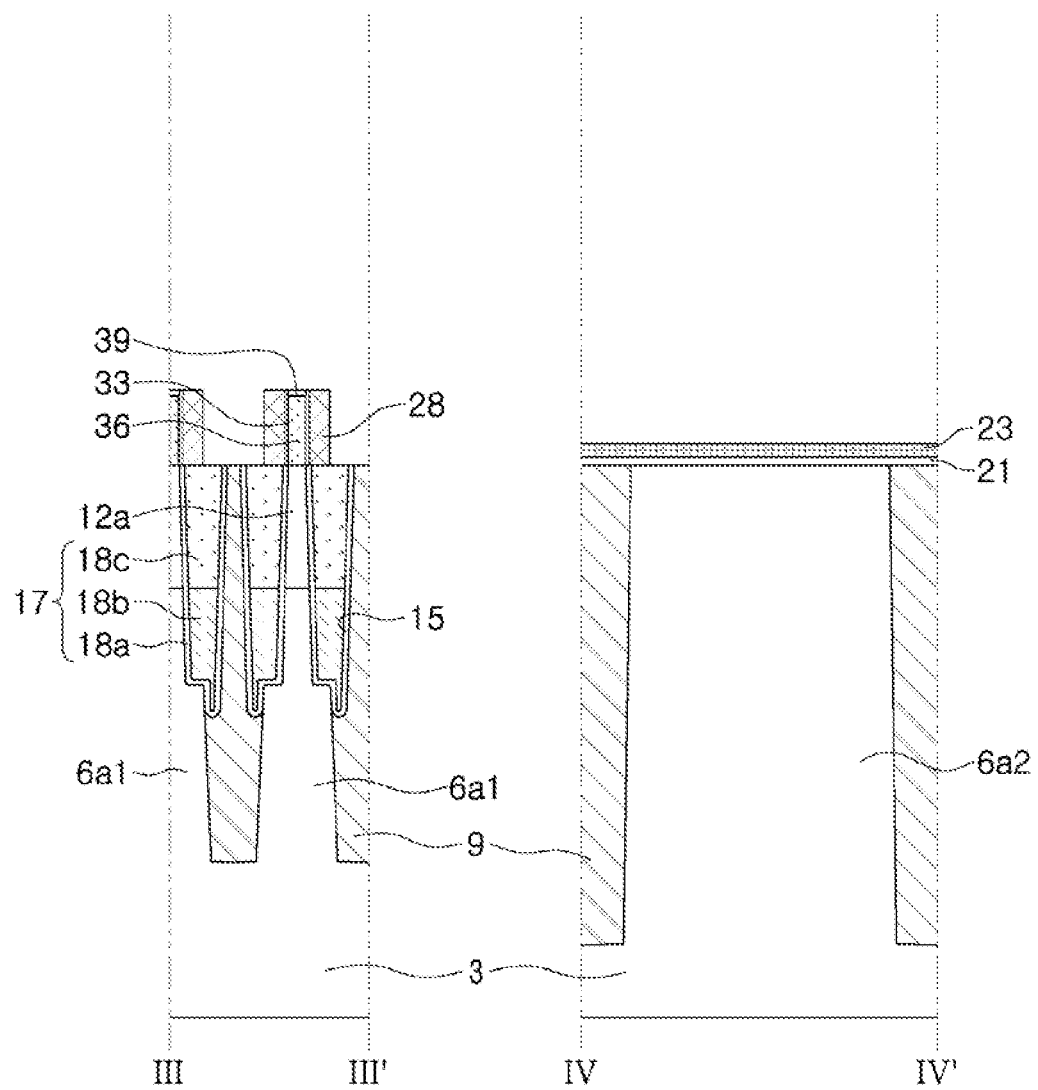

Referring to FIGS. 8, 10A, and 10B, the cell mask 26 and the peripheral protective mask 27 may be removed by an etching process. While the cell mask 26 and the peripheral protective mask 27 are removed, the thickness of the sacrificial capping layers 39 may be reduced. By removing the peripheral protective mask 27, the first peripheral gate electrode layer 23 may be exposed. By removing the cell mask 26, external side surfaces of the barrier spacers 28 may be exposed. Each of the barrier spacers 28 may have a ring-shape.

Figure 11:
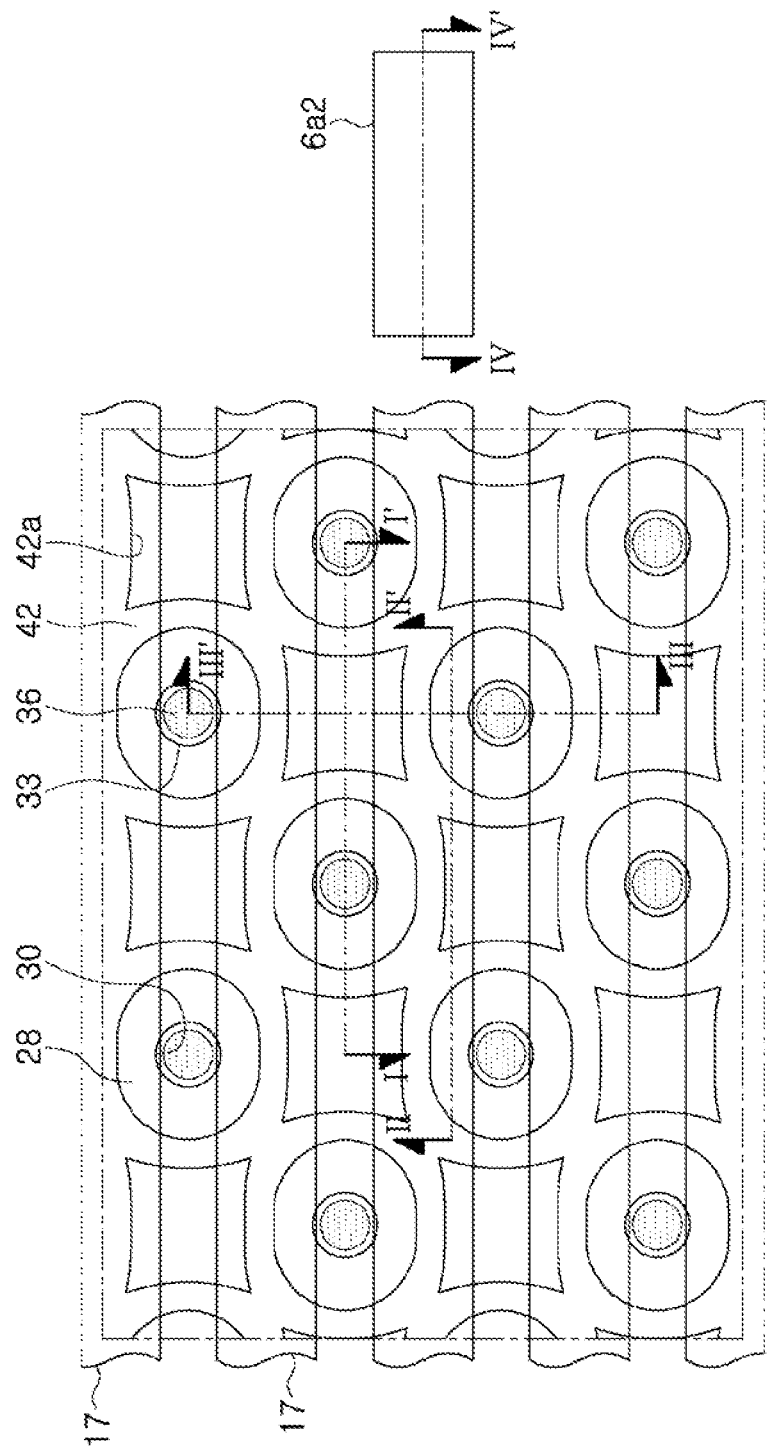
Figure 12A:
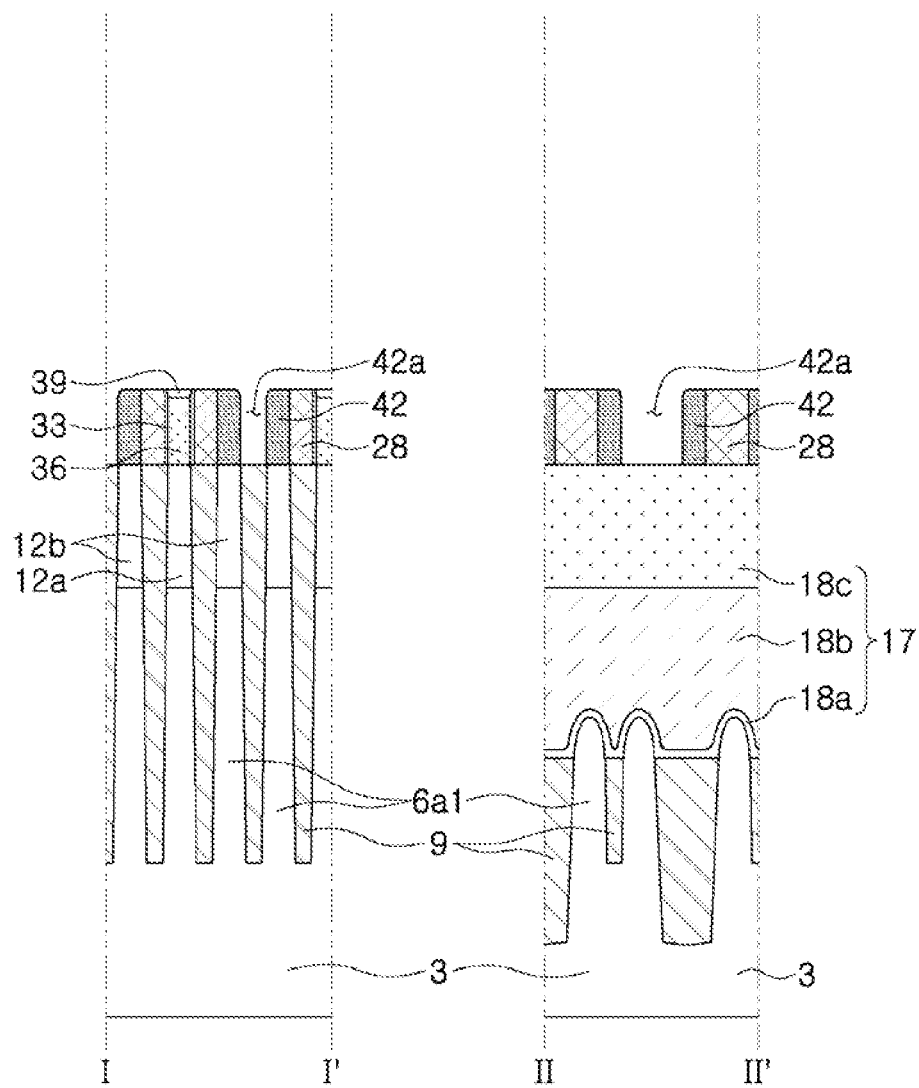
Figure 12B:
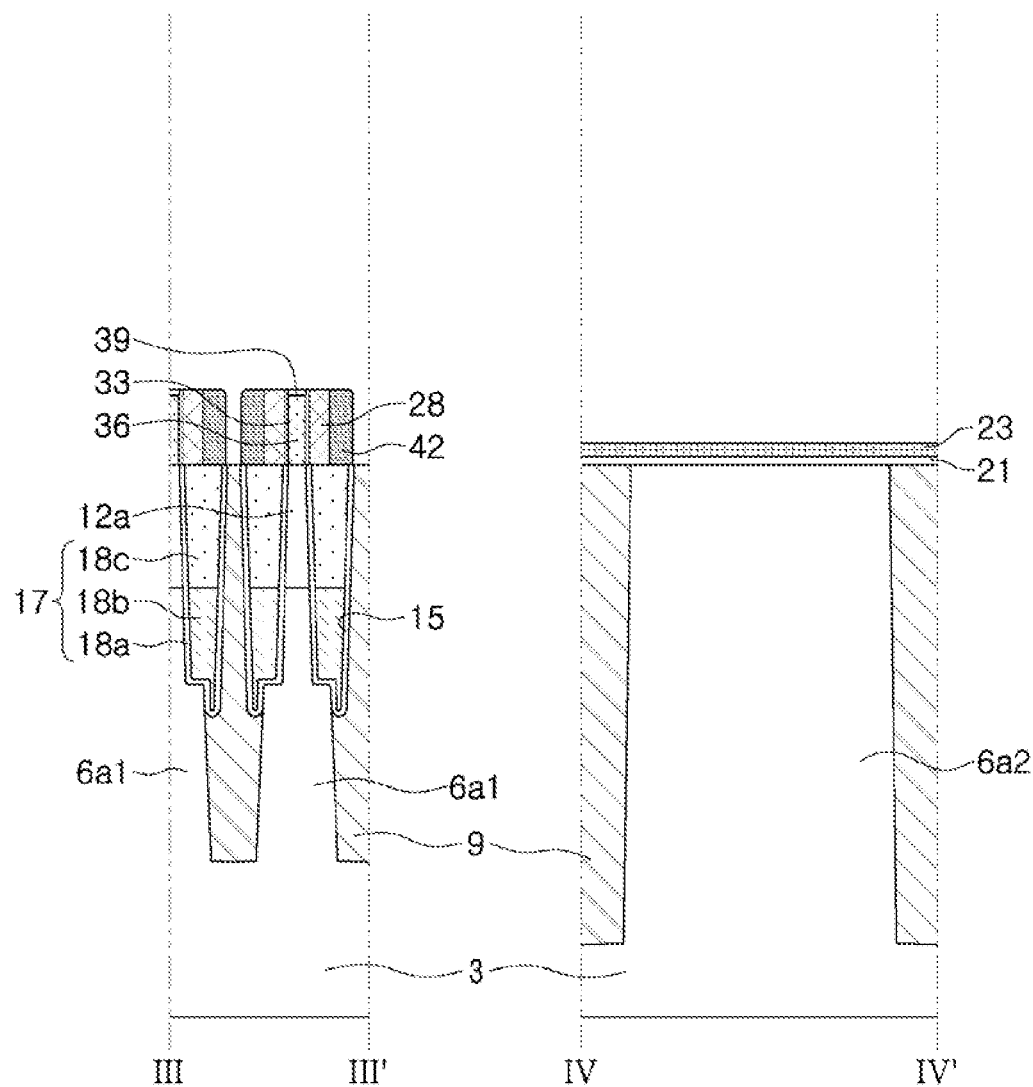

Referring to FIGS. 11, 12A, and 12B, insulating spacers 42 may be formed on external side surfaces of the barrier spacers 28. As the insulating spacers 42 are formed, an opening 42a may be formed in a central region between four barrier spacers among the barrier spacers 28. For example, openings 42a may be formed between adjacent barrier spacers 28.

Figure 13:
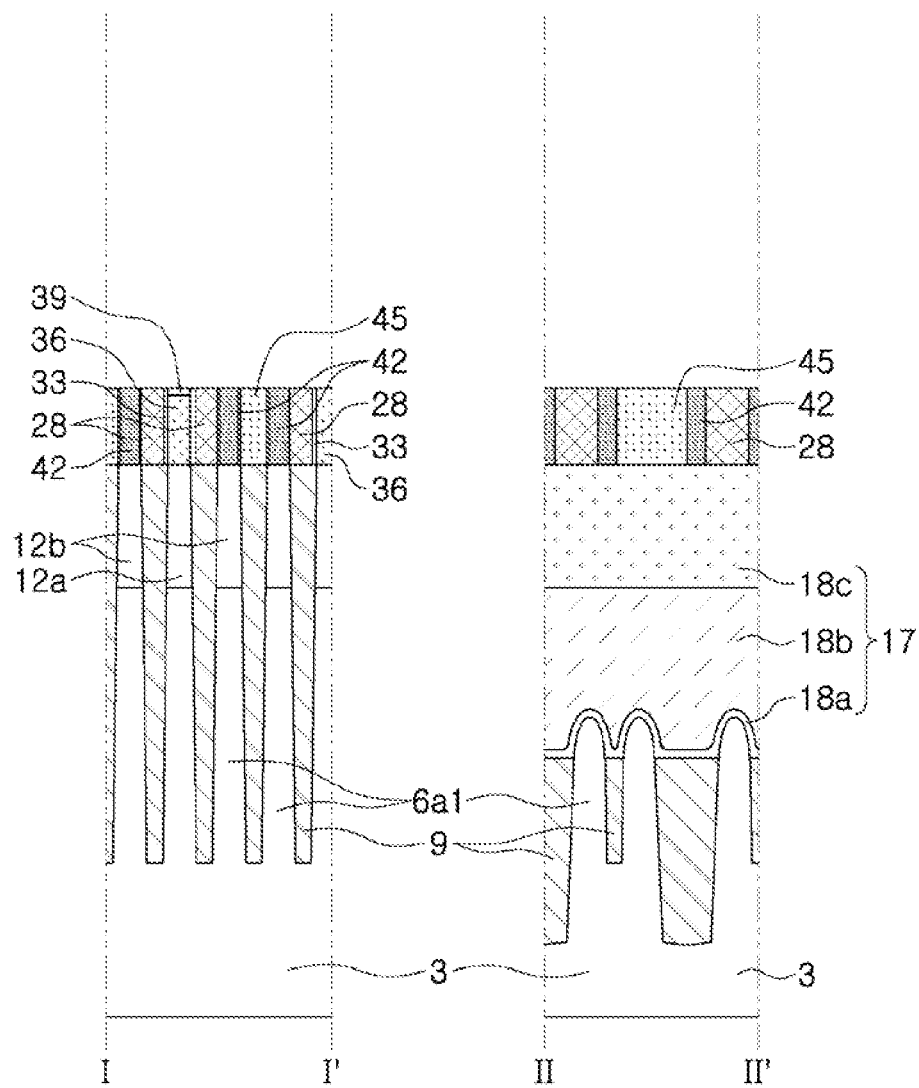
Figure 14:
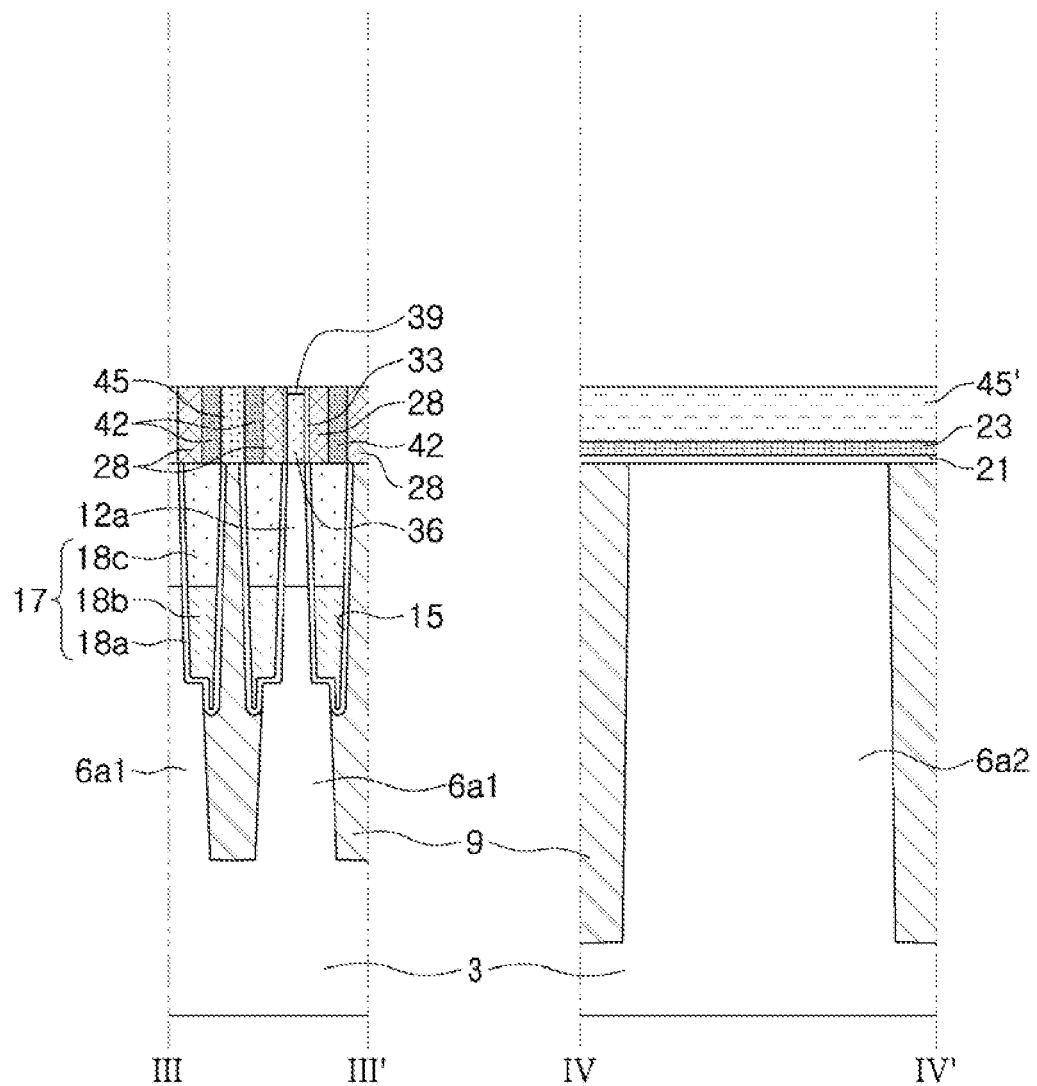

Referring to FIGS. 13 and 14, an insulating pattern 45 filling the opening 42a and a peripheral protective mask 45' covering or at least partially covering the first peripheral gate electrode layer 23 may be simultaneously formed. The insulating pattern 45 and the peripheral protective mask 45' may include silicon nitride or a nitride-based insulating material.

Figure 15:
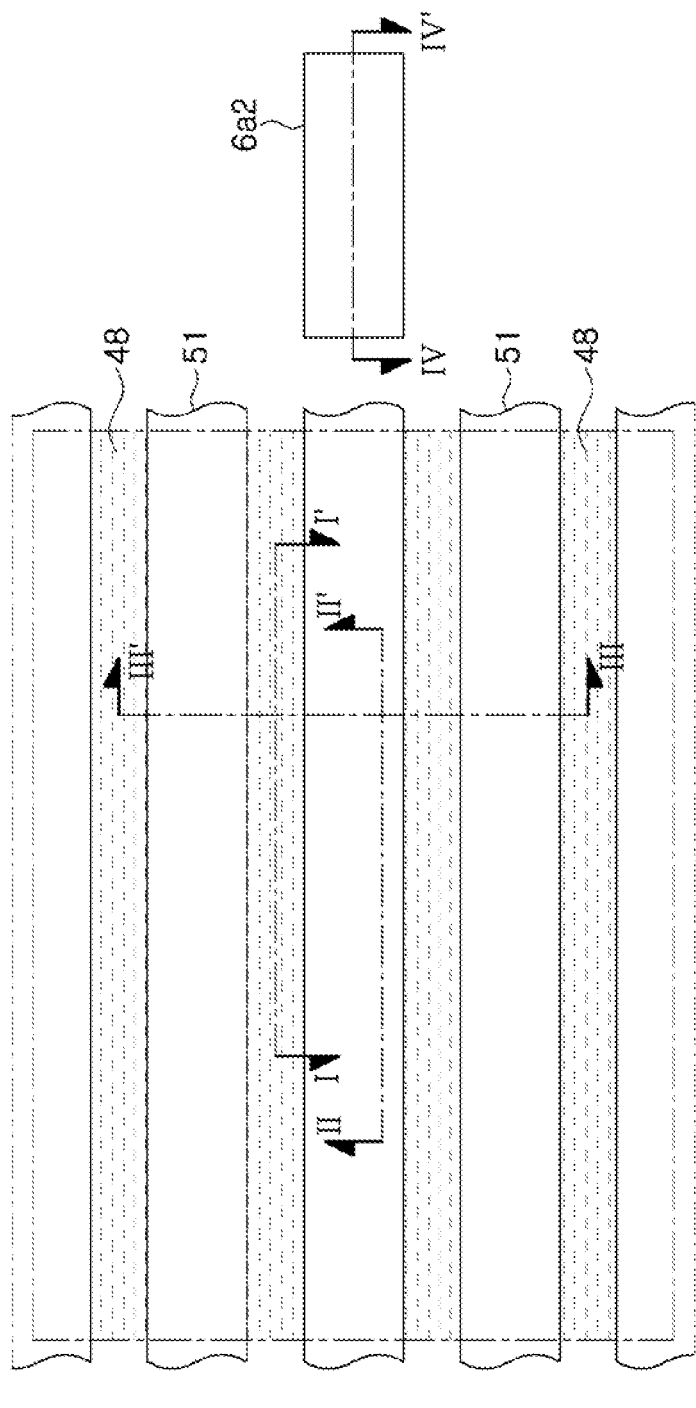
Figure 16A:
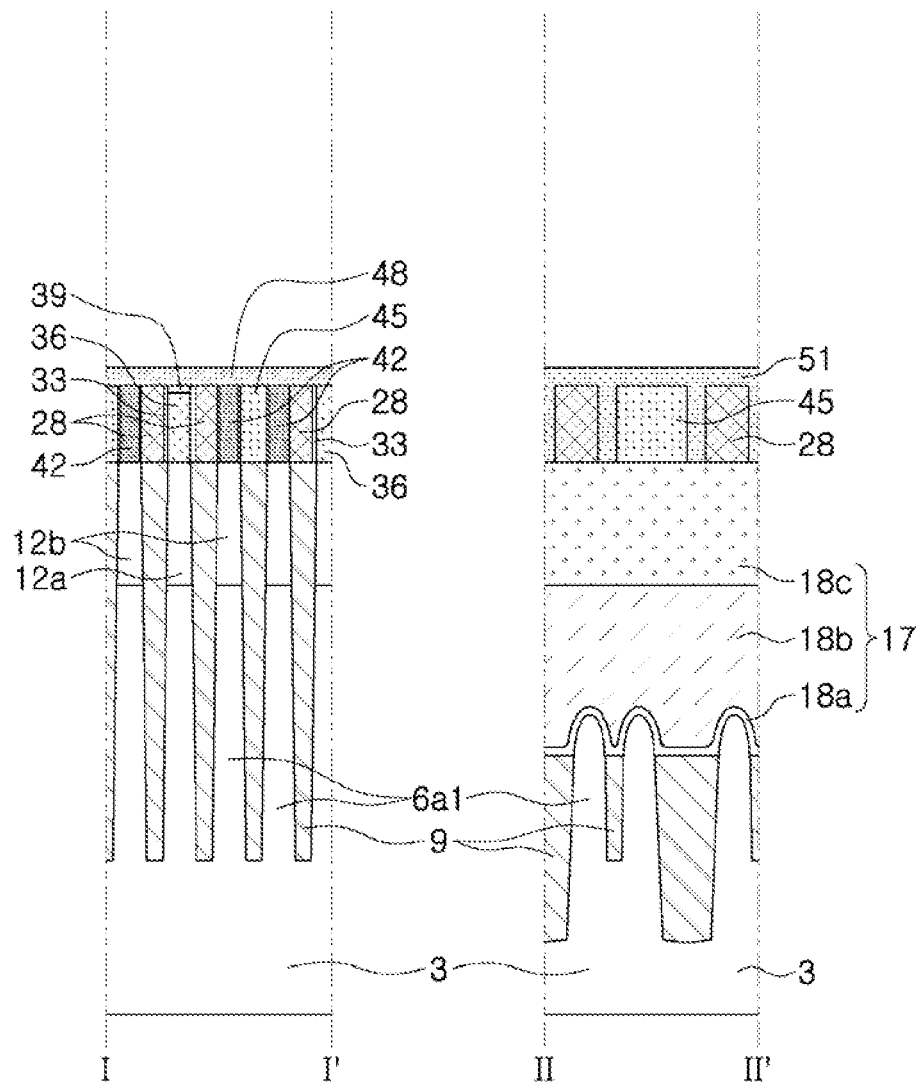
Figure 16B:
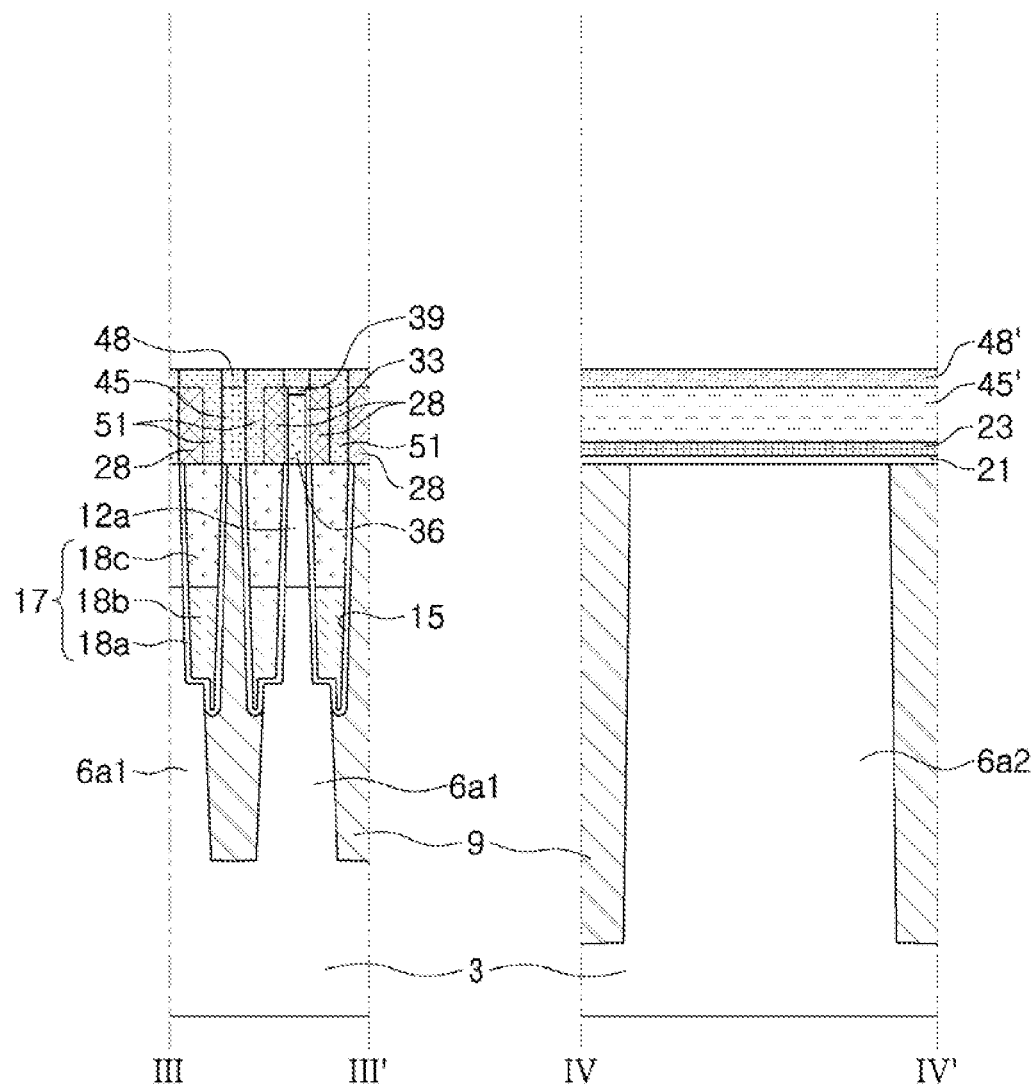

Referring to FIGS. 15, 16A, and 16B, the first mask lines 48 may be formed in the memory cell region CA, and simultaneously, a peripheral protective mask 48' may be formed in the peripheral region PA. The first mask lines 48 may overlap the first pad patterns 36 and may have a line shape extending in the first direction X.

Openings may be formed by removing portions of the insulating spacers 42 that do not overlap the first mask lines 48. Second mask lines 51 filling the openings may be formed by removing portions of the insulating spacers 42, and may be interposed between the first mask lines 48. In the second mask lines 51, portions filling the openings formed by removing portions of the insulating spacers 42 may be referred to as insulating patterns 51.

The second mask lines 51 may be formed of a material different from that of the first mask lines 48. For example, the first mask lines 48 may be formed of silicon oxide, and the second mask lines 51 may be formed of silicon nitride.

Figure 17:
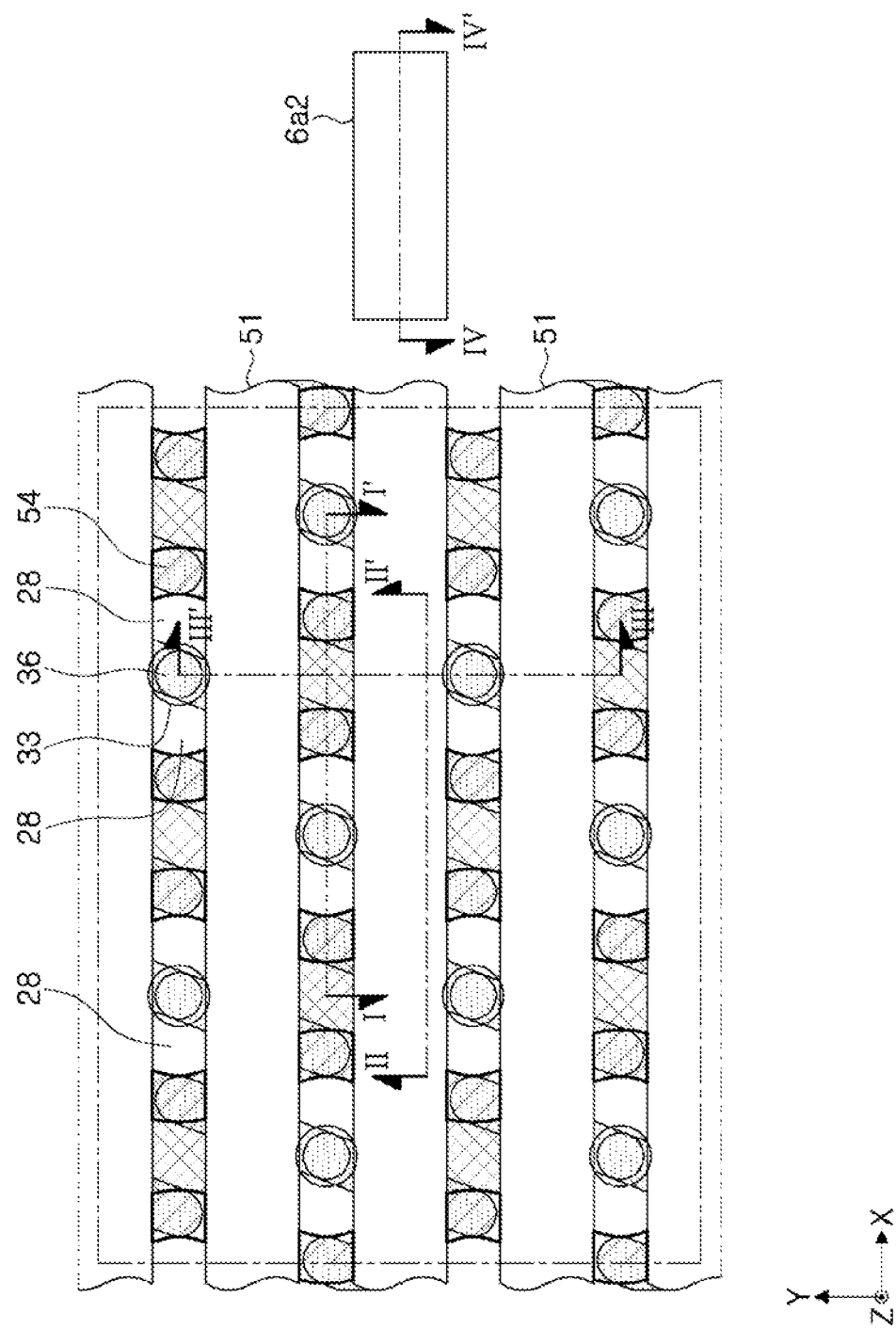
Figure 18A:
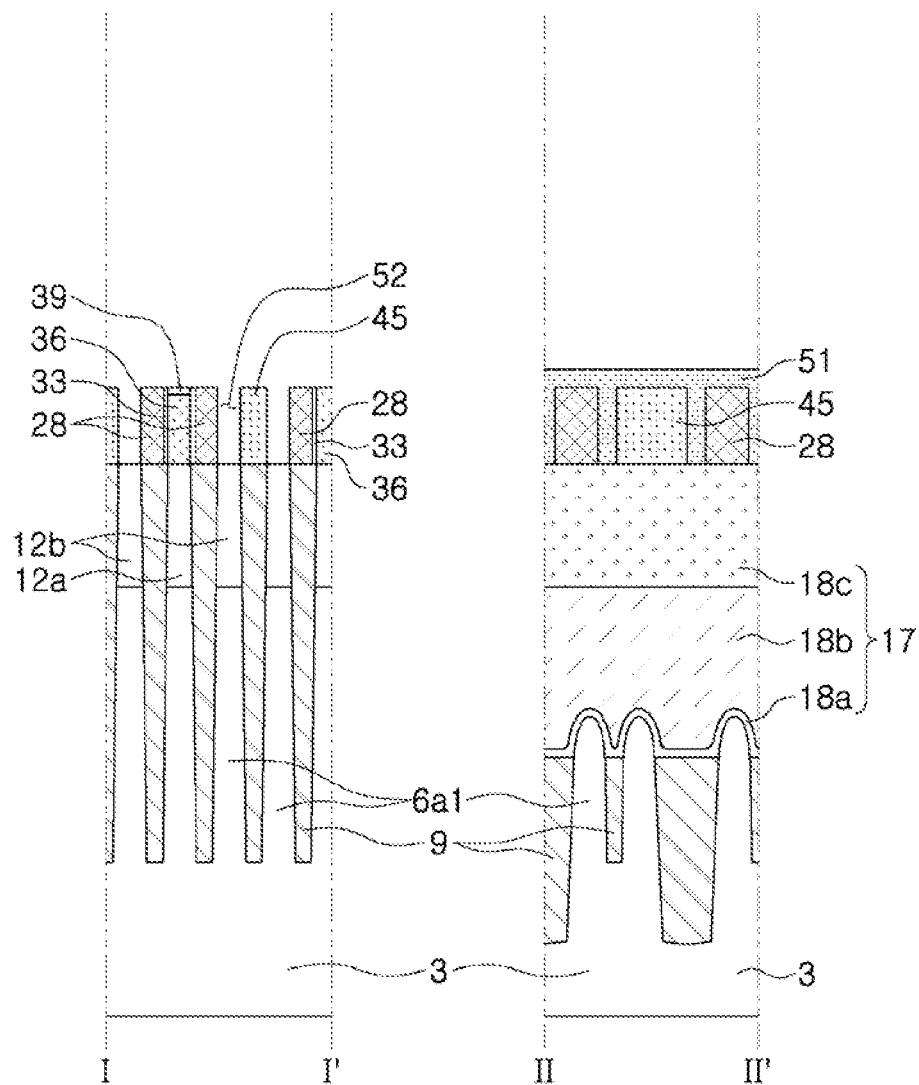
Figure 18B:
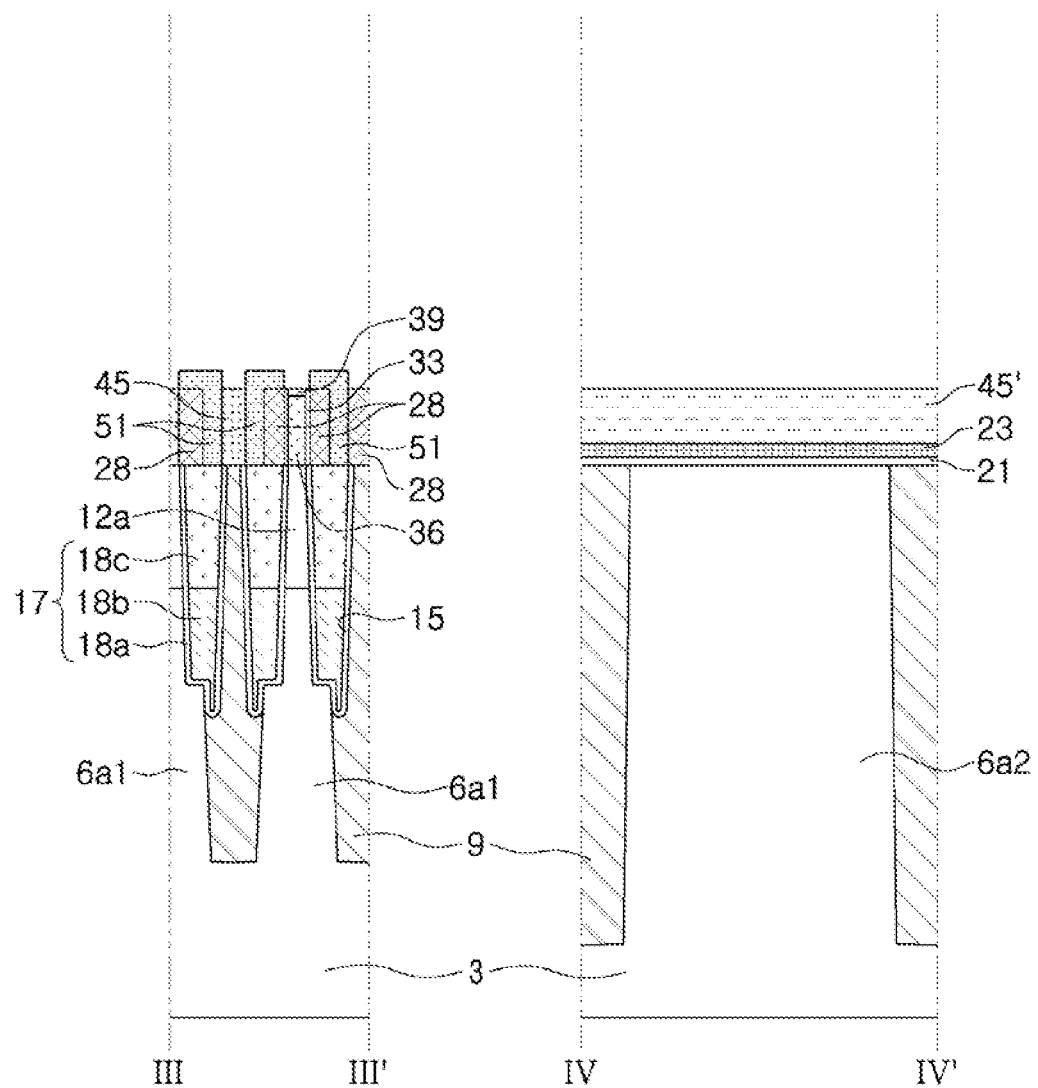

Referring to FIGS. 17, 18A, and 18B, the first mask lines 48 may be removed. The insulating spacers 42 exposed while the first mask lines 48 are removed may also be removed. Openings 52 may be formed while the insulating spacers 42 are removed. The openings 52 may expose the second impurity regions 12b.

Figure 19:
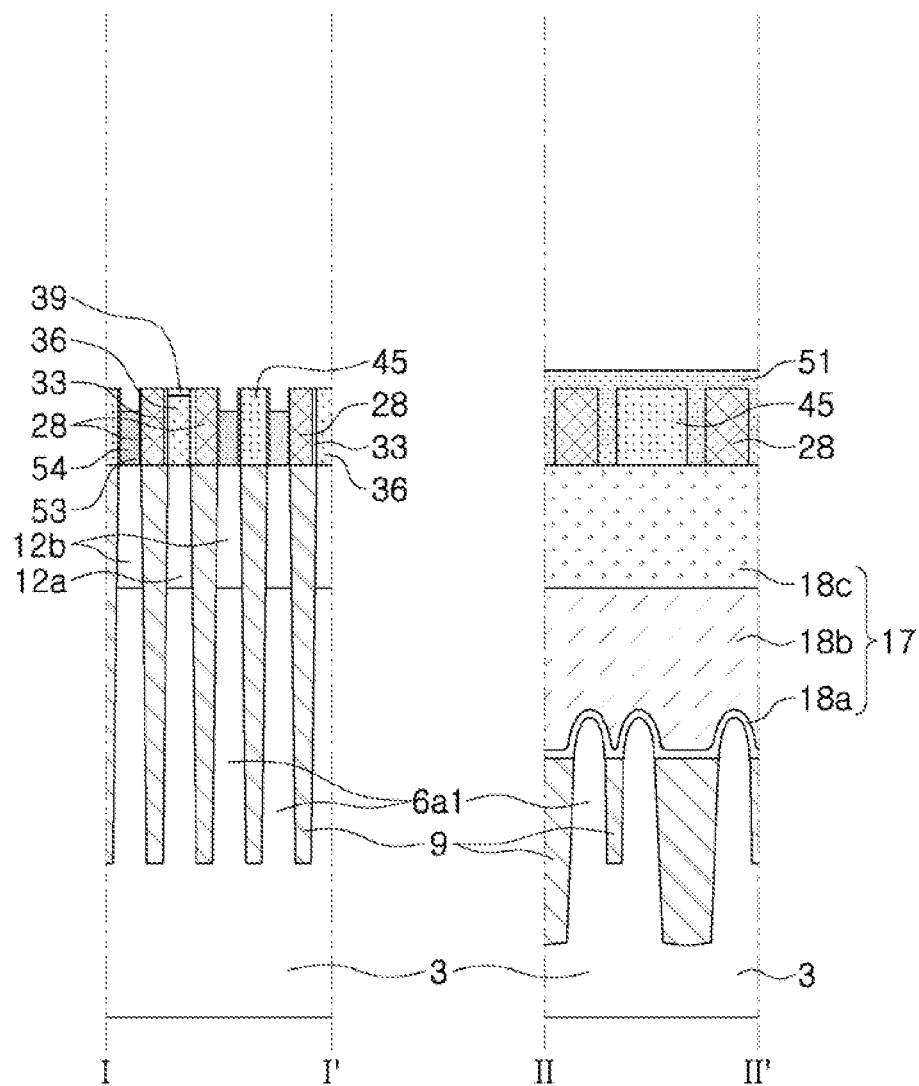

Referring to FIGS. 17 and 19, second buffer spacers 53 may be formed on sidewalls of the openings 52, and a second pad pattern 54 partially filling the openings 52 may be formed.

The second buffer spacers 53 may be formed of an insulating material such as silicon oxide. The second buffer spacers 53 may surround side surfaces of the second pad patterns 54 and may contact side surfaces of the second pad patterns 54. For example, the second buffer spaces 53 may contact all lateral sides of the second pad patterns 54, as apparent from a plan view.

Figure 20:
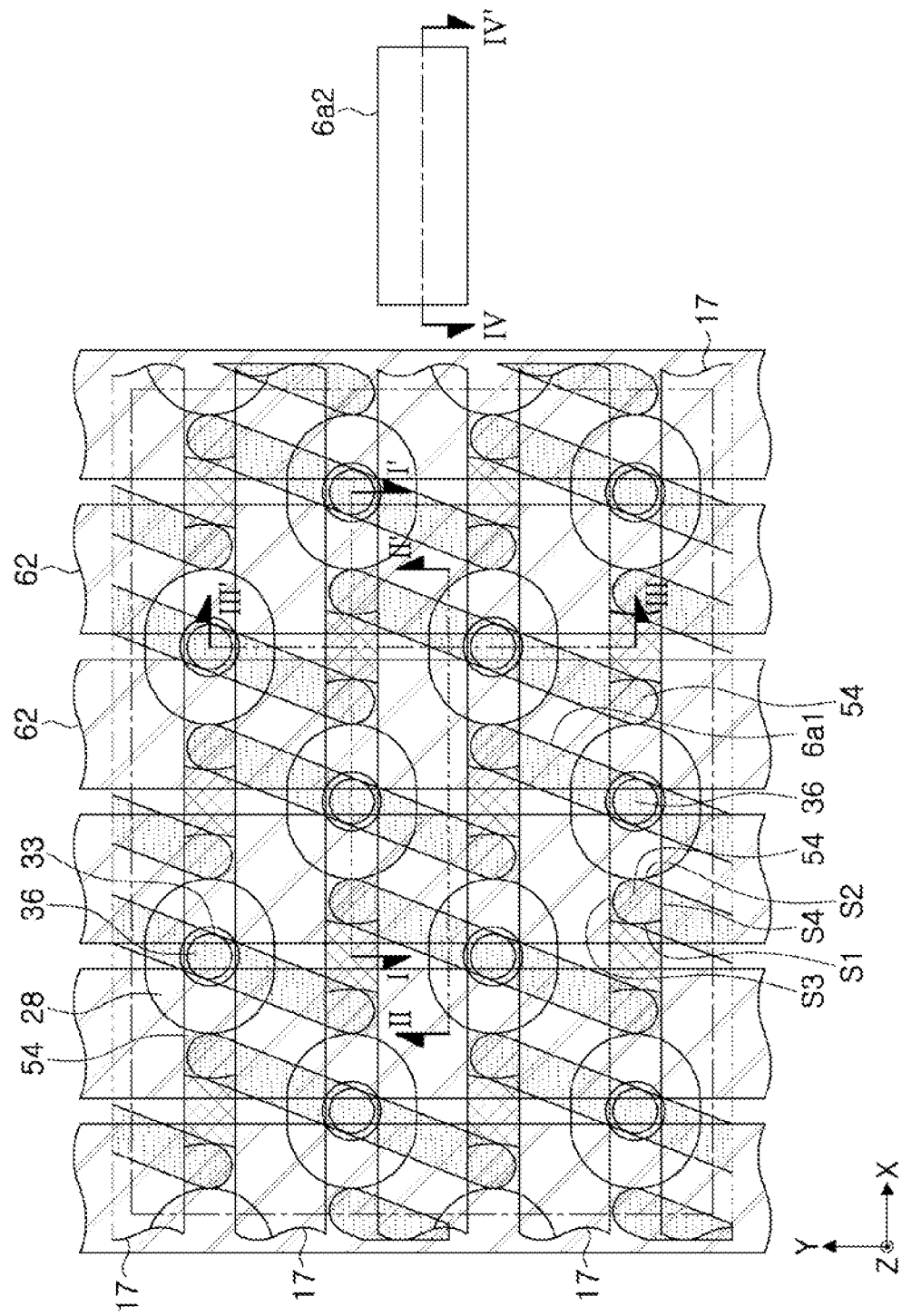
Figure 21A:
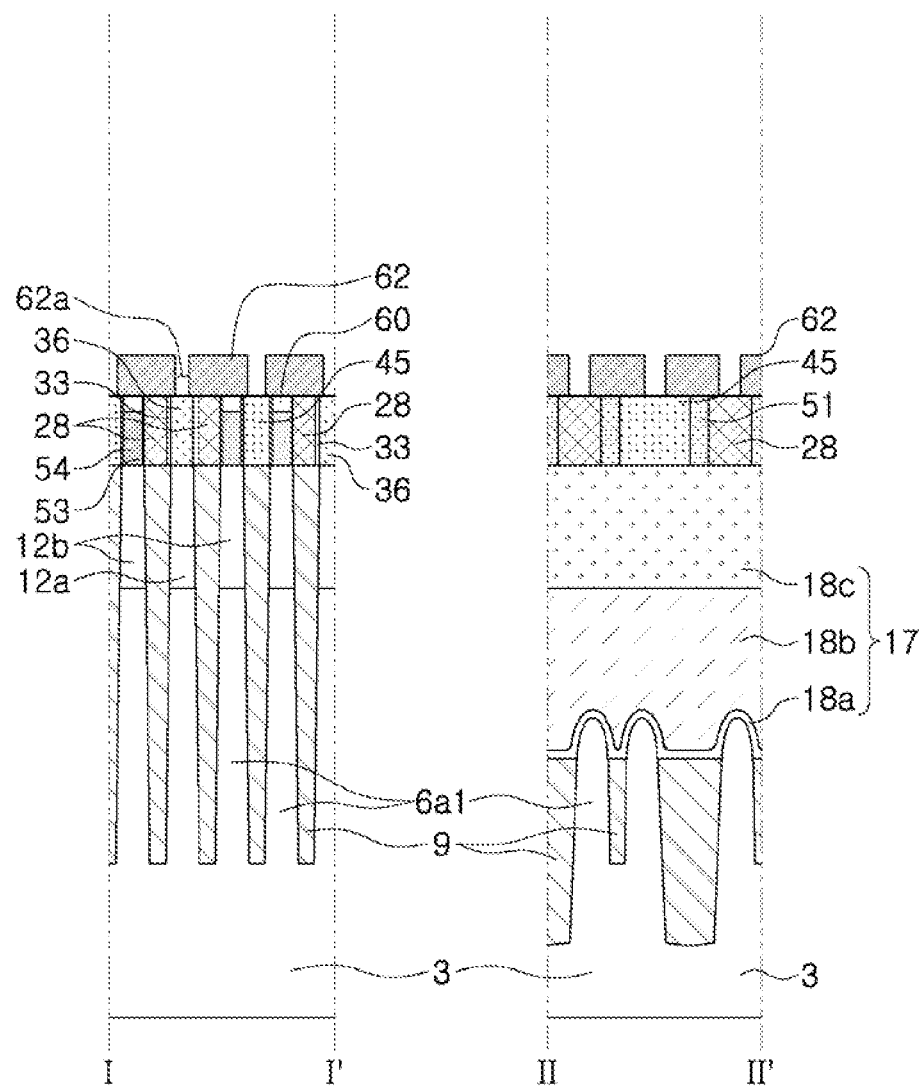
Figure 21B:
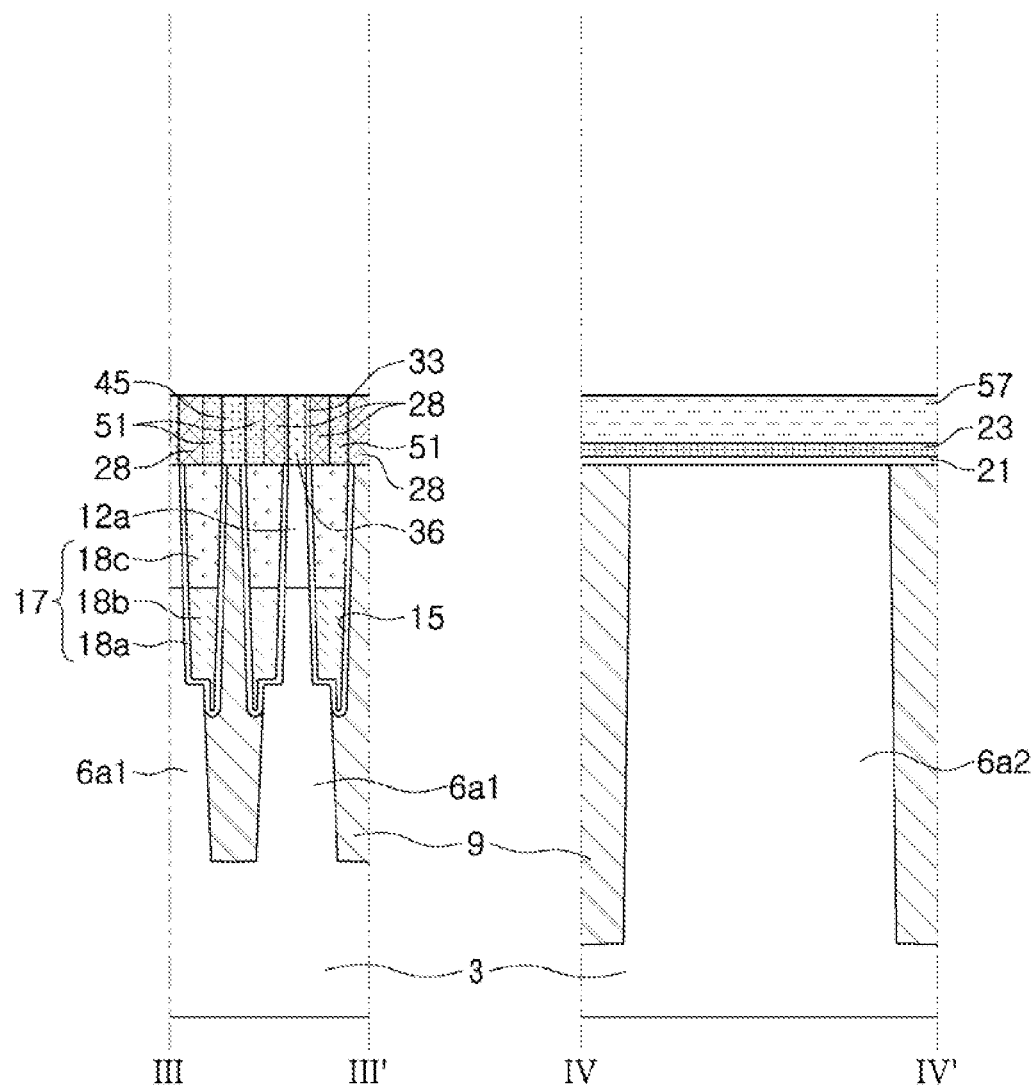

Referring to FIGS. 20, 21A, and 21B, capping layers 60 disposed on the second pad patterns 54 and filling the openings 52 may be formed. The capping layers 60 may be formed of an insulating material such as silicon oxide.

In the peripheral region PA, the peripheral protective mask 45' may be removed, and a second peripheral gate electrode layer 57 may be formed on the first peripheral gate electrode layer 23.

While the capping layers 60 and the second peripheral gate electrode layer 57 are formed, the sacrificial capping layers 39 may be removed, such that upper surfaces of the first pad patterns 36 may be exposed. The insulating patterns 51 may remain.

Mask lines 62 having openings 62a exposing the first pad patterns 36 may be formed in the memory cell region CA. The mask lines 62 may have a line shape extending in the second direction Y.

Figure 22:
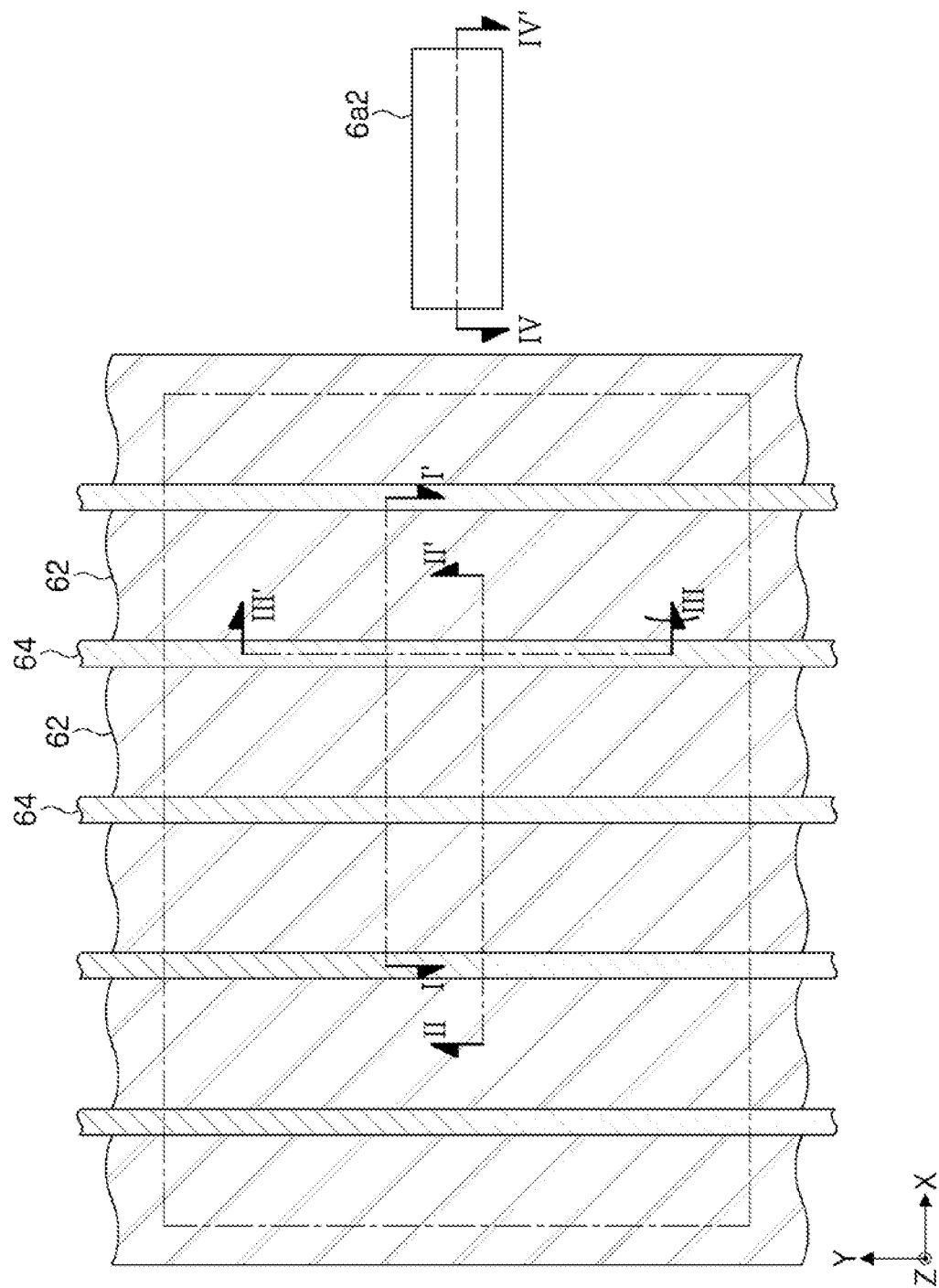
Figure 23A:
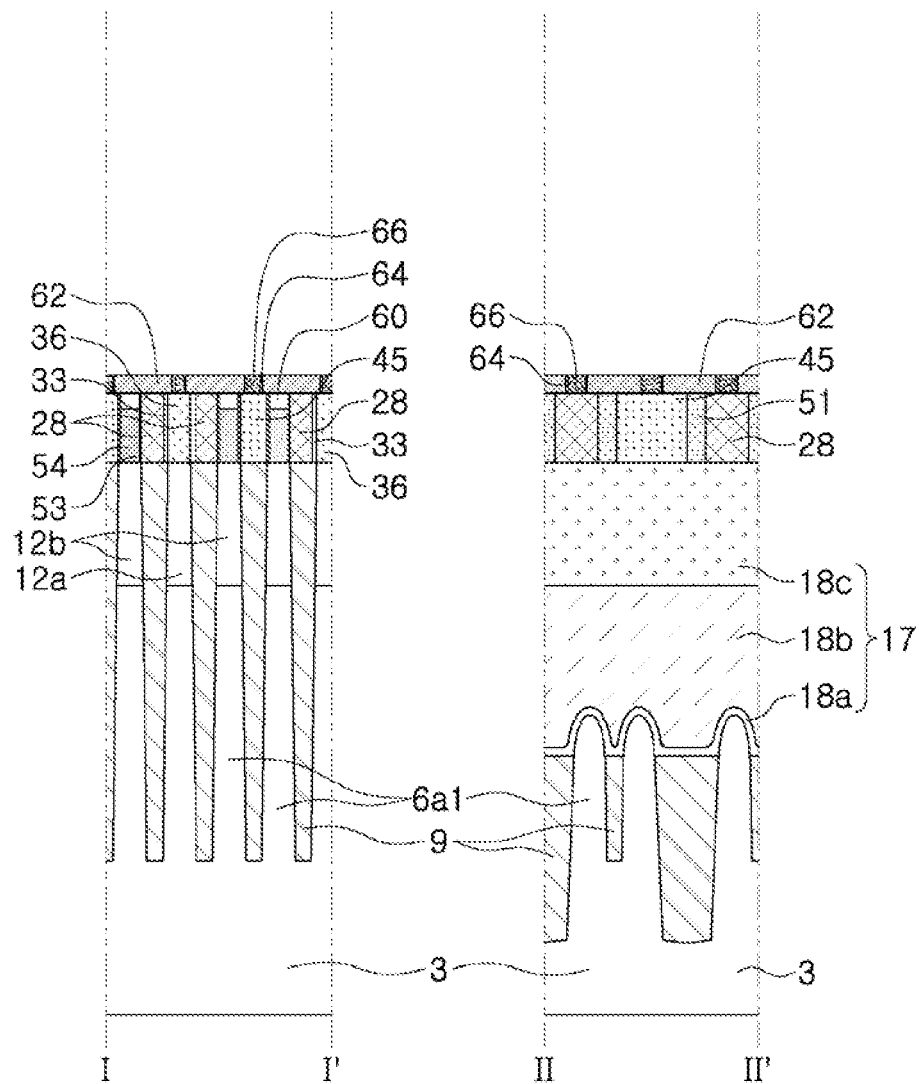
Figure 23B:
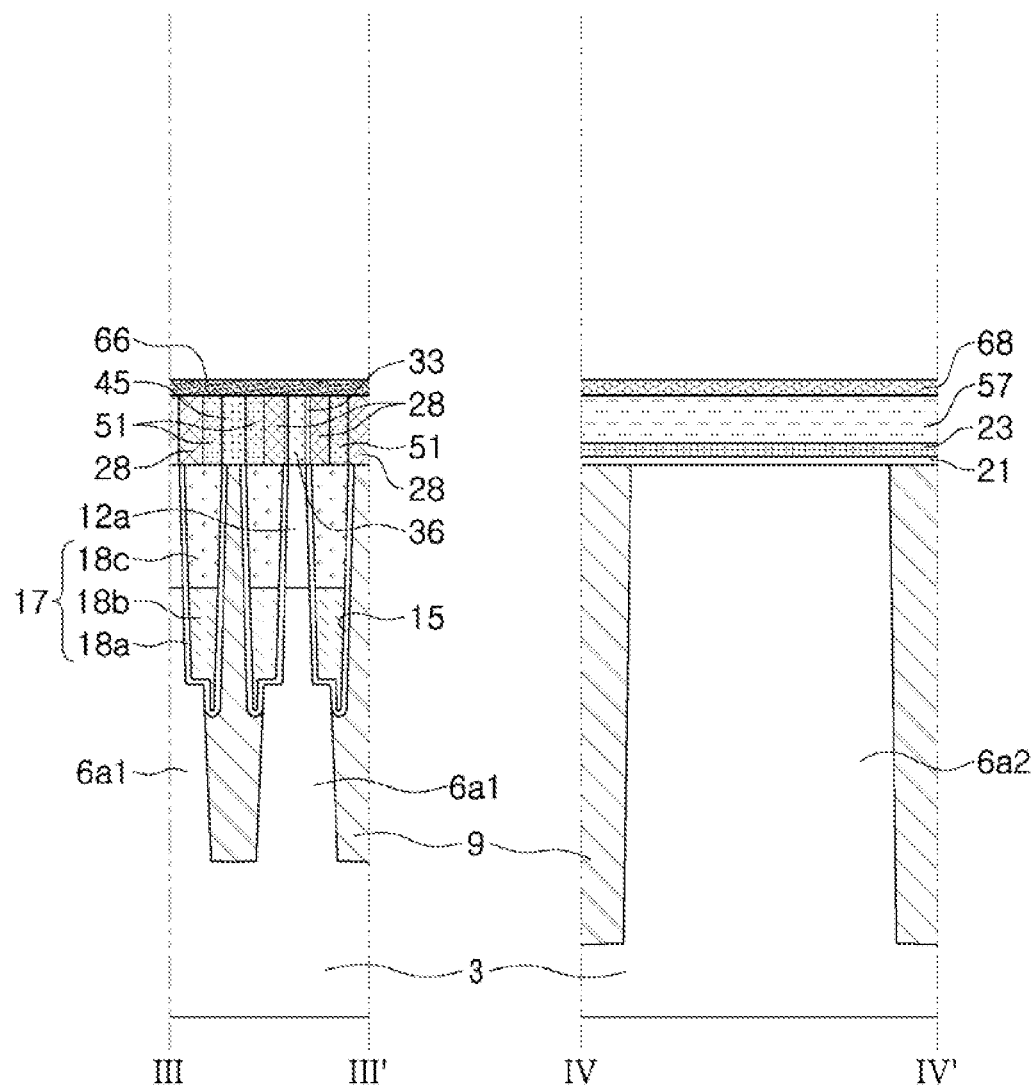

Referring to FIGS. 22, 23A, and 23B, first bit line spacers 64 may be formed on sidewalls of the openings 62a. The first bit line spacers 64 may be formed of an insulating material such as silicon nitride.

A conductive material layer filling the openings 62a and covering or at least partially covering the mask lines 62 in the memory cell region CA, and covering or at least partially covering the second peripheral gate electrode layer 57 in the peripheral region PA may be formed, and a planarization process may be performed. Accordingly, mask lines 62 having a reduced thickness and lower conductive lines 66 remaining in the openings 62a may be formed in the memory cell region CA, and a third peripheral gate electrode layer 68 on the second peripheral gate electrode layer 57 may be formed in the peripheral region PA. The lower conductive lines 66 and the third peripheral gate electrode layer 68 may be simultaneously formed, and may be formed of the same conductive material.

Figure 24A:
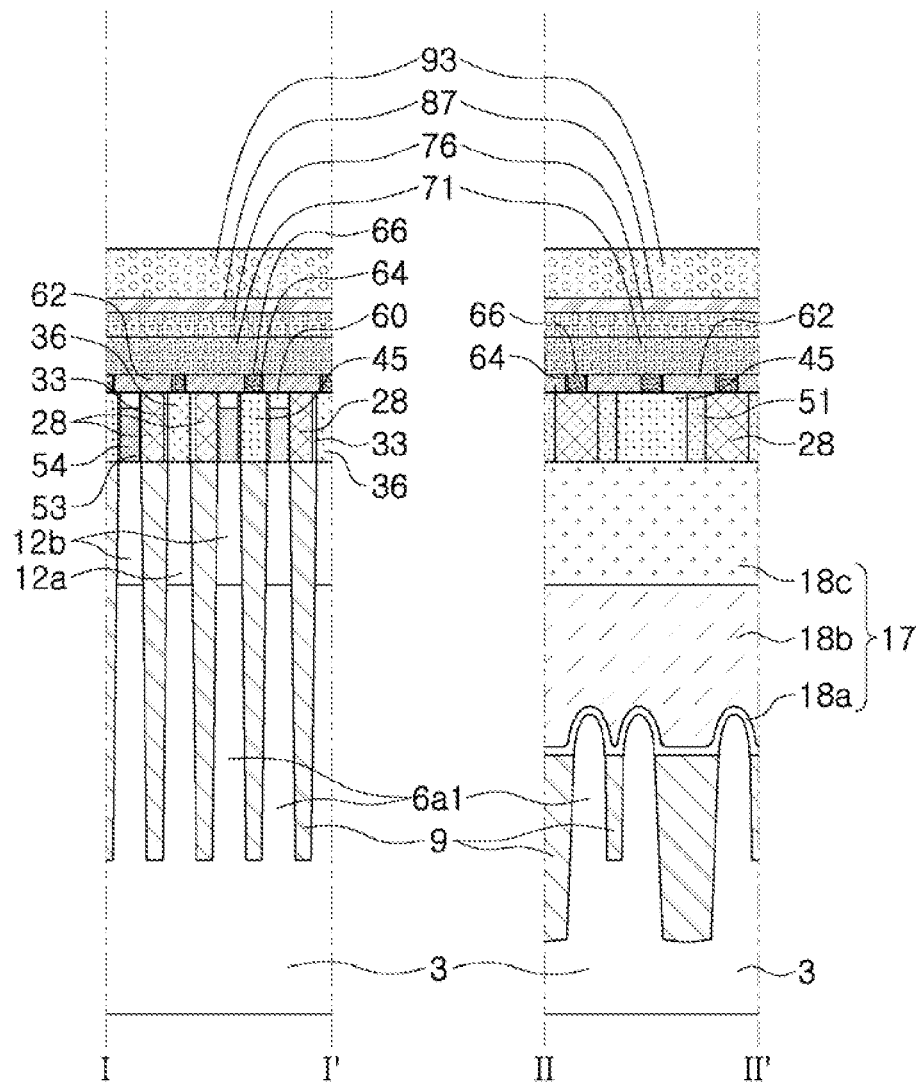
Figure 24B:
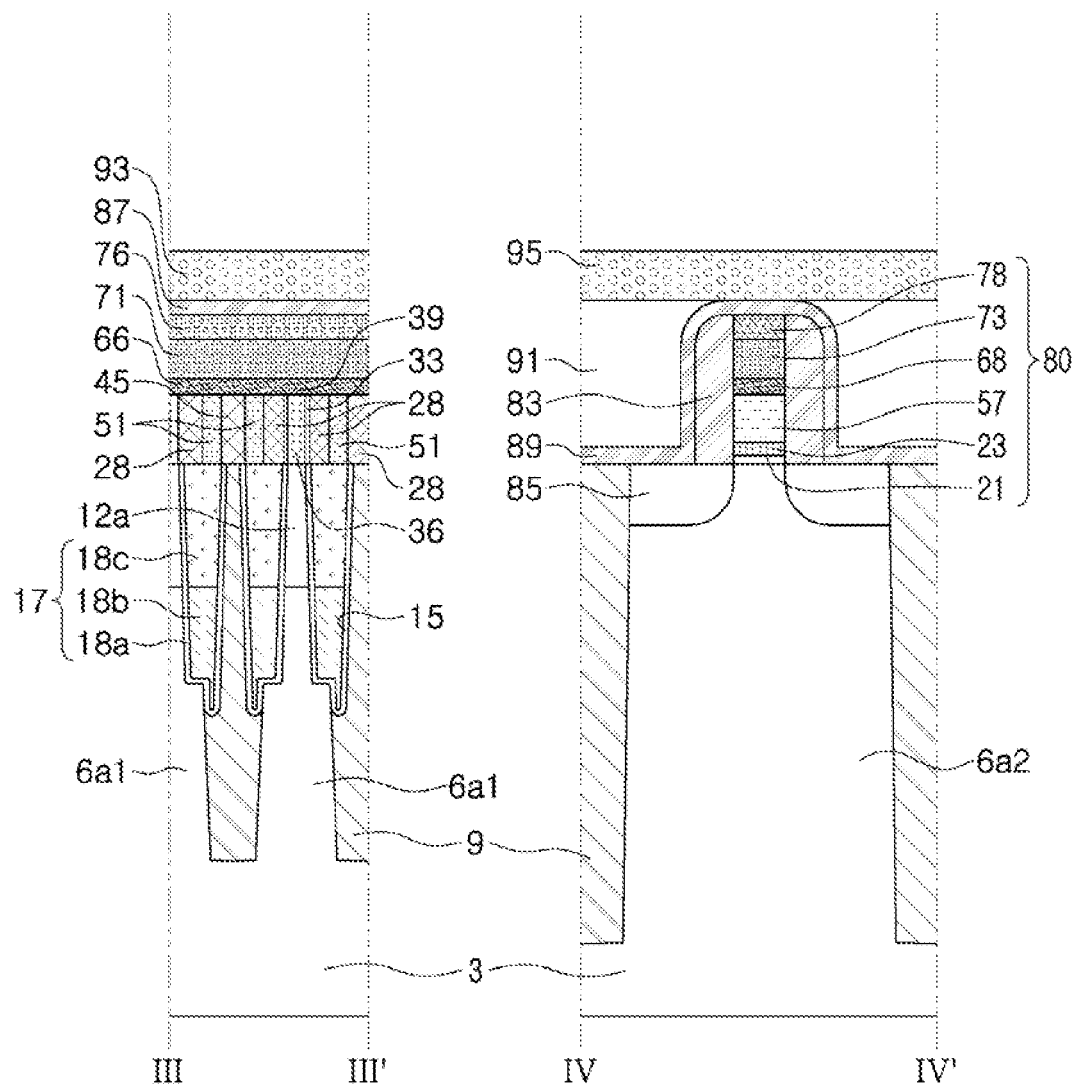

Referring to FIGS. 24A and 24B, a conductive material layer and a capping material layer may be formed in the memory cell region CA and the peripheral region PA. The capping material layer may be formed of an insulating material such as silicon nitride. The conductive material layer and the capping material layer in the memory cell region CA may be referred to as an upper conductive material layer 71 and a lower capping material layer 76, respectively. The conductive material layer and the capping material layer in the peripheral region PA may be referred to as a fourth peripheral gate electrode layer 73 and a peripheral gate capping layer 78, respectively.

In the peripheral region PA, the peripheral gate structure 80 may be formed by patterning the peripheral gate dielectric layer 21, the first peripheral gate electrode layer 23, the second peripheral gate electrode layer 57, the third peripheral gate electrode layer 68, the fourth peripheral gate electrode layer 73, and the peripheral gate capping layer 78 stacked vertically. The peripheral gate structure 80 may intersect the peripheral active region 6a2.

Peripheral spacers 83 may be formed on side surfaces of the peripheral gate structure 80. The peripheral spacers 83 may be formed of an insulating material. Peripheral source/drain regions 85 may be formed in the peripheral active region 6a2 on both sides of the peripheral gate structure 80.

A conformal insulating layer may be formed in the memory cell region CA and the peripheral region PA. In the memory cell region CA, the insulating layer may be referred to as an intermediate capping material layer 87, and in the peripheral region PA, the insulating layer may be referred to as an insulating liner 89. The intermediate capping material layer 87 and the insulating liner 89 may be formed of an insulating material such as silicon nitride.

A planarized peripheral interlayer insulating layer 91 may be formed by forming a peripheral interlayer insulating layer on the insulating liner 89 and then planarizing the peripheral interlayer insulating layer. For example, the planarization may be performed through a chemical etching process. The peripheral interlayer insulating layer 91 may be formed of an insulating material such as silicon oxide or a low dielectric layer.

An insulating layer may be formed on the intermediate capping material layer 87, the peripheral interlayer insulating layer 91, and the insulating liner 89. In the memory cell region CA, the insulating layer may be referred to as an upper capping material layer 93, and in the peripheral region PA, the insulating layer may be referred to as a peripheral capping layer 95. The upper capping material layer 93 and the peripheral capping layer 95 may be formed of an insulating material such as silicon nitride.

Figure 25:
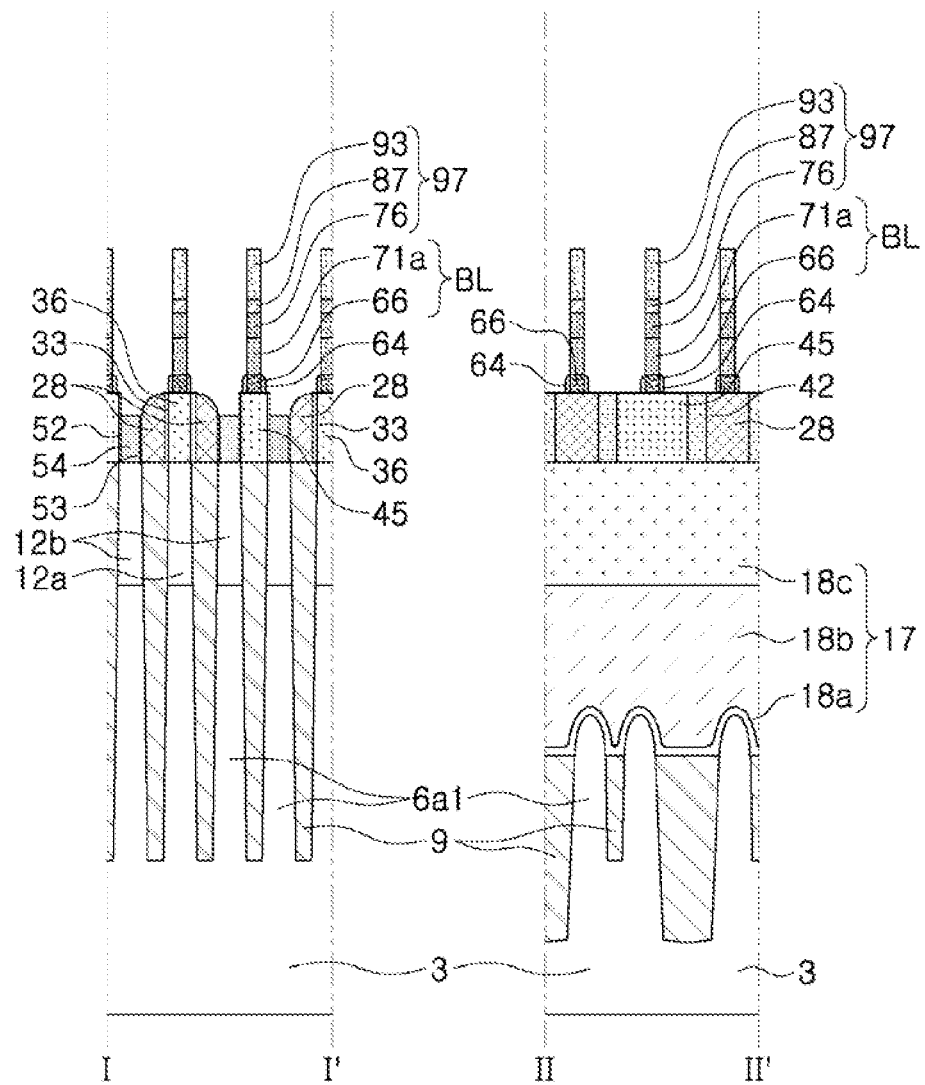

Referring to FIG. 25, in the memory cell region CA, bit line capping patterns 97 may be formed by patterning the lower capping material layer 76, the intermediate capping material layer 87, and the upper capping material layer 93. The lower capping material layer 76, the intermediate capping material layer 87, and the upper capping material layer 93 may be stacked vertically. The bit line capping patterns 97 may have a line shape extending in the second direction Y.

Upper conductive lines 71a may be formed by patterning the upper conductive material layer 71 by an etching process using the bit line capping patterns 97 as an etch mask. The lower conductive lines 66 and the upper conductive lines 71a may form bit lines BL.

Subsequently, the second pad patterns 54 may be exposed by selectively removing the mask lines 62 and the capping layers 60 on both sides of the upper conductive lines 71a by an etching process. The first bit line spacers 64, the insulating patterns 51, and the first insulating patterns 45 and the barrier spacers 28 formed of a material different from that of the mask lines 62 and the capping layers 60 may remain.

Figure 26:
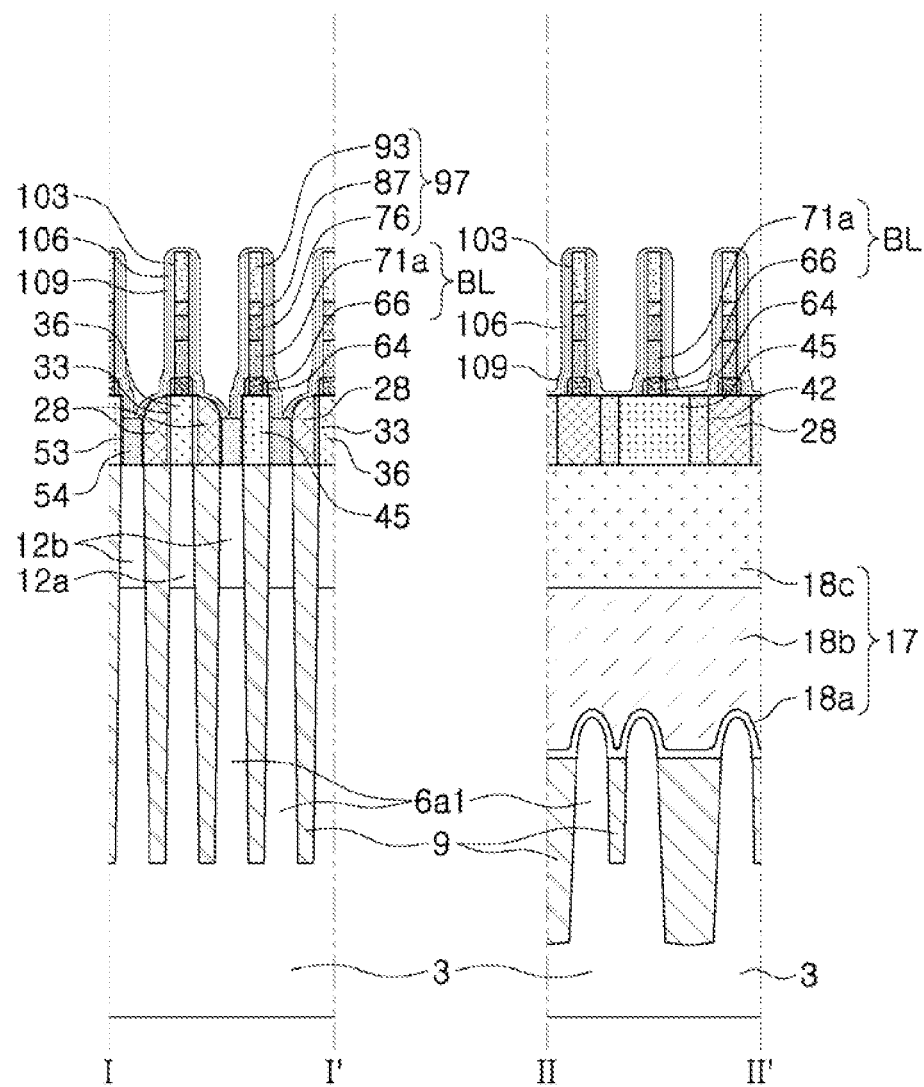

Referring to FIG. 26, spacer material layers 103, 106, and 109 may be formed in the memory cell region CA. The forming of the spacer material layers 103, 106 and 109 may include conformally forming the first spacer material layer 103 and performing anisotropic etching, conformally forming the second spacer material layer 106 and performing anisotropic etching, and forming the third spacer material layer 109. The first and third spacer material layers 103 and 109 may be formed of an insulating material such as silicon nitride or silicon oxynitride, and the second spacer material layer 106 may be formed of an insulating material such as silicon oxide.

Figure 27:
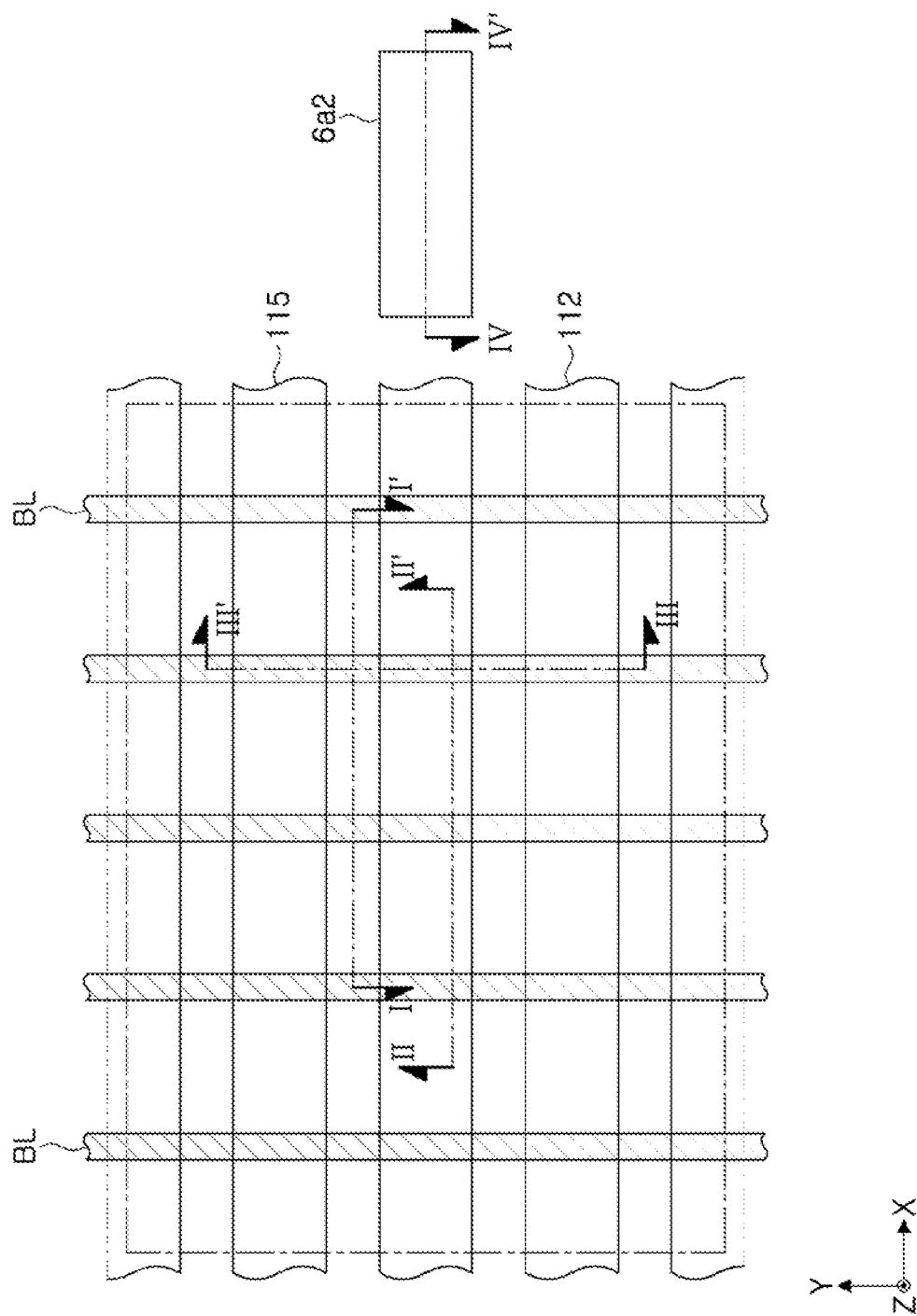
Figure 28A:
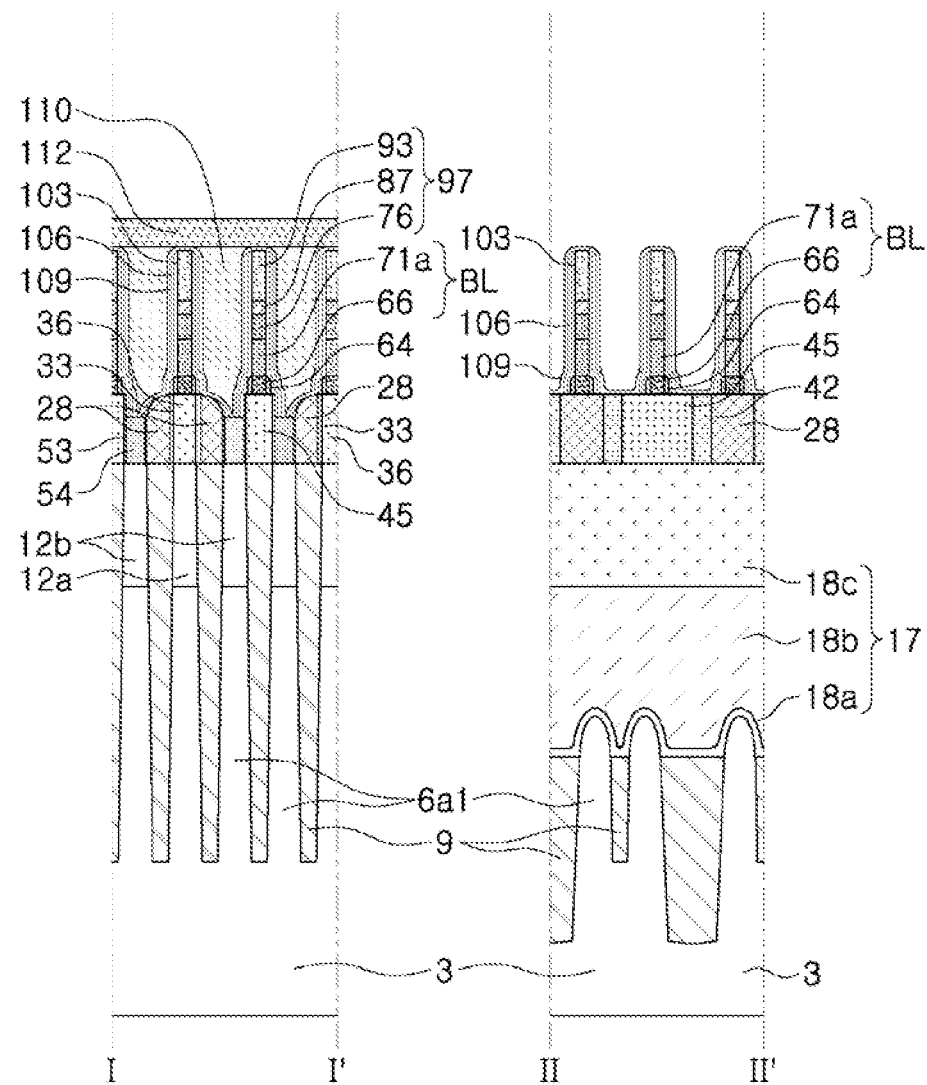
Figure 28B:
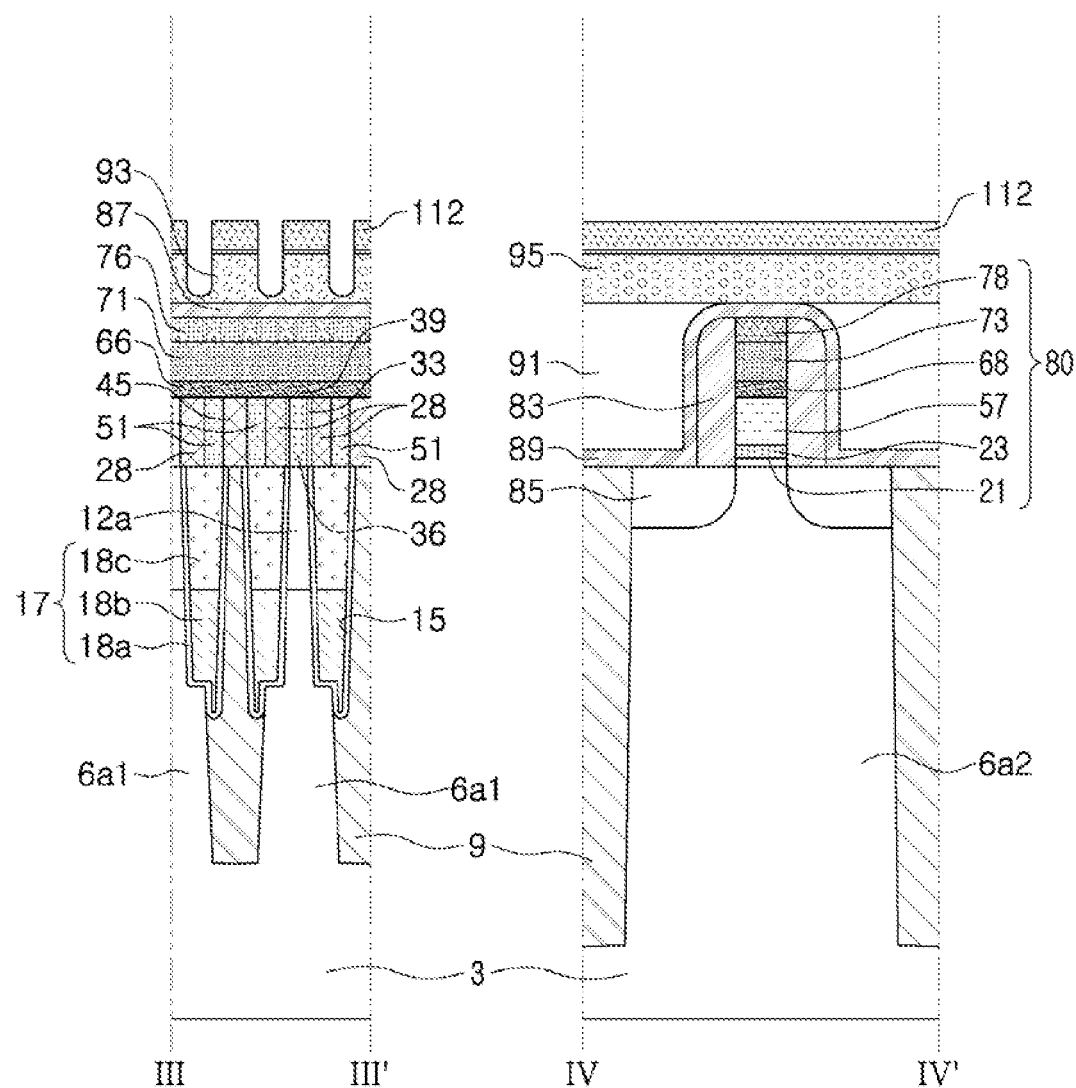

Referring to FIGS. 27, 28A, and 28B, in the memory cell region CA, the cell interlayer insulating layer 110 filling the region between the bit lines BL and the bit line capping patterns 97 on the third spacer material layer 109 may be formed.

A mask 112 may be formed on the cell interlayer insulating layer 110 and the peripheral capping layer 95. In the memory cell region CA, the mask 112 may have a line shape extending in the first direction X. In the memory cell region CA, the cell interlayer insulating layer 110 exposed by the mask 112 may be removed by etching.

Figure 29A:
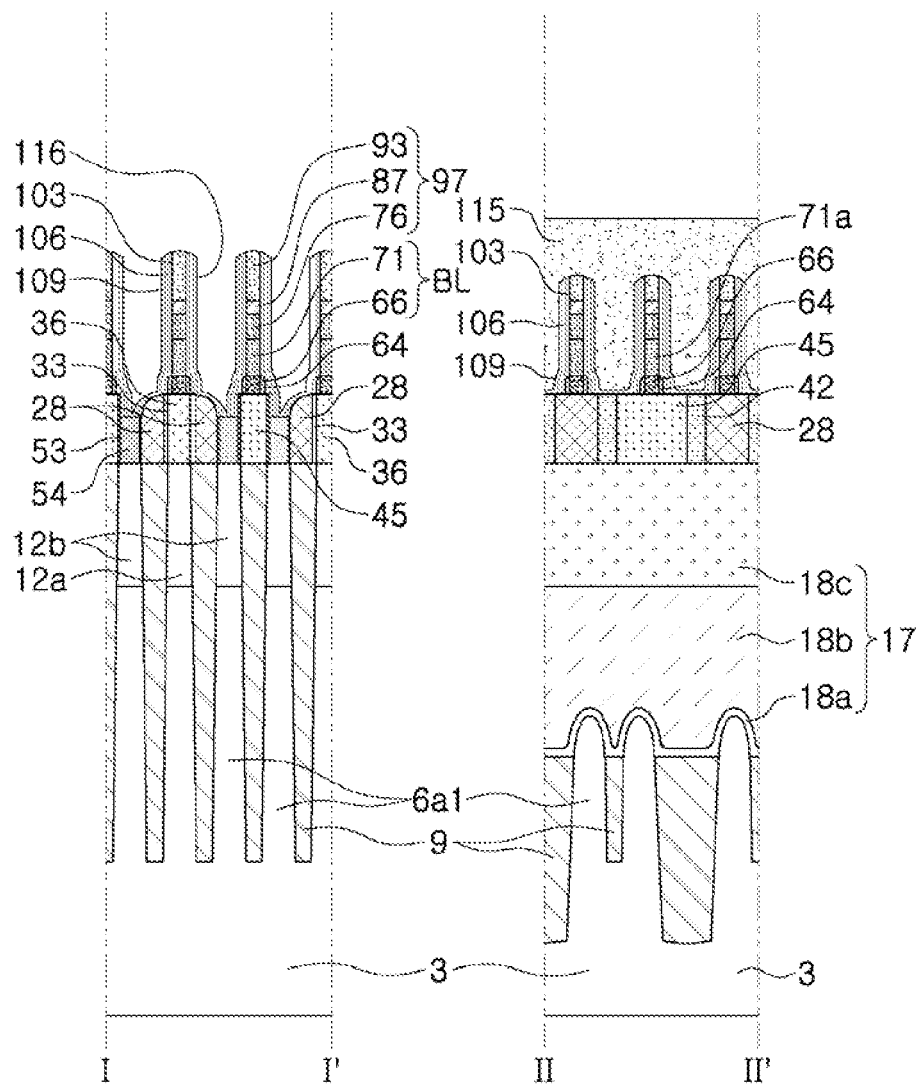
Figure 29B:
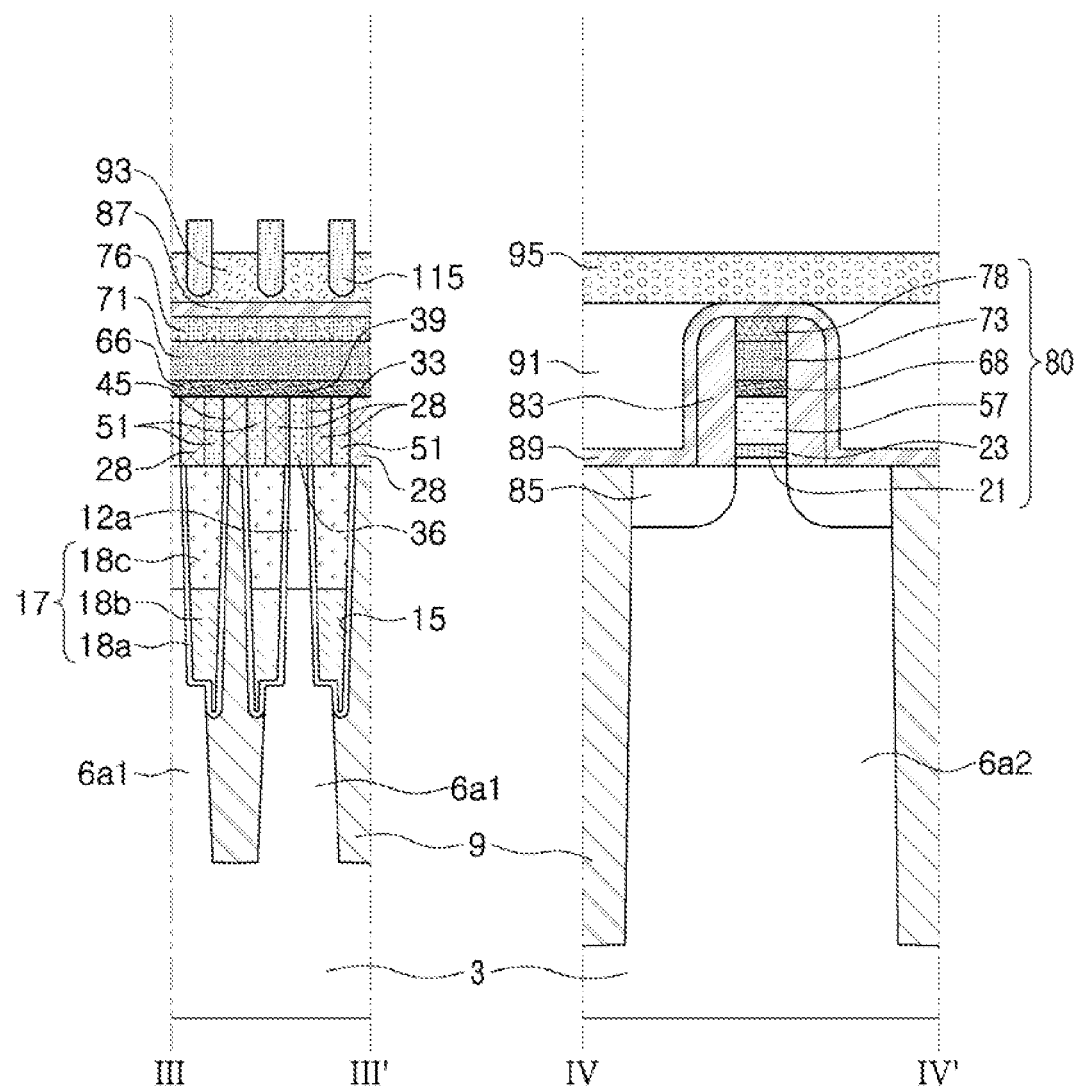

Referring to FIGS. 29A and 29B, an insulating fence 115 which fills the spaces formed by removing the etching cell interlayer insulating layer 110 exposed by the mask 112 and filling the space between the masks 112 may be formed. The insulating fence 115 may be formed of an insulating material such as silicon nitride. The mask 112 may be removed, and by performing an etching process, the cell interlayer insulating layer 110 below the mask 112 may be removed, thereby forming contact holes 116.

Figure 30A:
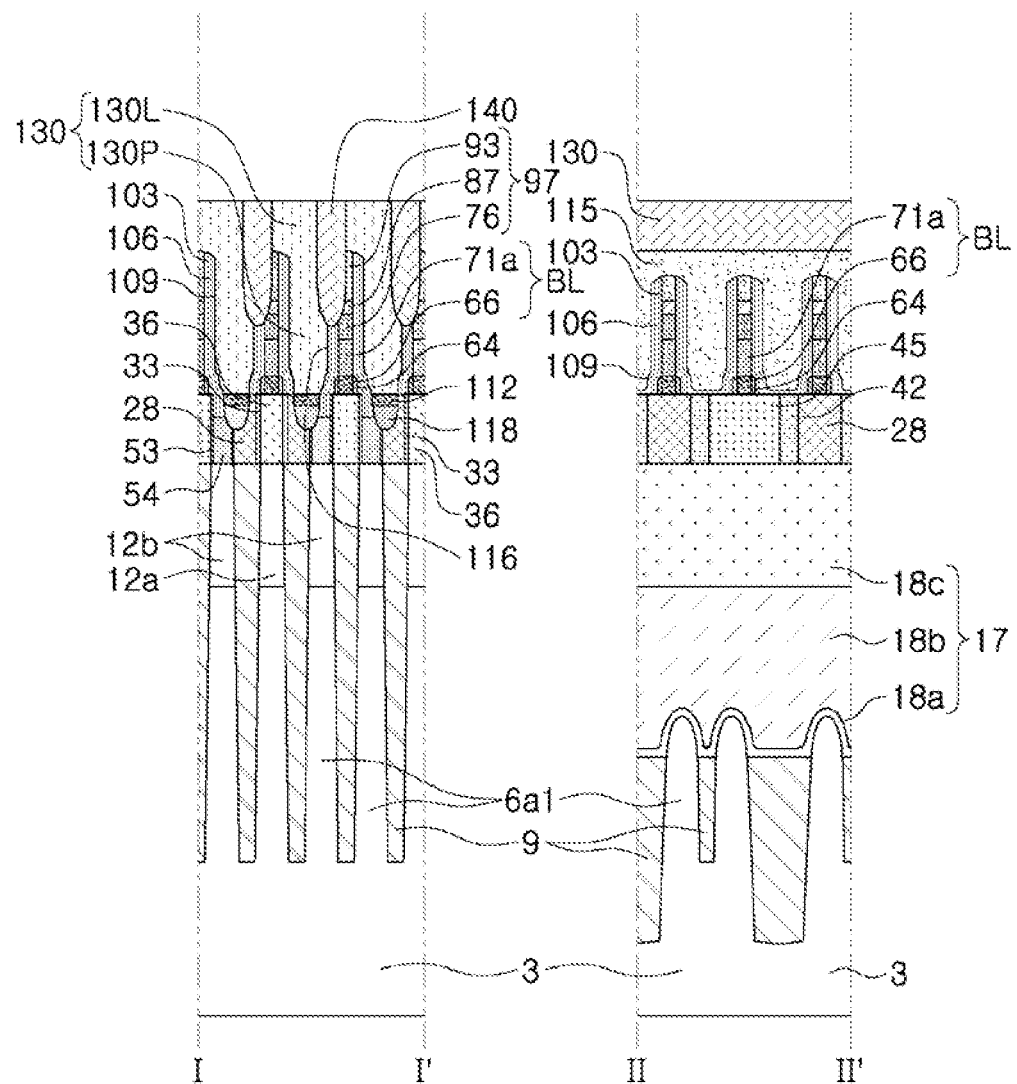
Figure 30B:
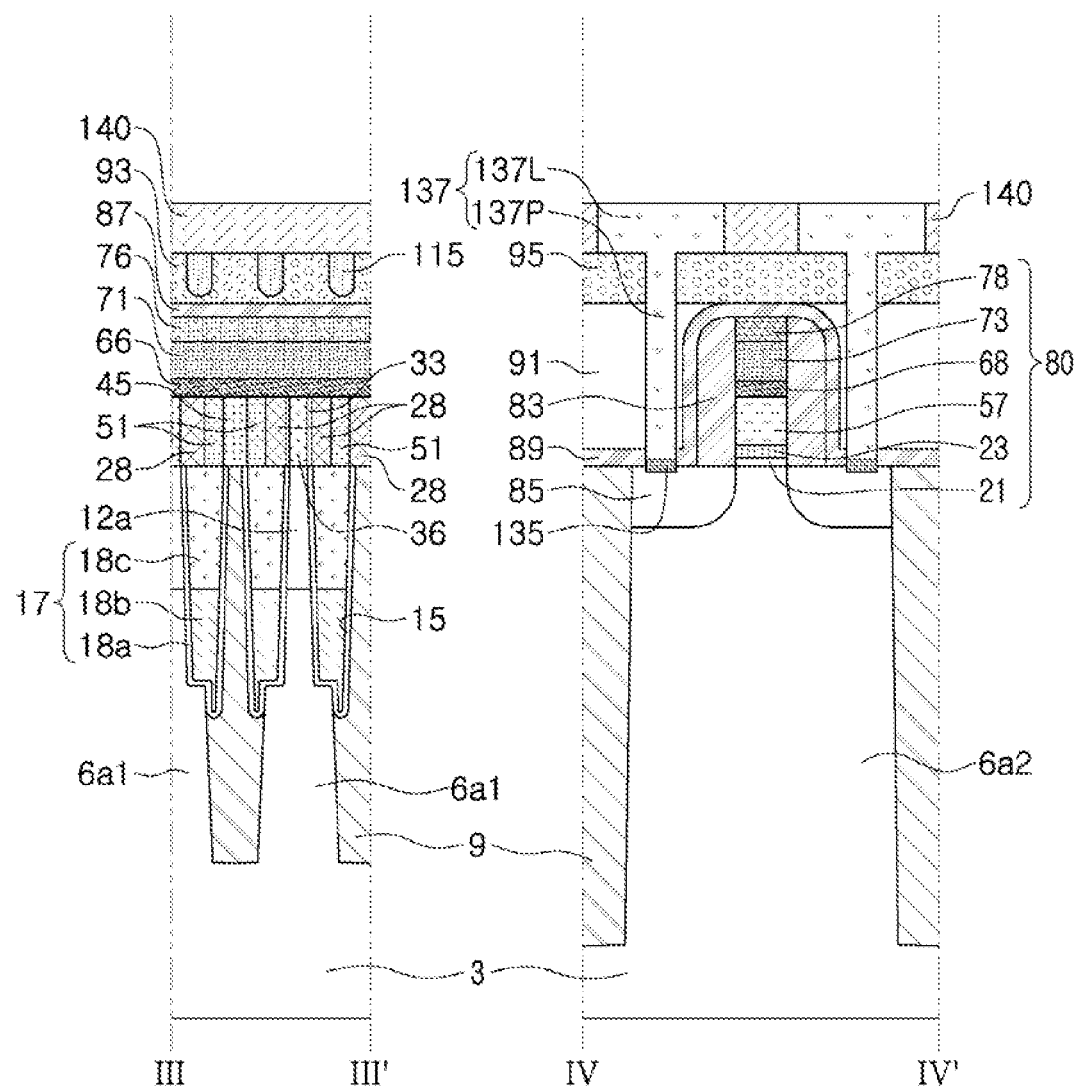

Referring to FIGS. 30A and 30B, the second pad patterns 54 may be exposed by etching the spacer material layers 103, 106, and 109 disposed below the contact holes 116. In the memory cell region CA, cell contact structures 133 which fill the contact holes 116 and which cover or at least partially cover a portion of the adjacent bit line capping pattern 97 may be formed. In the peripheral region PA, peripheral contact structures 138 which penetrate the peripheral capping layer 95, the peripheral interlayer insulating layer 91 and the insulating liner 89, and which contact the peripheral source/drain regions 85, and cover or at least partially cover a portion of the upper surface of the peripheral capping layer 95 may be formed.

Each of the cell contact structures 133 may include a first conductive layer 125 which contacts each of the second pad patterns 54, a second conductive layer 127 disposed on the first conductive layer 125, and a third conductive layer 130 disposed on the second conductive layer 127. The third conductive layer 130 may include a contact plug portion 130P and a landing pad portion 130L covering a portion of an upper surface of the bit line capping pattern 97 adjacent on the contact plug portion 130P. The first conductive layer 125 may be an epitaxial silicon layer having N-type conductivity or a polysilicon layer having N-type conductivity. The second conductive layer 127 may be a metal-semiconductor compound layer.

Each of the peripheral contact structures 138 may include a metal-semiconductor compound layer 135 which contacts each of the peripheral source/drain regions 85, and a peripheral conductive layer 137 disposed on the metal-semiconductor compound layer 135. The peripheral conductive layer 137 may include a peripheral plug portion 137P and a peripheral wiring portion 137L which cover or at least partially cover a portion of the upper surface of the peripheral capping layer 95 on the peripheral plug portion 137P.

Insulating isolation patterns 140 passing through a region between the landing pad portions 130L of the cell contact structures 133, isolating the cell contact structures 133 from each other in the memory cell region CA, and passing through a region between the peripheral wiring portions 137L and isolating the peripheral wiring portions 137L from each other in the peripheral region PA may be formed.

Referring back to FIGS. 1 and 2A to 2C, an etch stop layer 145 may be formed. A data storage structure 170 may be formed in the memory cell region CA. The data storage structure 170 may include first electrodes 150 which contact the landing pad portions 130L, penetrating the etch stop layer 145, and extending upwardly, a capacitor dielectric layer 155 which conformally covers the first electrodes 150, and a second electrode 160 disposed on the capacitor dielectric layer 155, in the memory cell region CA.

An upper insulating layer 180 on the etch stop layer 145 may be formed in the peripheral region PA.

According to the aforementioned example embodiments, by forming the first pad pattern 36 in a process separate from the process of forming bit line BL, the first pad pattern 36 and the bit line BL may be formed have a reduced size. Accordingly, a highly integrated semiconductor device may be provided.

According to the aforementioned example embodiments, by forming the first pad pattern 36 in a process separate from the process of forming the bit line BL, process margin may be increased and process difficulty may be reduced. Accordingly, quality and productivity of the semiconductor device may be increased.

According to the aforementioned example embodiments, by forming the bit line BL after the first pad pattern 36 is formed, a defect caused by the bent bit line BL may be prevented.

While the example embodiments have been illustrated and described above, it will be apparent to those skilled in the art that modified examples and variations may be made thereto without departing from the scope of the present disclosure as defined by the appended claims.

What is claimed is:

1. A semiconductor device, comprising:
   a substrate;
   an active region including a first impurity region and a second impurity region spaced apart from the first impurity region;
   an isolation region defining the active region;
   a gate structure intersecting the active region and extending in a first direction parallel to the substrate;
   a first pad pattern disposed on the first impurity region;
   a second pad pattern disposed on the second impurity region;
   a bit line disposed on the first pad pattern and extending in a second direction, wherein the second direction is perpendicular to the first direction and parallel to the substrate; and
   a contact structure on the second pad pattern,
   wherein the second pad pattern has a first side surface and a second side surface opposing each other in the first direction, and a third side surface and a fourth side surface opposing each other in the second direction, and
   wherein each of the first and second side surfaces is curved in a horizontal plane formed by the first and second directions, and each of the third and fourth side surfaces has a substantially linear shape in the horizontal plane.

2. The semiconductor device of claim 1,
   wherein a middle portion of each of the first and second side surfaces is bent in the first direction away from the first pad pattern in the horizontal plane, and wherein each of the third and fourth side surfaces has a linear shape extending in the first direction, in the horizontal plane.

3. The semiconductor device of claim 1, wherein the first pad pattern has a circular shape, in the horizontal plane.

4. The semiconductor device of claim 1, further comprising:
a barrier spacer having a ring shape at least partially surrounding a side surface of the first pad pattern; and
a buffer spacer disposed between the barrier spacer and the first pad pattern.

5. The semiconductor device of claim 4,
wherein the barrier spacer includes a first insulating material, and
wherein the buffer spacer includes a second insulating material different from the first insulating material.

6. The semiconductor device of claim 4, wherein a thickness of the barrier spacer is greater than a thickness of the buffer spacer.

7. The semiconductor device of claim 1, wherein a distance between a lower surface of the first pad pattern and an upper surface of the first pad pattern is greater than a distance between a lower surface of the second pad pattern and an upper surface of the second pad pattern.

8. The semiconductor device of claim 1, wherein a level difference between a level of an upper surface of the first pad pattern and a level of an upper surface of the second pad pattern is greater than a level difference between a level of a lower surface of the first pad pattern and a level of a lower surface of the second pad pattern.

9. A semiconductor device, comprising:
an active region including a first impurity region and a second impurity region spaced apart from the first impurity region;
an isolation region defining the active region;
a gate structure disposed in a gate trench, extending in a first direction, intersecting the active region, and extending into the isolation region;
a first pad pattern contacting the first impurity region and disposed on the first impurity region;
a second pad pattern contacting the second impurity region, spaced apart from the first pad pattern, and disposed on the second impurity region;
a bit line contacting the first pad pattern, extending in a second direction perpendicular to the first direction, and wherein the bit line is disposed on the first pad pattern;
a contact structure contacting the second pad pattern and disposed on the second pad pattern; and
a spacer structure contacting a side surface of the bit line,
wherein an upper surface of the first pad pattern contacts a lower surface of the bit line, and
wherein a width of the upper surface of the first pad pattern in the first direction is different from a width of the lower surface of the bit line in the first direction.

10. The semiconductor device of claim 9, wherein a width of the upper surface of the first pad pattern is greater than a width of the lower surface of the bit line in the first direction.

11. The semiconductor device of claim 9,
wherein the bit line includes a lower conductive line and an upper conductive line disposed on the lower conductive line, and
wherein the spacer structure includes a first bit line spacer contacting a side surface of the lower conductive line and a second bit line spacer covering the first bit line spacer and contacting a side surface of the upper conductive line.

12. The semiconductor device of claim 11, wherein the upper surface of the first pad pattern includes a portion vertically overlapping the lower conductive line and a portion vertically overlapping the first bit line spacer.

13. The semiconductor device of claim 11, wherein a thickness of the second bit line spacer is greater than a thickness of the first bit line spacer.

14. The semiconductor device of claim 11, wherein a side surface of the lower conductive line is not aligned with a side surface of the upper conductive line.

15. The semiconductor device of claim 9, wherein a central axis between both side surfaces of the bit line and a central axis between both side surfaces of the first pad pattern are not aligned in the first direction.

16. The semiconductor device of claim 9, wherein the first pad pattern contacts a portion of an upper surface of the first impurity region and a portion of the isolation region adjacent to the first impurity region.

17. The semiconductor device of claim 9, further comprising:
a barrier spacer at least partially surrounding a side surface of the first pad pattern; and
a first buffer spacer disposed between the side surface of the first pad pattern and the barrier spacer; and
a second buffer spacer covering a side surface of the second pad pattern,
wherein a material of the barrier spacer is different from a material of the first and second buffer spacers, and
wherein the contact structure contacts the second pad pattern, the second buffer spacer, and the barrier spacer.

18. The semiconductor device of claim 17,
wherein an upper surface of the second pad pattern is disposed on a level lower than a level of an upper surface of the first pad pattern, and
wherein a lower end of the contact structure is disposed on a level lower than a level of an upper end of the second pad pattern.

19. A semiconductor device, comprising:
an isolation region defining a cell active region in a memory cell region and a peripheral active region in a peripheral region;
a cell gate structure disposed in a gate trench, wherein the cell gate structure extends in a first direction, intersects the cell active region, and extends into the isolation region, in the memory cell region;
a first pad pattern contacting a first impurity region in the cell active region and disposed on the cell active region;
a second pad pattern contacting a second impurity region in the cell active region and disposed on the cell active region;
a bit line contacting the first pad pattern and extending in a second direction perpendicular to the first direction, wherein the bit line is disposed on the first pad pattern;
a cell contact structure contacting the second pad pattern and on the second pad pattern; and
a barrier spacer, including a portion which is interposed between the first pad pattern and the second pad pattern,
wherein a level difference between a level of an upper surface of the first pad pattern and a level of an upper surface of the second pad pattern is greater than a level difference between a level of a lower surface of the first pad pattern and a level of a lower surface of the second pad pattern.

20. The semiconductor device of claim 19, further comprising:
- a peripheral gate structure disposed on the peripheral active region;
- peripheral source/drain regions disposed in the peripheral active region on opposite sides of the peripheral gate structure; and
- a spacer structure covering a side surface of the bit line,
- wherein the peripheral gate structure includes a peripheral gate dielectric layer and a peripheral gate electrode disposed on the peripheral gate dielectric layer,
- wherein the peripheral gate electrode includes a first peripheral gate electrode layer, a second peripheral gate electrode layer, a third peripheral gate electrode layer and a fourth peripheral gate electrode layer stacked a vertical direction,
- wherein the first to fourth peripheral gate electrode layers each include different materials,
- wherein adjusting an amount of metal in a composition of the first peripheral gate electrode layer adjusts a threshold voltage of a corresponding transistor including metal nitride,
- wherein the second peripheral gate electrode layer includes doped polysilicon,
- wherein the barrier spacer has a ring shape surrounding a side surface of the first pad pattern,
- wherein the upper surface of the first pad pattern is disposed on a level higher than a level of the upper surface of the second pad pattern,
- wherein the bit line includes a lower conductive line contacting the first pad pattern and an upper conductive line disposed on the lower conductive line,
- wherein the lower conductive line and the third peripheral gate electrode layer include the same material,
- wherein the upper conductive line and the fourth peripheral gate electrode layer include the same material;
- wherein the spacer structure includes a first bit line spacer contacting a side surface of the lower conductive line and a second bit line spacer contacting a side surface of the upper conductive line and covering the first bit line spacer, and
- wherein the upper surface of the first pad pattern includes a portion contacting the lower conductive line and a portion contacting the first bit line spacer.

* * * * *